(12) United States Patent
Ogiwara et al.

(10) Patent No.: US 11,721,371 B2
(45) Date of Patent: Aug. 8, 2023

(54) MEMORY DEVICE HAVING SENSE AMPLIFIER INCLUDING PLURAL SENSE CIRCUITS FOR SENSING A VOLTAGE OF A BIT LINE IN A READ OPERATION

(71) Applicant: Kioxia Corporation, Tokyo (JP)

(72) Inventors: Ryu Ogiwara, Yokohama Kanagawa (JP); Daisaburo Takashima, Yokohama Kanagawa (JP); Takahiko Iizuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 13 days.

(21) Appl. No.: 17/495,747

(22) Filed: Oct. 6, 2021

(65) Prior Publication Data

US 2022/0108729 A1   Apr. 7, 2022

(30) Foreign Application Priority Data

Oct. 7, 2020   (JP) .............................. JP2020-169609

(51) Int. Cl.
| | | |
|---|---|---|
| *G11C 7/06* | (2006.01) | |
| *G11C 7/12* | (2006.01) | |
| *G11C 5/06* | (2006.01) | |
| *G11C 7/10* | (2006.01) | |
| *G11C 7/14* | (2006.01) | |

(52) U.S. Cl.
CPC ................ *G11C 7/065* (2013.01); *G11C 5/06* (2013.01); *G11C 7/1069* (2013.01); *G11C 7/12* (2013.01); *G11C 7/14* (2013.01)

(58) Field of Classification Search
CPC ......... G11C 7/065; G11C 5/06; G11C 7/1069; G11C 7/12; G11C 7/14
USPC ..................................................... 365/185.21
See application file for complete search history.

(56) References Cited

U.S. PATENT DOCUMENTS

| | | | |
|---|---|---|---|
| 5,894,447 | A | 4/1999 | Takashima |
| 9,025,369 | B2 | 5/2015 | Takashima |
| 9,966,136 | B2 | 5/2018 | Ogiwara et al. |
| 2022/0020818 | A1* | 1/2022 | Kim ..................... G11C 13/003 |

FOREIGN PATENT DOCUMENTS

EP   3522165 A1 *  8/2019  ........... G06F 7/5443

OTHER PUBLICATIONS

Kinoshita, et al., "Scalable 3-D vertical chain-cell type phase-change memory with 4F2 poly-Si diodes", Symposium on VLSI Technology Digest of Technical Papers, pp. 35-36, 2012.

* cited by examiner

*Primary Examiner* — Huan Hoang
(74) *Attorney, Agent, or Firm* — Holtz, Holtz & Volek PC

(57) ABSTRACT

According to one embodiment, a memory device includes: a plurality of memory cells stacked in a first direction orthogonal to a substrate and each including a memory element having at least three resistance states and a selector coupled in parallel to the memory element; a bit line electrically coupled to the memory cells and extending in a second direction intersecting the first direction; and a sense amplifier configured to compare a voltage of the bit line with a plurality of reference voltages and sense data stored in the memory cells.

17 Claims, 54 Drawing Sheets

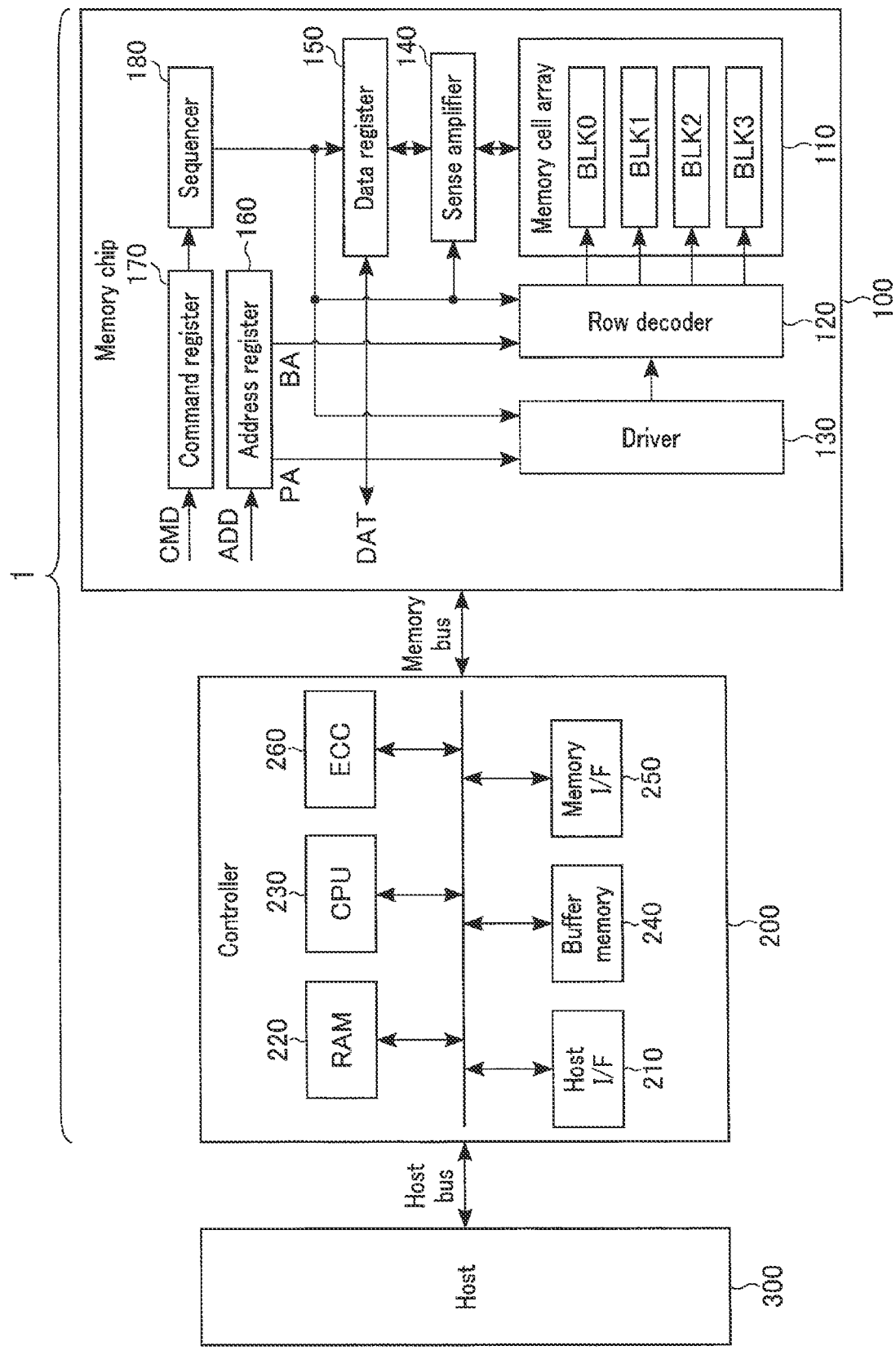
F I G. 1

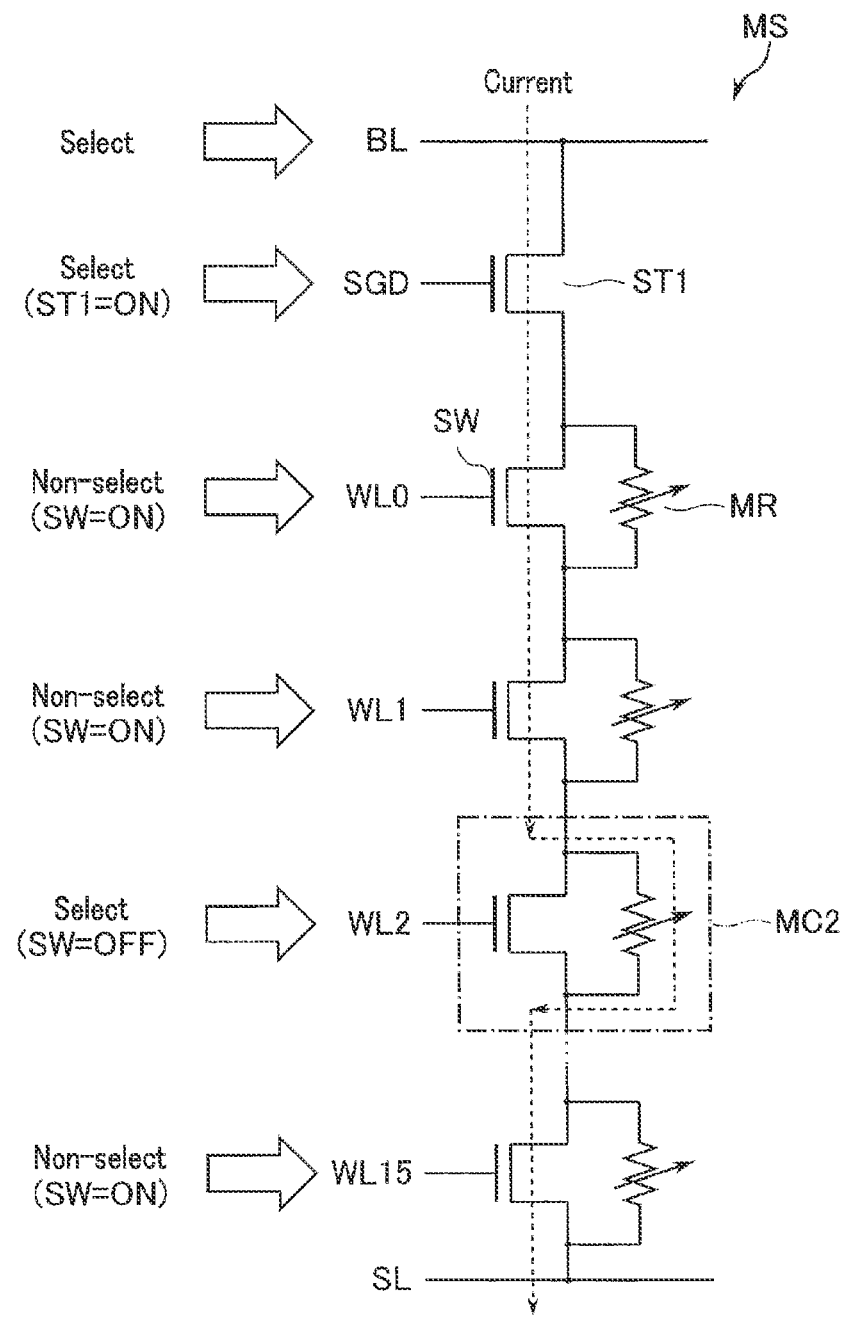
F I G. 10

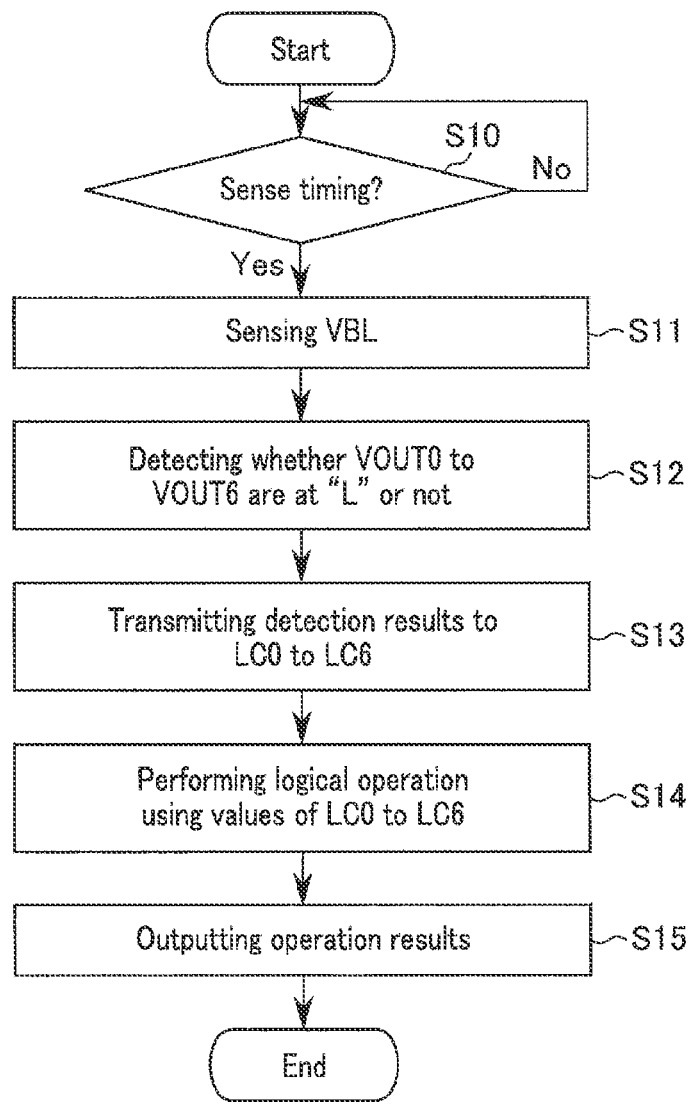
F I G. 14

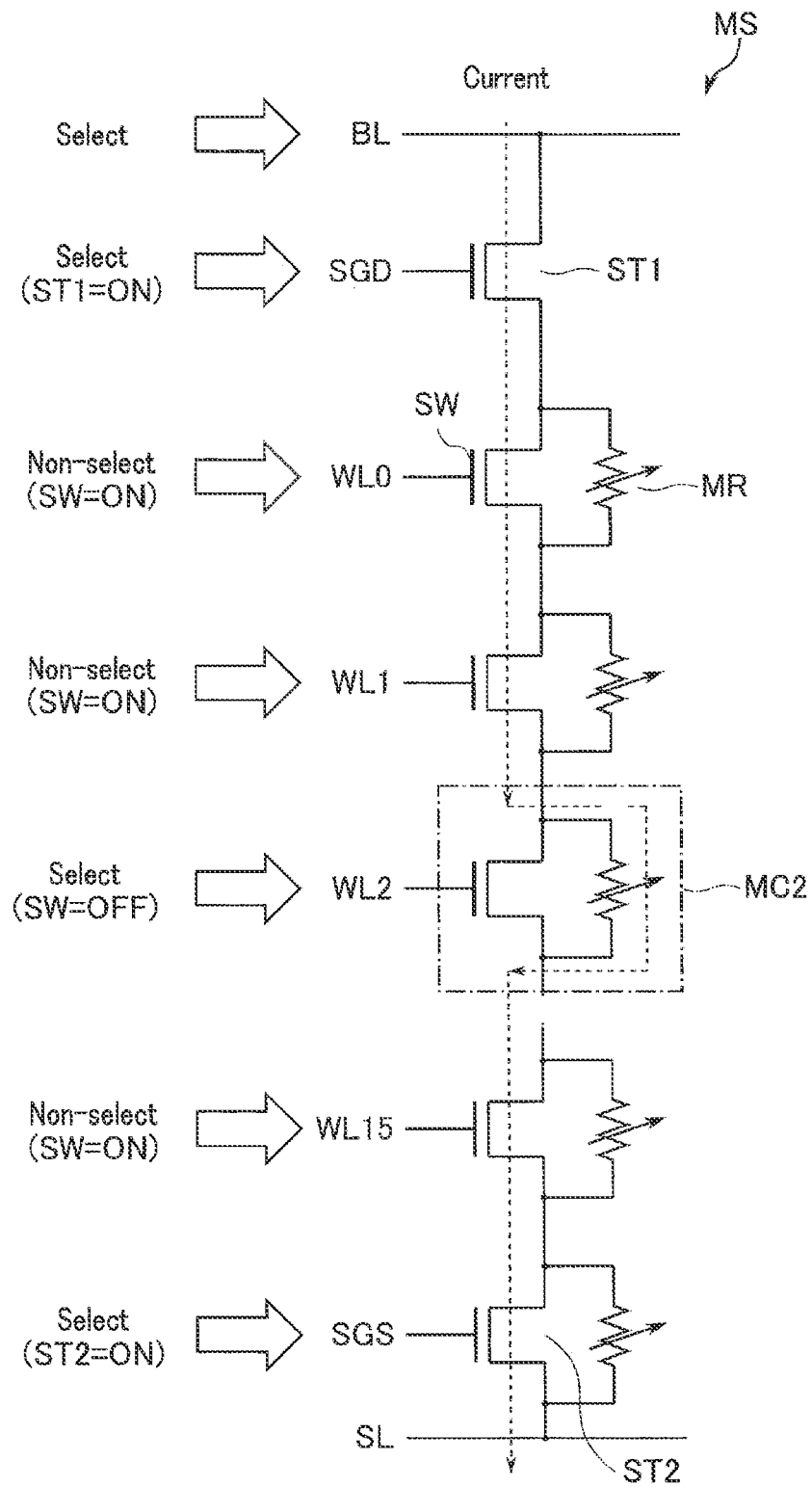
F I G. 17

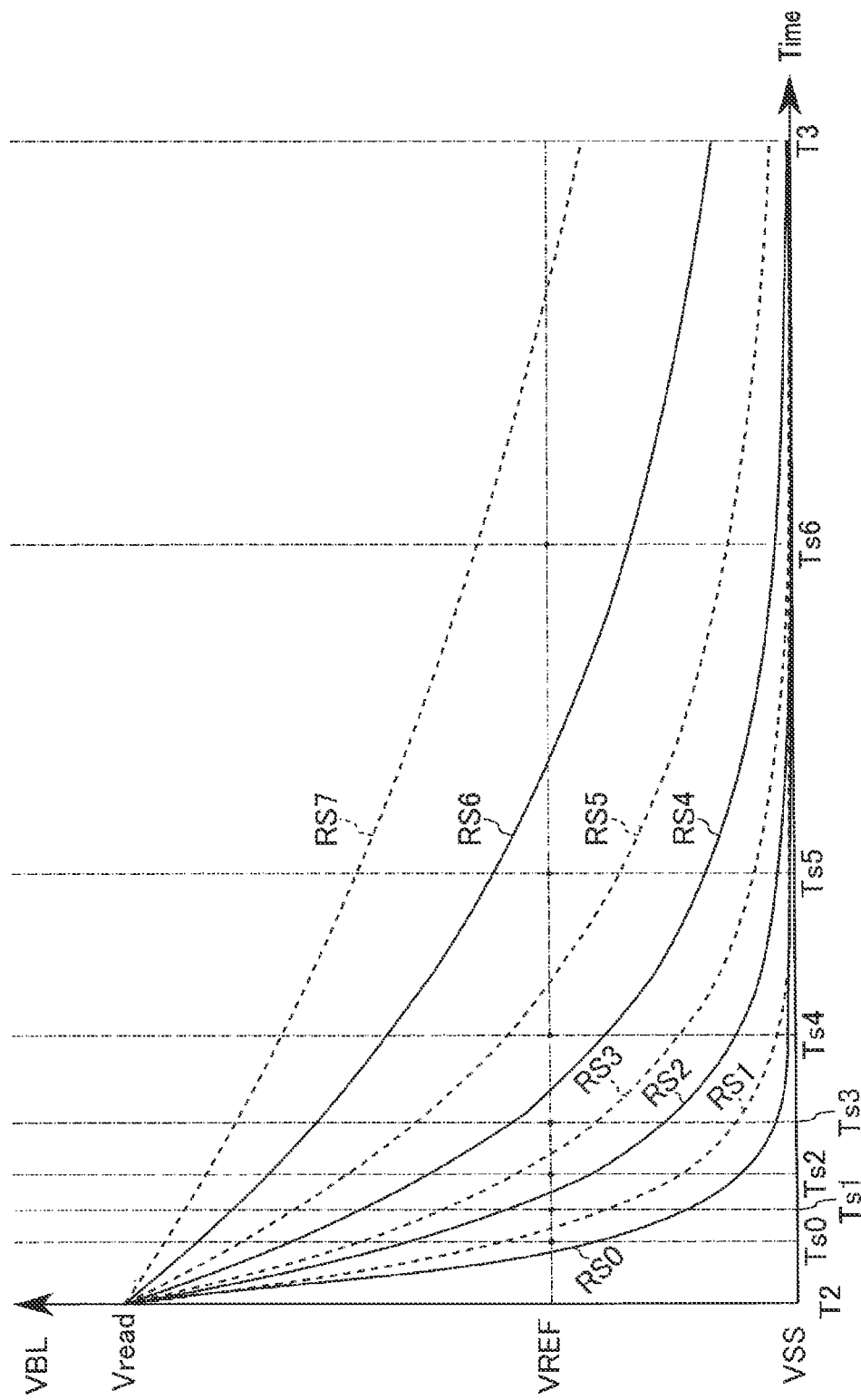
F I G. 20

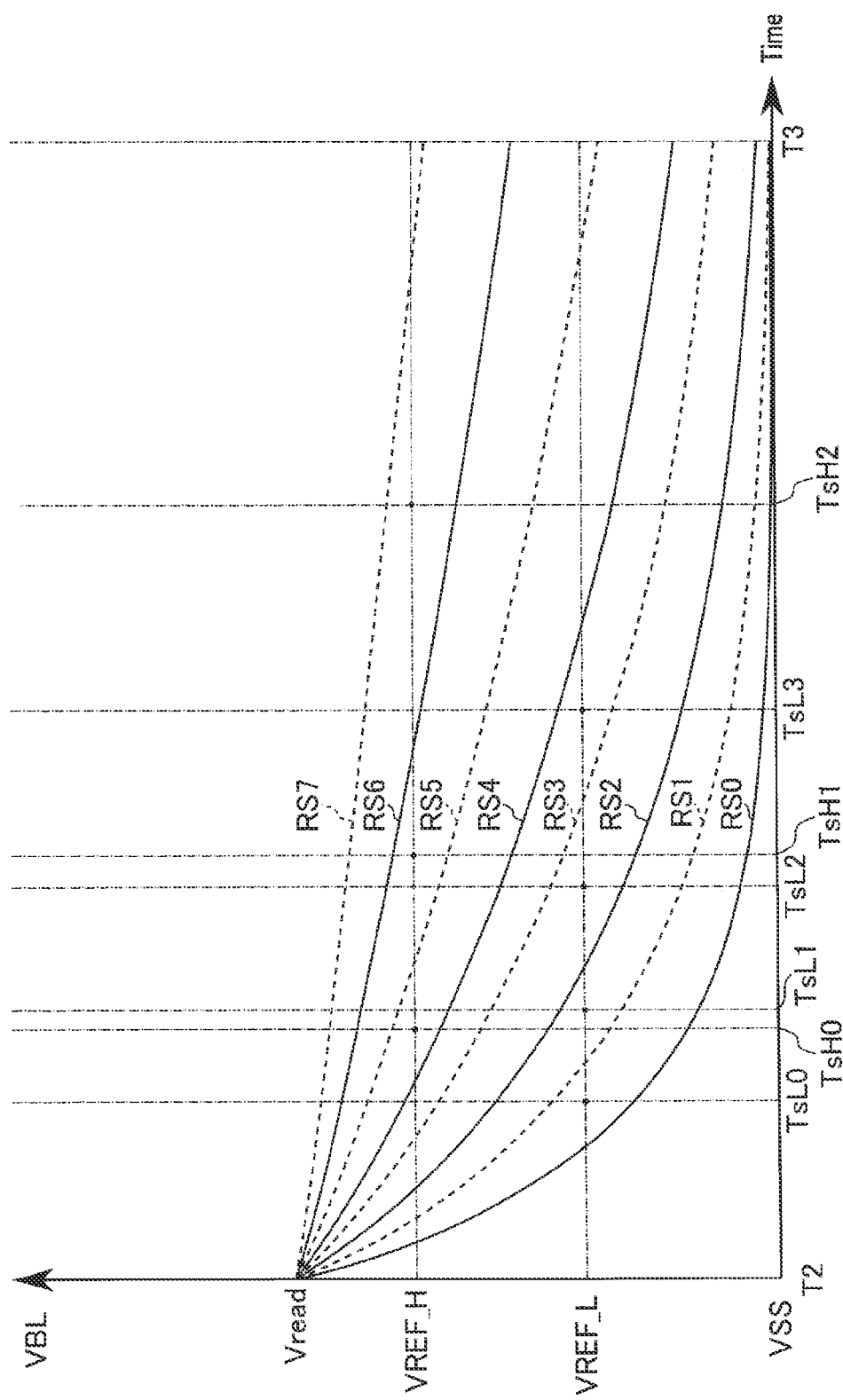
F I G. 23

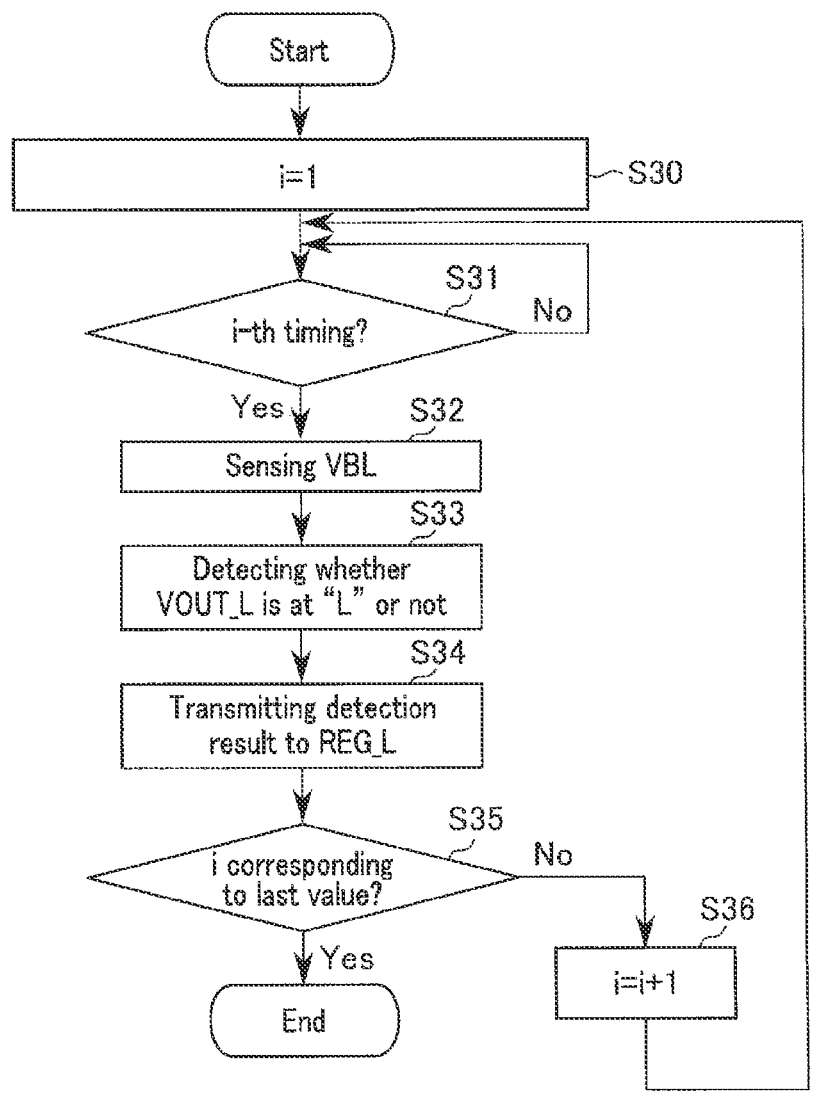
F I G. 24

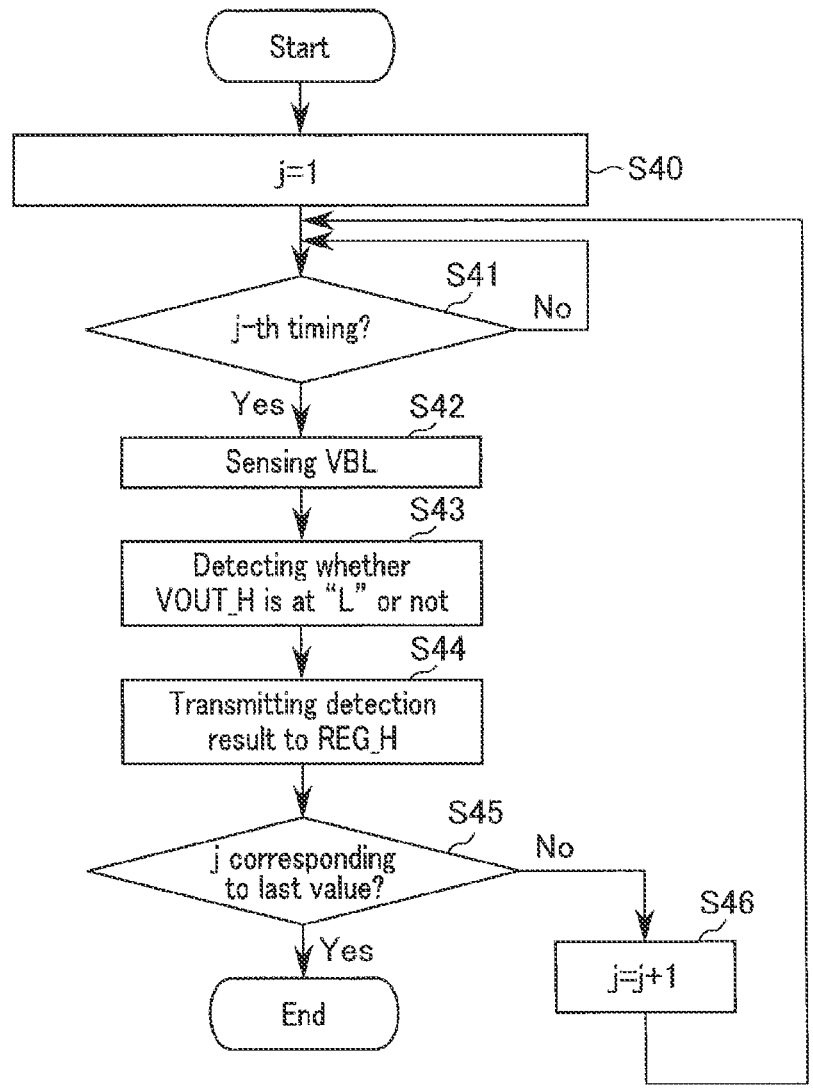
F I G. 25

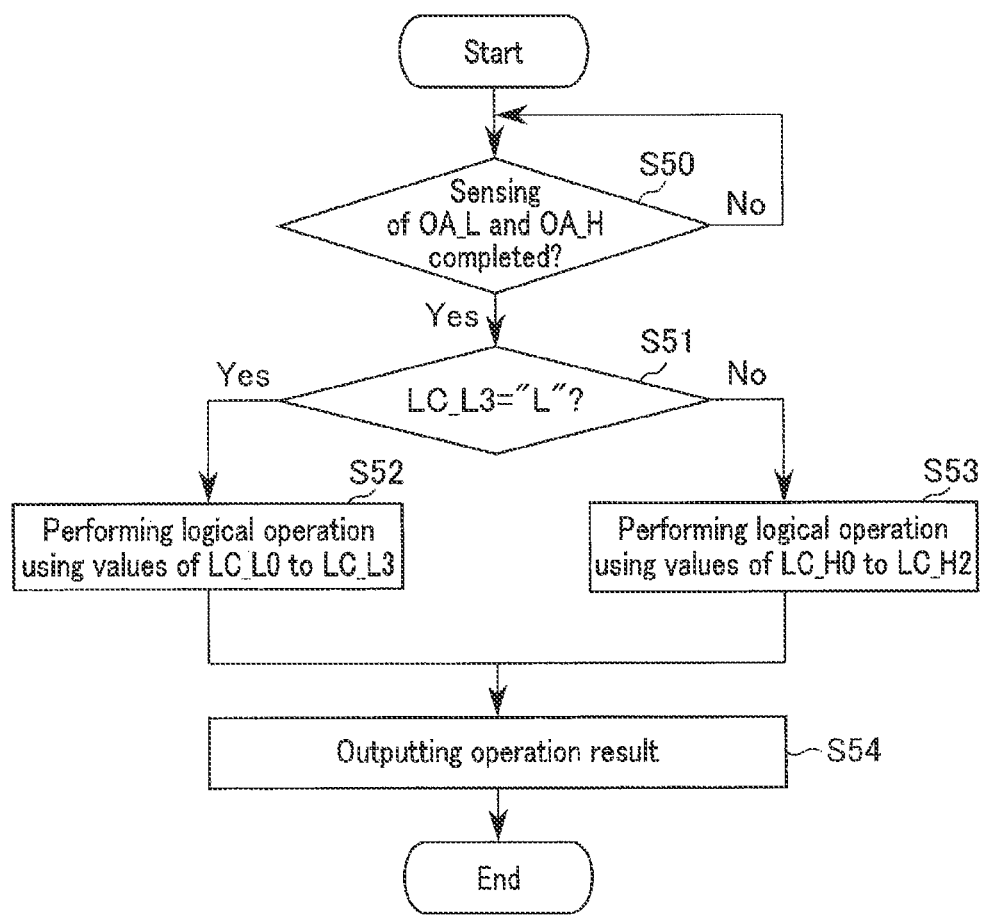
F I G. 26

| Resistance state | OA_L | | | | OA_H | | |
|---|---|---|---|---|---|---|---|
| | 1 | 2 | 3 | 4 | 1 | 2 | 3 |
| RS0 | L | L | L | L | L | L | L |
| RS1 | H | L | L | L | L | L | L |
| RS2 | H | H | L | L | L | L | L |
| RS3 | H | H | H | L | L | L | L |
| RS4 | H | H | H | H | L | L | L |
| RS5 | H | H | H | H | H | L | L |
| RS6 | H | H | H | H | H | H | L |
| RS7 | H | H | H | H | H | H | H |

FIG. 27

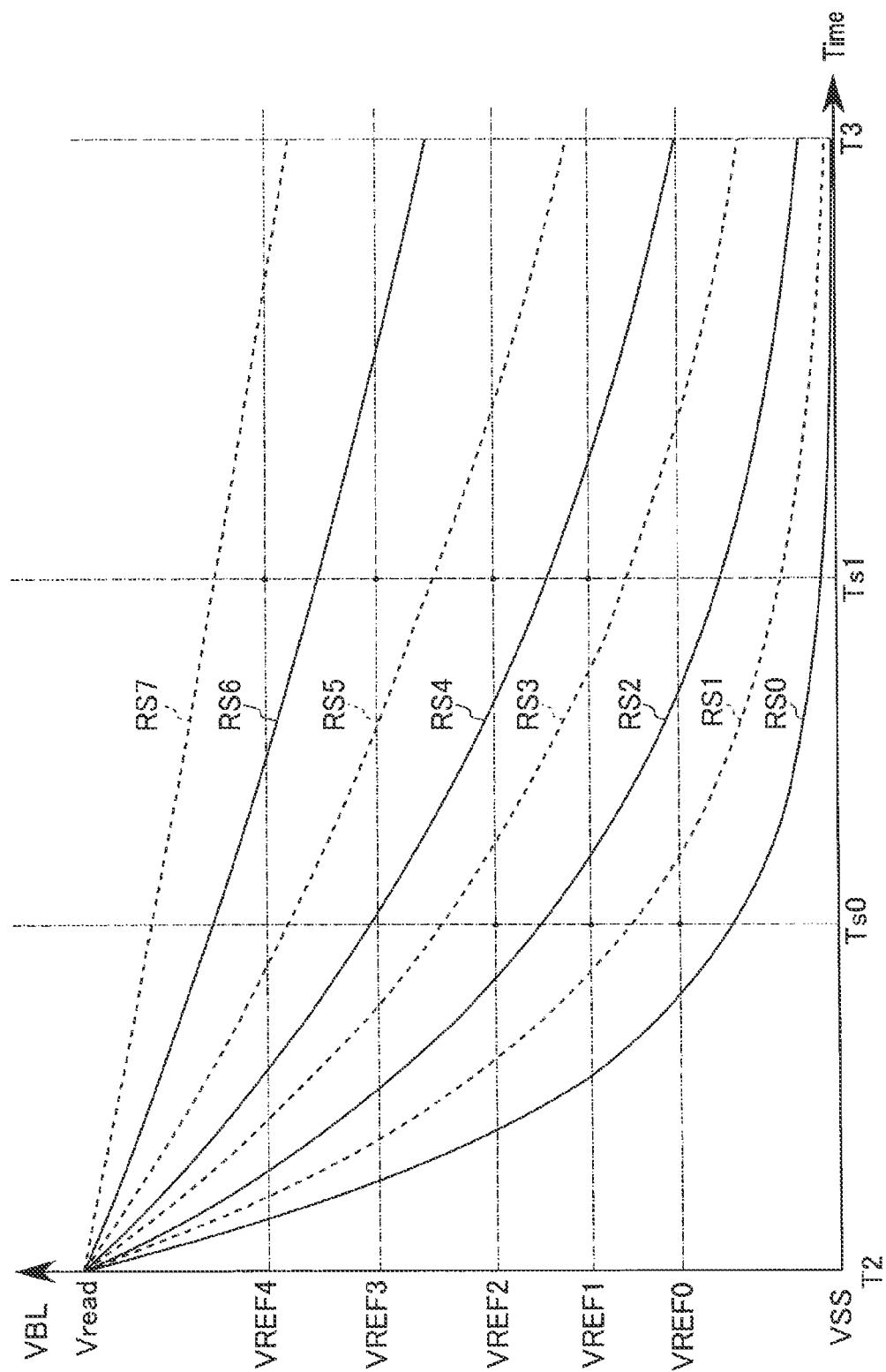
F I G. 29

| Resistance state | Ts0 | | | Ts1 | | | |
|---|---|---|---|---|---|---|---|
| | OA0 | OA1 | OA2 | OA1 | OA2 | OA3 | OA4 |
| RS0 | L | L | L | – | – | – | – |
| RS1 | H | L | L | – | – | – | – |
| RS2 | H | H | L | – | – | – | – |
| RS3 | H | H | H | L | L | L | L |
| RS4 | H | H | H | H | L | L | L |
| RS5 | H | H | H | H | H | L | L |
| RS6 | H | H | H | H | H | H | L |
| RS7 | H | H | H | H | H | H | H |

F I G. 31

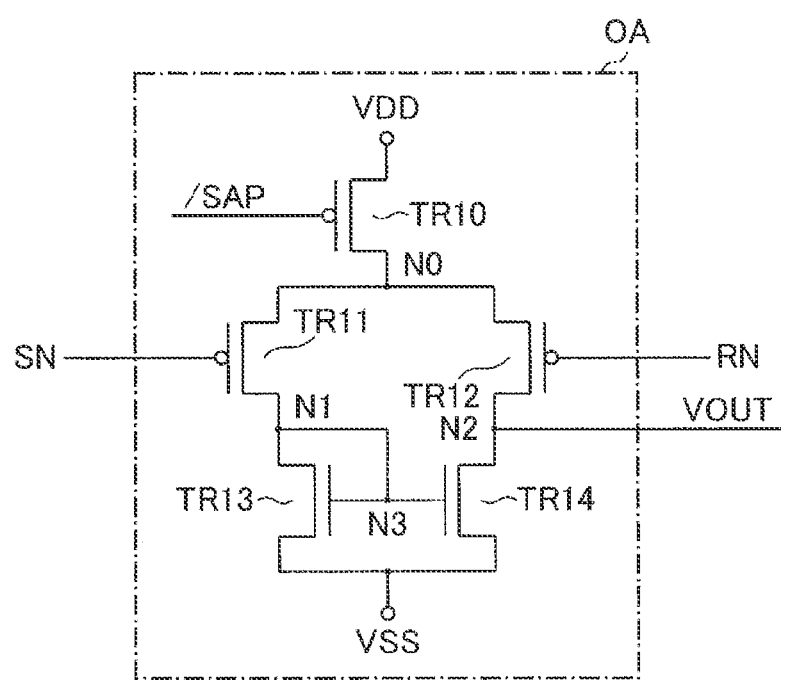
F I G. 34

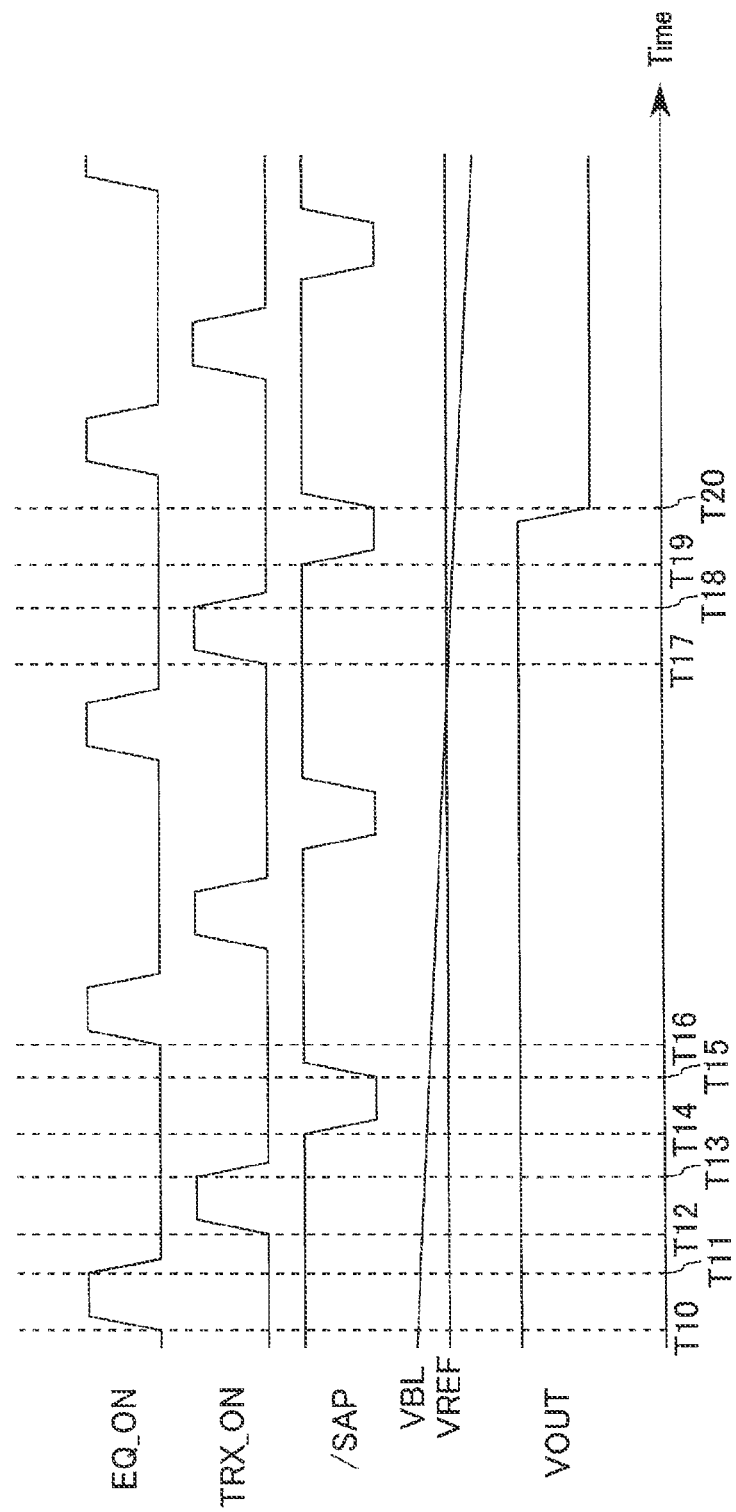
F I G. 35

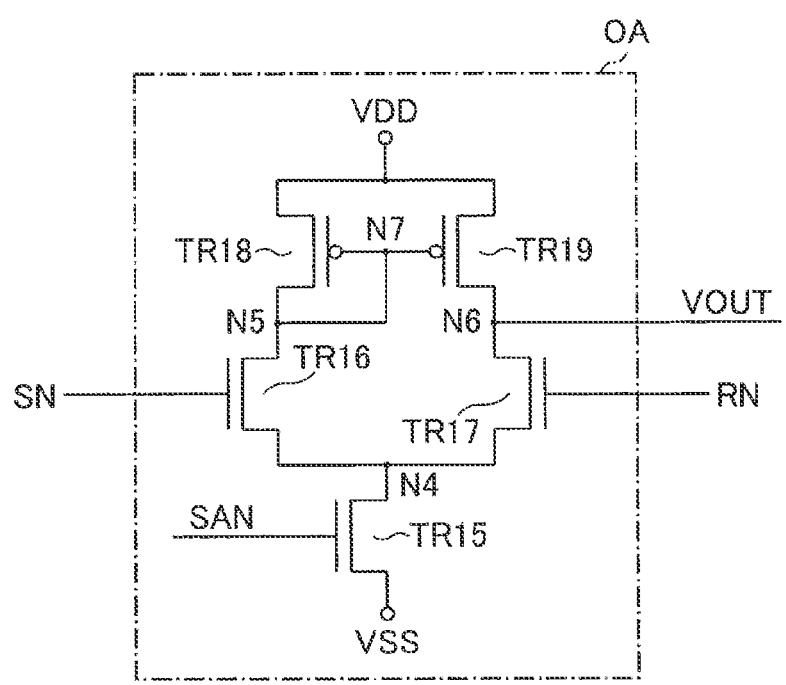
F I G. 37

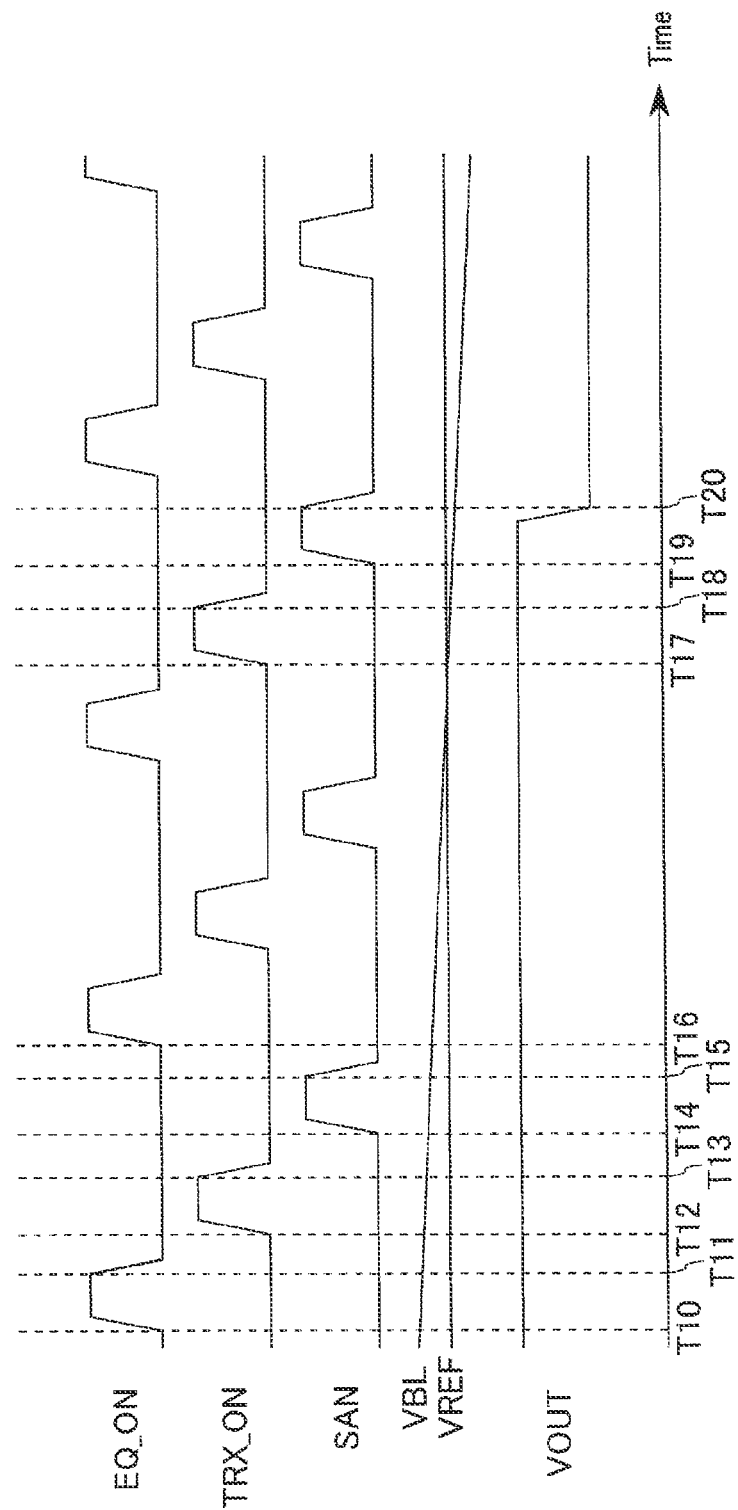
F I G. 38

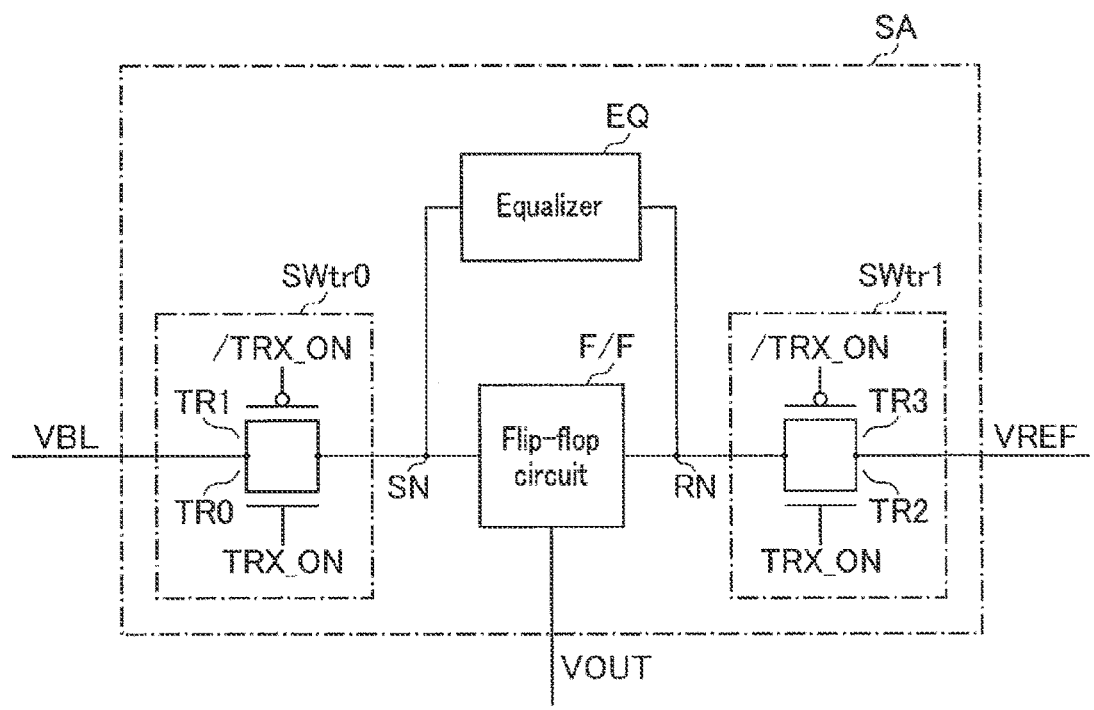
F I G. 39
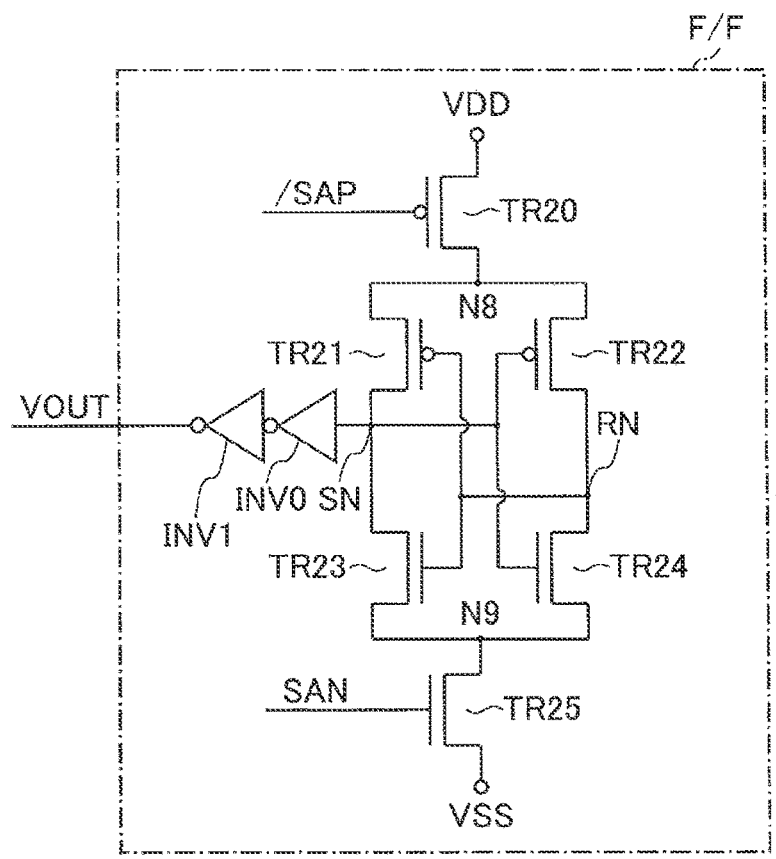
F I G. 40

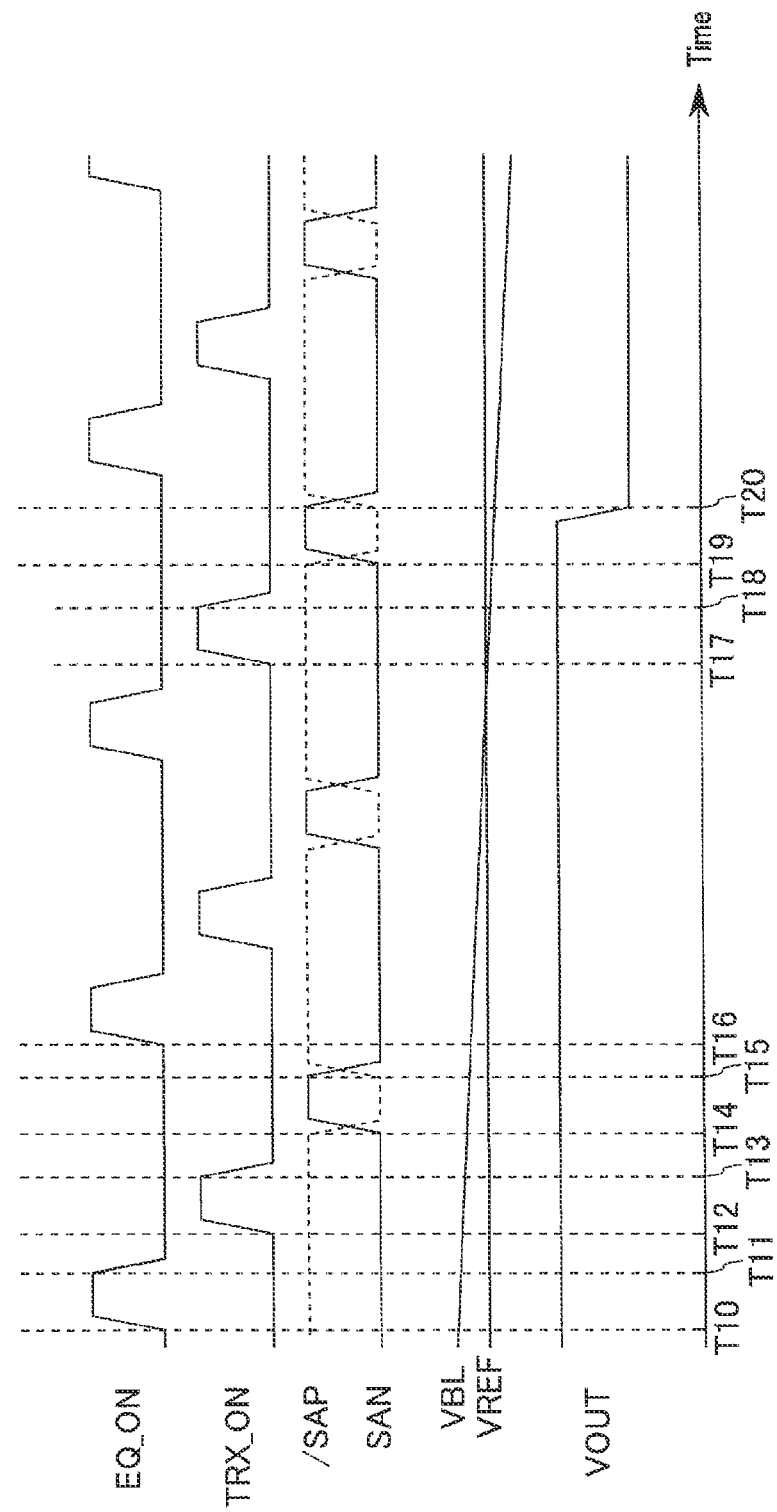
F I G. 41

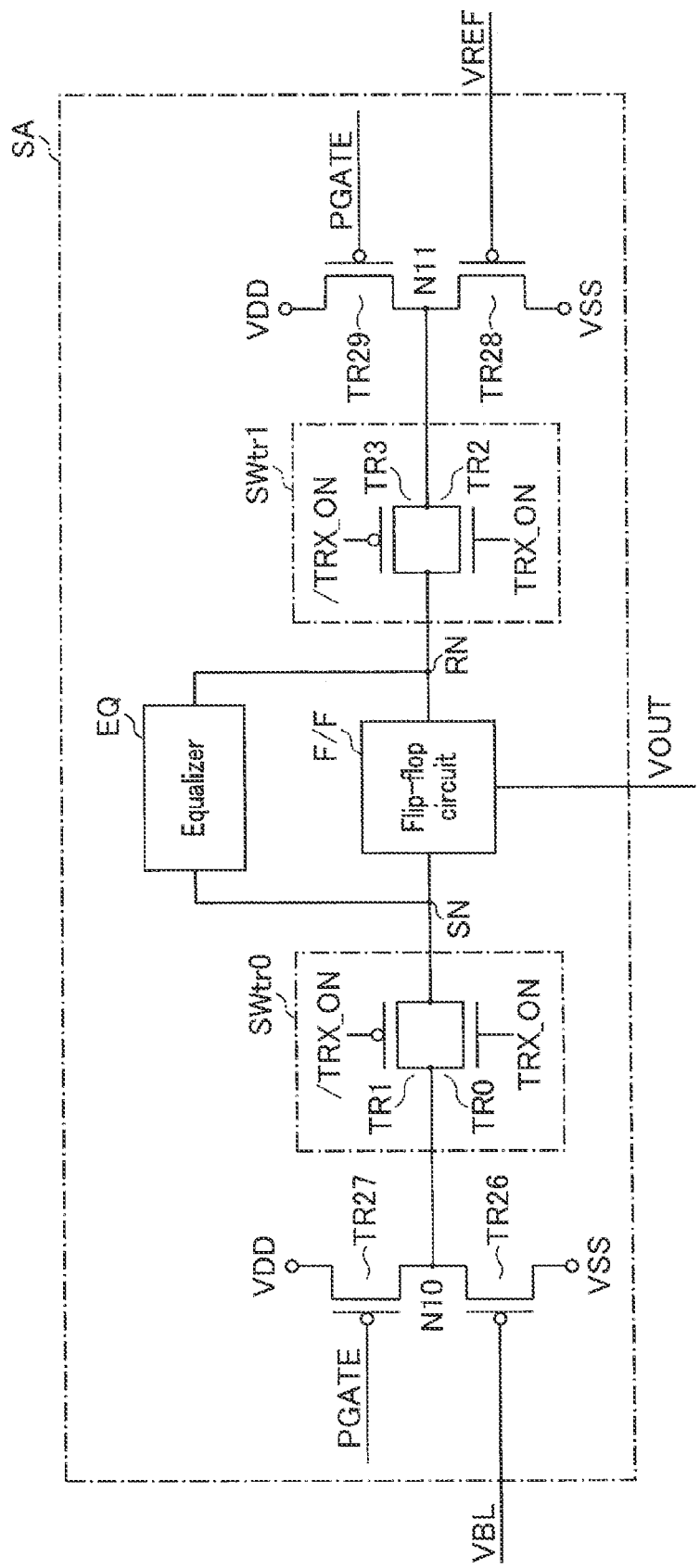
F I G. 43

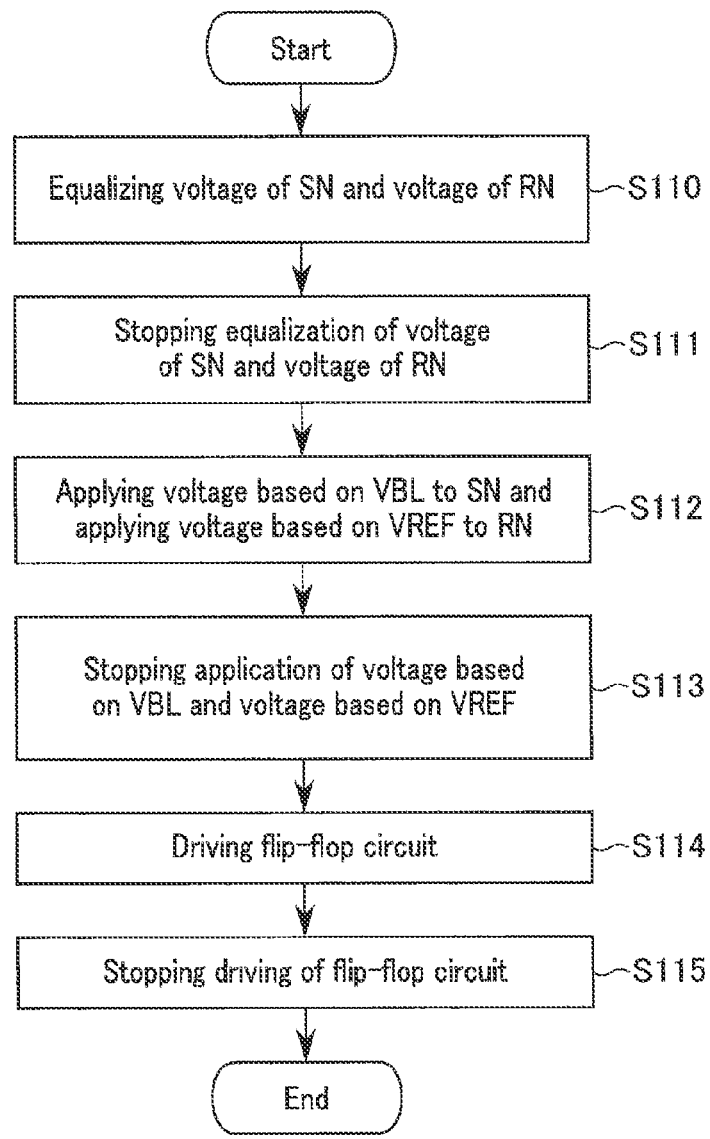
F I G. 46

FIG. 47

| Reference voltage | Resistance state | Number of clocks | | | | | | | | | | | | | | | | | | | |
|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | 19 | 20 |
| VREF_L | RS0 | H | H | L | L | L | L | L | L | L | L | L | L | L | L | L | L | L | L | L | L |
| | RS1 | H | H | H | L | L | L | L | L | L | L | L | L | L | L | L | L | L | L | L | L |
| | RS2 | H | H | H | H | H | L | L | L | L | L | L | L | L | L | L | L | L | L | L | L |
| | RS3 | H | H | H | H | H | H | H | H | L | L | L | L | L | L | L | L | L | L | L | L |
| VREF_H | RS4 | H | H | H | H | L | L | L | L | L | L | L | L | L | L | L | L | L | L | L | L |
| | RS5 | H | H | H | H | H | H | H | L | L | L | L | L | L | L | L | L | L | L | L | L |
| | RS6 | H | H | H | H | H | H | H | H | H | H | H | H | H | H | L | L | L | L | L | L |
| | RS7 | H | – | – | – | – | – | – | – | – | – | – | – | – | – | – | – | – | – | – | – |

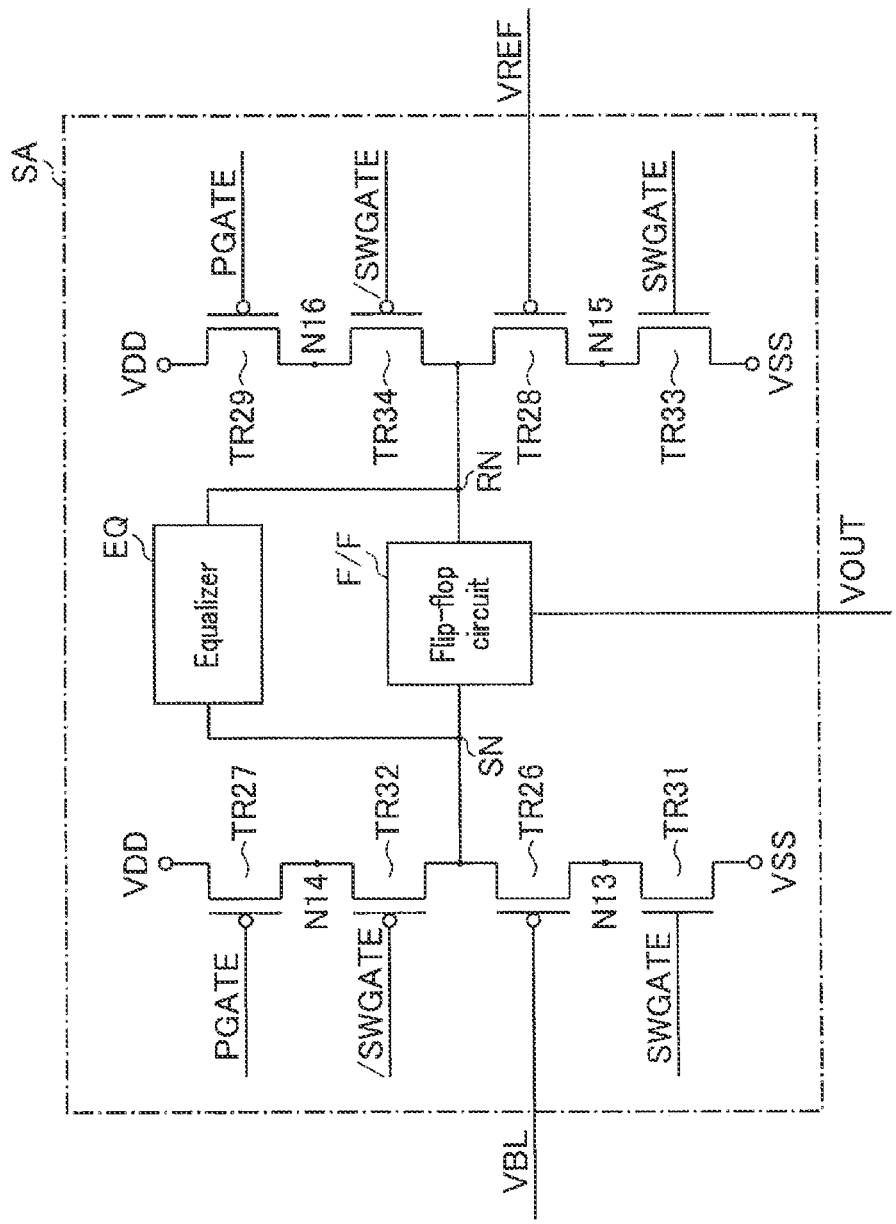
F I G. 48

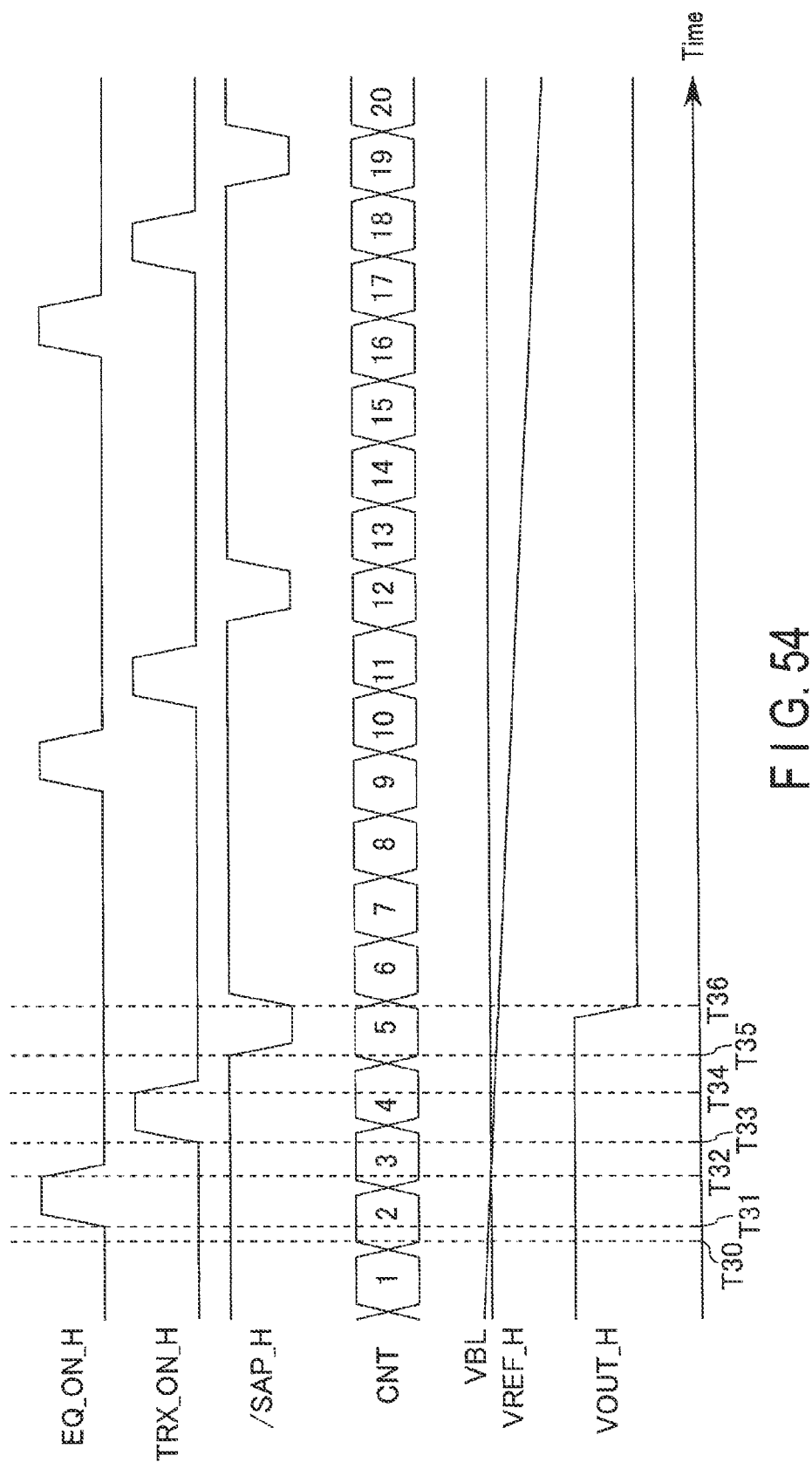
F I G. 54

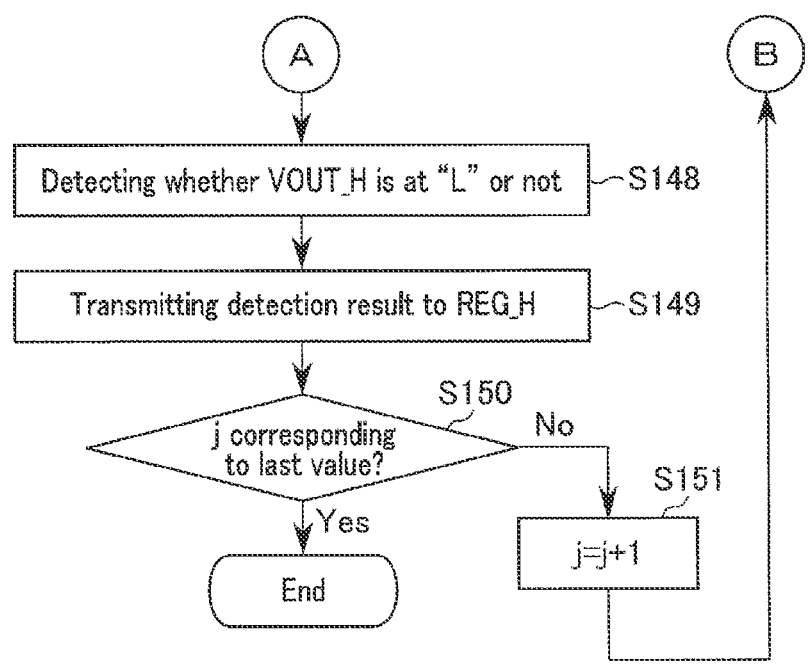
F I G. 56

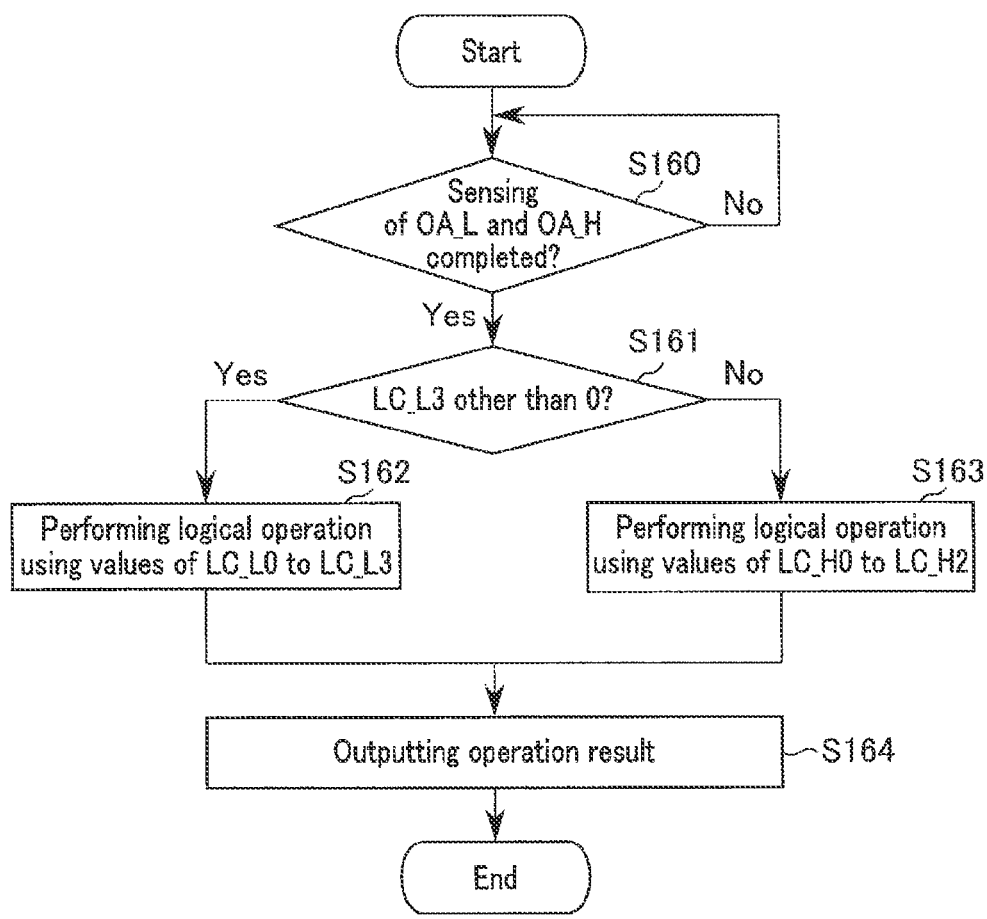
F I G. 57

MEMORY DEVICE HAVING SENSE AMPLIFIER INCLUDING PLURAL SENSE CIRCUITS FOR SENSING A VOLTAGE OF A BIT LINE IN A READ OPERATION

CROSS-REFERENCE TO RELATED APPLICATIONS

This application is based upon and claims the benefit of priority from Japanese Patent Application No. 2020-169609, filed Oct. 7, 2020, the entire contents of which are incorporated herein by reference.

FIELD

Embodiments described herein relate generally to a memory device.

BACKGROUND

Memory devices (semiconductor integrated circuit devices) in which variable resistance memory elements such as resistive random access memory (ReRAM) elements, alloy-based phase-change memory (PCM) elements, interfacial phase-change memory (iPCM) elements, and conductive-bridge RAM (CBRAM) elements are integrated on a semiconductor substrate have been proposed.

BRIEF DESCRIPTION OF THE DRAWINGS

FIG. 1 is a block diagram illustrating an overall configuration of a memory system including a memory chip according to a first embodiment.

FIG. 10 is a circuit diagram of one memory cell string within the memory cell array included in the memory chip according to the first embodiment.

FIG. 14 is a flowchart showing the sense operation of the sense amplifier module included in the memory chip according to the first embodiment.

FIG. 17 is a circuit diagram of one memory cell string within the memory cell array included in the memory chip according to the modification of the first embodiment.

FIG. 20 is a view showing a relationship between a voltage of a bit line and a time period after a read voltage is applied to a selected bit line in the memory chip according to the second embodiment.

FIG. 23 is a view showing a relationship between a voltage of a bit line and a time period after a read voltage is applied to a selected bit line in the memory chip according to the third embodiment.

FIG. 24 is a flowchart showing a sense operation of an operational amplifier within the sense amplifier module included in the memory chip according to the third embodiment.

FIG. 25 is a flowchart showing the sense operation of the operational amplifier within the sense amplifier module included in the memory chip according to the third embodiment.

FIG. 26 is a flowchart showing a computation operation of a logical operation circuit within the sense amplifier module included in the memory chip according to the third embodiment.

FIG. 27 is a view showing a relationship between a resistance state of a memory element and sense results of two operational amplifiers in the memory chip according to the third embodiment.

FIG. 29 is a view showing a relationship between a voltage of a bit line and a time period after a read voltage is applied to a selected bit line in the memory chip according to the fourth embodiment.

FIG. 31 is a view showing a relationship between a resistance state of a memory element and sense results of operational amplifiers each of which can be specified in terms of a resistance state in the memory chip according to the fourth embodiment.

FIG. 34 is a circuit diagram showing a configuration of an operational amplifier within the sense amplifier module included in the memory chip according to the fifth embodiment.

FIG. 35 is a timing chart of various signals during a sense operation of the sense amplifier module included in the memory chip according to the fifth embodiment.

FIG. 37 is a circuit diagram showing a configuration of an operational amplifier within a sense amplifier module included in a memory chip according to a sixth embodiment.

FIG. 38 is a timing chart of various signals during a sense operation of the sense amplifier module included in the memory chip according to the six embodiment.

FIG. 39 is a circuit diagram showing a configuration of a sense amplifier module within a sense amplifier included in a memory chip according to a seventh embodiment.

FIG. 40 is a circuit diagram showing a configuration of a flip-flop circuit within the sense amplifier module included in the memory chip according to the seventh embodiment.

FIG. 41 is a timing chart of various signals during a sense operation of the sense amplifier module included in the memory chip according to the seventh embodiment.

FIG. 43 is a circuit diagram showing a configuration of a sense amplifier module within a sense amplifier included in a memory chip according to an eighth embodiment.

FIG. 46 is a flowchart showing the sense operation of the sense amplifier module included in the memory chip according to the eighth embodiment.

FIG. 47 is a view showing a relationship among a resistance state of a memory element, a clock number, and an output voltage of a flip-flop circuit after a read voltage is applied to a selected bit line in the memory chip according to the eighth embodiment.

FIG. 48 is a circuit diagram showing a configuration of a sense amplifier module within a sense amplifier included in a memory chip according to a ninth embodiment.

FIG. 54 is a timing chart of various signals during the sense operation of the sense amplifier module included in the memory chip according to the tenth embodiment.

FIG. 56 is a flowchart showing the sense operation of the operational amplifier within the sense amplifier module included in the memory chip according to the tenth embodiment.

FIG. 57 is a flowchart showing a computation operation of a logical operation circuit within the sense amplifier module included in the memory chip according to the tenth embodiment.

DETAILED DESCRIPTION

Figure 2:
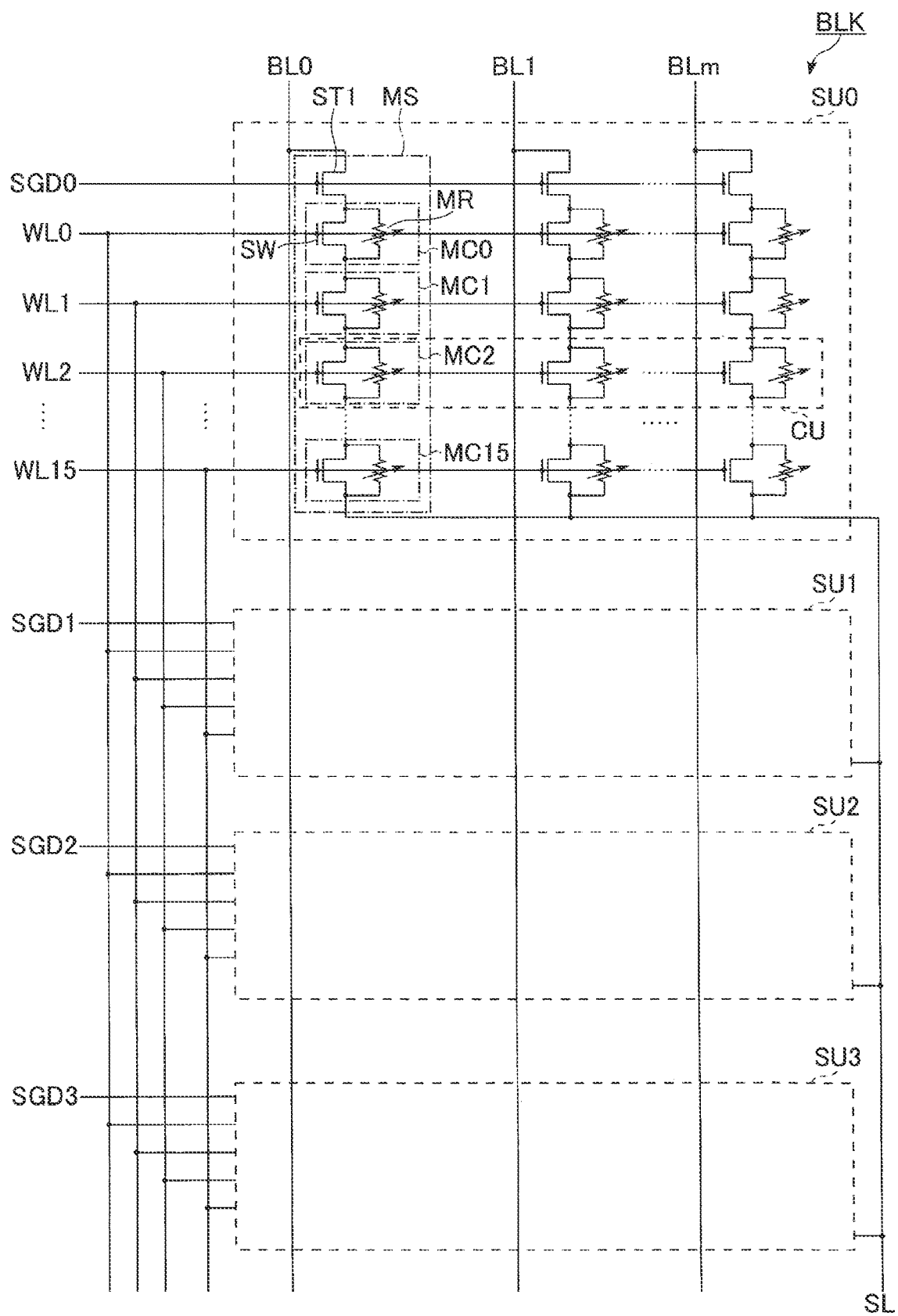
FIG. 2 is a circuit diagram of a memory cell array included in the memory chip according to the first embodiment.

In general, according to one embodiment, a memory device includes: a plurality of memory cells stacked in a first direction orthogonal to a substrate and each including a memory element having at least three resistance states and a selector coupled in parallel to the memory element; a bit line electrically coupled to the memory cells and extending in a second direction intersecting the first direction; and a sense amplifier configured to compare a voltage of the bit line with a plurality of reference voltages and sense data stored in the memory cells.

Hereinafter, embodiments will be described with reference to the drawings. In the following description, constituent elements having the same function and configuration will be assigned common reference numerals.

<1> First Embodiment

A memory chip according to a first embodiment will be described. In the following, a memory chip included in a memory system will be described as an example of a memory device.

<1-1> Configuration

<1-1-1> Overall Configuration of Memory System

First, an overall configuration of a memory system including a memory chip according to the present embodiment will be described with reference to FIG. 1. FIG. 1 is a block diagram showing the overall configuration of the memory system including the memory chip according to the present embodiment.

As shown in FIG. 1, the memory system 1 includes a memory chip 100 and a controller 200. The memory chip 100 and the controller 200 in combination, for example, may constitute a single semiconductor device; examples of such a configuration include a memory card such as an SD™ card and a solid state drive (SSD).

The memory chip 100 includes a plurality of memory cells, and stores data in a non-volatile manner. The controller 200 is coupled to the memory chip 100 via a memory bus, and controls the memory chip 100. The memory bus transmits and receives signals compatible with a memory interface. The controller 200 is coupled to a host 300 via a host bus, and accesses the memory chip 100 in response to a host command received from the host 300. Examples of the host 300 include a digital camera and a personal computer. The host bus is, for example, an SD™ interface-compatible bus.

<1-1-2> Configuration of Controller 200

Details of a configuration of the controller 200 will be described with continued reference to FIG. 1.

As shown in FIG. 1, the controller 200 includes a host interface circuit (host I/F) 210, a built-in memory (random access memory: RAM) 220, a processor (central processing unit: CPU) 230, a buffer memory 240, a memory interface circuit (memory I/F) 250, and an error checking and correcting (ECC) circuit 260.

The host interface circuit 210 is coupled to the host 300 via the host bus, and transfers a host command and data received from the host 300 to the processor 230 and the buffer memory 240, respectively. The host interface circuit 210 transfers data in the buffer memory 240 to the host 300 in response to an order from the processor 230.

The built-in memory 220 is, for example, a semiconductor memory such as a DRAM or an SRAM, and is used as a work area of the processor 230. The built-in memory 220 stores firmware for managing the memory chip 100, various management tables, etc.

The processor 230 controls the operation of the entire controller 200. For example, upon receipt of a host command relating to a read from the host 300, the processor 230 causes, in response thereto, the memory interface circuit 250 to issue a read command (memory command) to the memory chip 100. Upon receipt of a host command relating to a write from the host 300, the processor 230 performs a similar operation. The processor 230 further performs various types of processing (e.g., wear leveling) for managing the memory chip 100.

The buffer memory 240 temporarily stores data written into the memory chip 100 and data read from the memory chip 100.

The memory interface circuit 250 is coupled to the memory chip 100 via the memory bus, and controls communications with the memory chip 100. More specifically, the memory interface circuit 250 transmits various signals to the memory chip 100 and receives various signals from the memory chip 100 based on orders received from the processor 230.

The ECC circuit 260 performs processing of error detection and correction regarding data stored in the memory chip 100. More specifically, the ECC circuit 260 generates an error correction code and provides this error correction code to write data when writing data, and decodes this error correction code when reading data.

<1-1-3> Configuration of Memory Chip 100

Next, details of a configuration of the memory chip 100 will be described with reference to FIG. 1.

As shown in FIG. 1, the memory chip 100 includes a memory cell array 110, a row decoder 120, a driver circuit 130, a sense amplifier 140, a data register 150, an address register 160, a command register 170, and a sequencer 180.

The memory cell array 110 includes a plurality of blocks BLK each including a plurality of non-volatile memory cells respectively associated with rows (words lines) and columns (bit lines). FIG. 1 shows four blocks BLK0 to BLK3, as an example. The memory cell array 110 stores, in a memory cell, data supplied from the controller 200.

The row decoder 120 selects one of the blocks BLK0 to BLK3 based on a block address BA in the address register 160, and selects a word line in the selected block BLK.

The driver circuit 130 supplies a voltage to the selected block BLK via the row decoder 120 based on a page address PA in the address register 160. The driver circuit 130 includes, for example, a source line driver, etc.

The sense amplifier 140 includes a sense amplifier module SA provided for each bit line BL. When reading data, the sense amplifier 140 senses data read from the memory cell array 110 and performs a necessary computation. The sense amplifier 140 transmits the computed data DAT to the data register 150. When writing data, the sense amplifier 140 transfers write data DAT received from the data register 150 to the memory cell array 110.

The data register 150 includes one or more latch circuits. The latch circuits can store read data or write data. For example, when reading data, the data register 150 temporarily stores data DAT received from the sense amplifier 140 and outputs the data to the controller 200. When writing data, the data register 150 temporarily stores write data DAT received from the controller 200 and transmits the data to the sense amplifier 140.

The address register 160 stores address ADD received from the controller 200. This address ADD includes the aforementioned block address BA and page address PA.

The command register 170 stores command CMD received from the controller 200.

The sequencer 180 controls an operation of the entire memory chip 100. More specifically, based on a command CMD stored in the command register 170, the sequencer 180 controls, for example, the row decoder 120, the driver circuit 130, the sense amplifier 140, the data register 150, etc., thereby performing a read operation, a write operation, etc.

<1-1-4> Circuit Configuration of Memory Cell Array 110

Next, a circuit (equivalent circuit) configuration of the memory cell array 110 included in the memory chip 100 according to the present embodiment will be described with reference to FIG. 2. FIG. 2 shows an example of a circuit configuration of the memory cell array 110 included in the memory chip 100 according to the present embodiment by extracting one of the blocks BLK included in the memory cell array 110.

As shown in FIG. 2, each of the blocks BLK in the memory cell array 110 includes, for example, four string units SU (SU0 to SU3). The number of string units SU included in each of the blocks BLK may be freely selected. Each of the string units SU includes a plurality of memory cell strings MS.

Each of the memory cell strings MS includes, for example, 16 memory cells MC (MC0 to MC15) and a select transistor ST1. Hereinafter, in the case where the memory cells MC0 to MC15 are not distinguished from each other, they will be simply referred to as a memory cell MC. The number of memory cells MC included in each of the memory cell strings MS may be 8, 32, 48, 64, 96, 128, etc., and is not limited to a particular number. The number of select transistors ST1 included in each of the memory cell strings MS may be any number greater than one.

The memory cell MC includes a memory element (variable resistance memory region/variable resistance layer/variable resistance element) MR and a selector SW. Examples of the memory element MR include an alloy-based phase-change memory element ($Ge_2Sb_2Te_5$). The memory element MR of the present embodiment enters a resistance state according to a crystal state as the crystal state changes. Hereinafter, the case in which the memory element MR takes eight resistance states RS (RS0 to RS7) will be described as an example. Hereinafter, resistance values of the resistance states RS0 to RS7 will be referred to as resistance values R0 to R7 (where $R0<R1<R2<R3<R4<R5<R6<R7$), respectively. The number of resistance states RS that the memory element MR takes may be 2, 4, 16, etc., and is not limited to a particular number. For example, in the case where the memory element MR takes two resistance states RS, a low resistance state (LRS) of the memory element MR will be referred to as a "set state", and a high resistance state (HRS) of the memory element MR will be referred to as a "reset state". A selector SW of the present embodiment includes a semiconductor layer, a gate insulating film, and a gate electrode. In the memory cell MC, the memory element MR and the selector SW are coupled in parallel.

Each of the eight resistance states is assigned a three-bit value, for example, as presented below.
State RS0: "000"
State SR1: "001"
State SR2: "010"
State SR3: "011"
State SR4: "100"
State SR5: "101"
State SR6: "110"
State SR7: "111"
The method of allocating a three-bit value to each resistance state is not limited to the above method.

Figure 3:
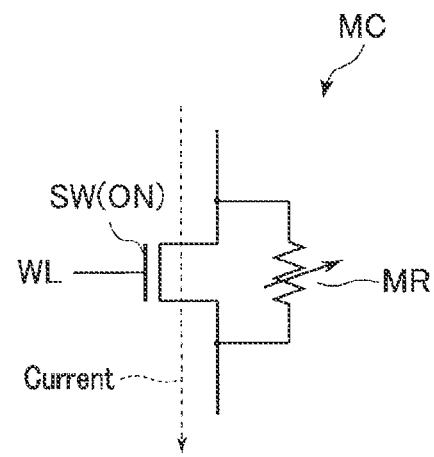
FIG. 3 is a circuit diagram showing a path of a current flowing inside a memory cell in the case where a selector within the memory cell included in the memory chip according to the first embodiment is in an on state.

In the case of the memory cell MC not being selected, the selector SW is in an on state (conductive state). As shown in FIG. 3, in the case of the selector SW being in an on state, an inversion layer (channel layer) is formed in the semiconductor layer of the selector SW, so that a current flows through the inversion layer. For example, a resistance value R0 of the memory element MR in the lowest resistance state RS0 is 10 times (an order of magnitude) or more higher than a resistance value of the semiconductor layer of the selector SW in an on state. This prevents a current from flowing through the memory element MR that is coupled in parallel. The memory element MR stores data. Accordingly, no current flowing through the memory element MR means that the memory cell MC is not selected.

Figure 4:
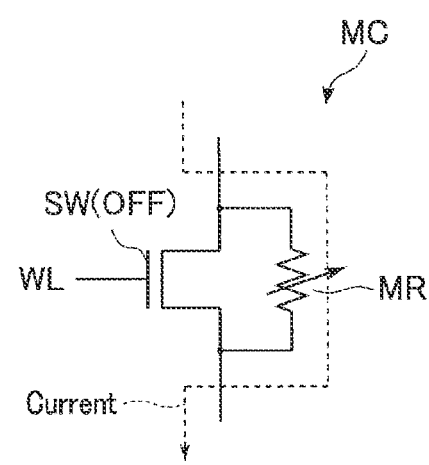
FIG. 4 is a circuit diagram showing a path of a current flowing inside the memory cell in the case where the selector within the memory cell included in the memory chip according to the first embodiment is in an off state.

On the other hand, in the case of the memory cell MC being selected, the selector SW is in an off state (non-conductive state). As shown in FIG. 4, in the case of the selector SW being in an off state, an inversion layer (channel layer) is not formed in the semiconductor layer of the selector SW, so that no current flows through the semiconductor layer. A resistance value R7 of the memory element MR in the highest resistance state RS7 is 10 times (an order of magnitude) or more lower than a resistance value of the semiconductor layer of the selector SW in an off state. This causes a current to flow through the memory element MR that is coupled in parallel. A current flowing through the memory element MR means that the memory cell MC is selected.

Referring back to FIG. 2, the memory cell array 110 will be further described. The memory cells MC0 to MC15 included in each memory cell string MS are coupled in series between the select transistor ST1 and a source line SL. The memory element MR that is coupled in parallel to the select transistor ST1 may be provided. In such a case, the configuration in which the select transistor ST1 and the memory element MR are coupled in parallel may be the same as the configuration of the memory cell MC. Control gates (a plurality of control gates) of the memory cells MC0 of the memory cell strings MS included in the same block BLK are commonly coupled to a word line WL0. Similarly, control gates of the memory cells MC1 to MC15 of the memory cell strings MS included in the same block BLK are respectively coupled to the word lines WL1 to WL15. Hereinafter, in the case where the word lines WL0 to WL15 are not distinguished from each other, they will be simply referred to as a word line WL. A set of memory cells MC coupled to a common word line WL in each string unit SU will be referred to as a cell unit CU.

In the present embodiment, one memory cell MC can store three-bit data. Bits constituting this three-bit data will be referred to as a lower bit, a middle bit, and an upper bit in ascending order from the least significant bit. A set of lower bits stored in the memory cells MC in the cell unit CU will be referred to as a lower page; a set of middle bits will be referred to as a middle page; and a set of upper bits will be referred to as an upper page. In other words, each cell unit CU is assigned three pages.

Gates of select transistors ST1 in each string unit SU are commonly coupled to a select gate line SGD. More specifically, gates of the plurality of select transistors ST1 in the string unit SU0 are commonly coupled to a select gate line SGD0. Similarly, gates of the select transistors ST1 in the string unit SU1 are commonly coupled to a select gate line SGD1. The same is true of string units SU2 and SU3. Hereinafter, when select gate lines SGD (SGD0, SGD1, . . . ) are not distinguished from each other, they will be simply referred to as a select gate line SGD.

Each of the select gate line SGD and the word line WL is independently controlled by the row decoder 120.

Furthermore, drains of the select transistors ST1 in the memory cell strings MS in the same column in the memory cell array 110 are commonly coupled to a bit line BL (BL0 to BLm, where m is a natural number equal to or greater than 1). In other words, each bit line BL commonly couples the memory cell strings MS included in the respective string units SU of the plurality of blocks BLK. Hereinafter, in the case where the bit lines BL0 to BLm are not distinguished from each other, they will be simply referred to as a bit line BL. In addition, sources of the memory cells MC15 in the memory cell strings MS within the memory cell array 110 are commonly coupled to the source line SL.

As described above, each of the string units SU includes the plurality of memory cell strings MS that are coupled to the different bit lines BL and coupled to the same select gate line SGD. Each of the blocks BLK includes a plurality of string units SU that share the same word line WL. The memory cell array 110 includes the plurality of blocks BLK that share the same bit line BL.

<1-1-5> Structure of Memory Cell Array 110

Figure 5:
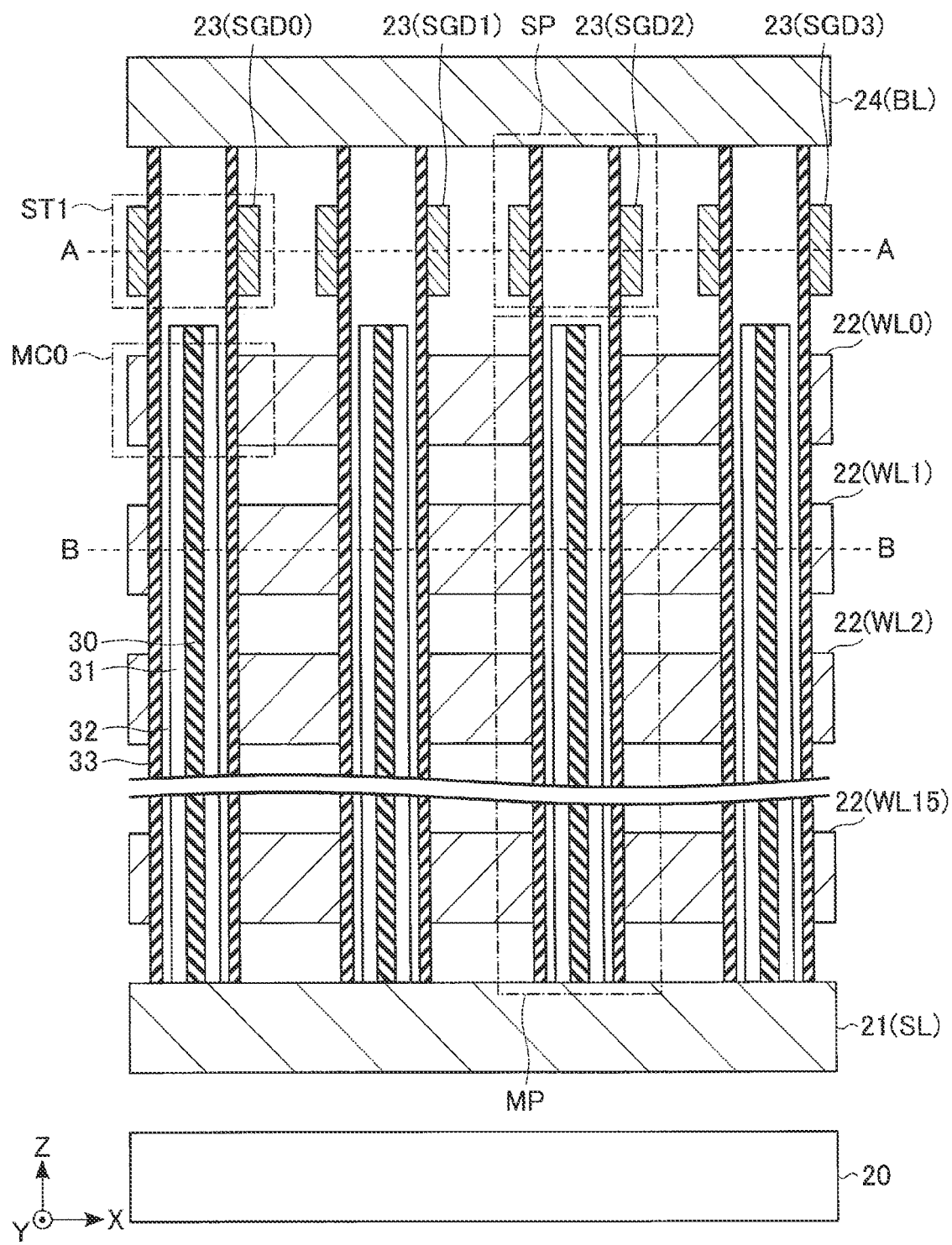
FIG. 5 is a cross-sectional view of the memory cell array included in the memory chip according to the first embodiment.

Next, a structure of the memory cell array 110 included in the memory chip 100 according to the present embodiment will be described with reference to FIG. 5. FIG. 5 shows an example of a cross-sectional structure of the memory cell array 110 included in the memory chip 100 according to the present embodiment. In the drawings to which reference will be made below, an "X direction" refers to a direction in which the bit lines BL extend, a "Y direction" corresponds to a direction in which the word lines WL extend, and a "Z direction" corresponds to a direction vertical to a surface of a semiconductor substrate 20 on which the memory cell array 110 is formed. In the drawings, to improve visibility, constituent elements such as insulating layers (interlayer insulating films), interconnects, contacts, etc. are suitably omitted.

As shown in FIG. 5, the memory cell array 110 includes, for example, conductive layers 21 to 24. The conductive layers 21 to 24 are provided above the semiconductor substrate 20.

More specifically, the conductive layer (voltage application electrode) 21 is provided above the semiconductor substrate 20 in the Z direction with an insulating layer (not shown) intervening therebetween. The insulating layer between the semiconductor substrate 20 and the conductive layer 21 may be provided with a circuit such as the sense amplifier 140. The conductive layer 21 is formed, for example, in a plate-like shape extending along the XY plane, and is used as a source line SL. The conductive layer 21 is set to a constant low voltage to allow a current to flow therethrough from the bit line BL. The conductive layer 21 includes, for example, silicon (Si).

Insulating layers (not shown) and conductive layers (voltage application electrode) 22 are stacked in an alternating manner above the conductive layer 21 in the Z direction. The conductive layers 22 are formed, for example, in a plate-like shape extending along the XY plane. The stacked conductive layers 22 are used as, for example, in the order from the side of the semiconductor substrate 20, word lines WL15 to WL0. The conductive layer 22 includes, for example, tungsten (W).

The plurality of conductive layers (voltage application electrode) 23 are stacked above the topmost conductive layer 22 (WL0) in the Z direction with an insulating layer (not shown) intervening therebetween. The conductive layer 23 extends in the Y direction, and is provided for each select pillar SP to be described later in the X direction. The conductive layers 23 are respectively used as select gate lines SGD0 to SGD3. The conductive layers 23 include, for example, tungsten (W).

The conductive layer (voltage application electrode) 24 is provided above the conductive layers 23 in the Z direction with an insulating layer (not shown) intervening therebetween. The conductive layer 24 is formed, for example, in a linear shape extending in the X direction and is used as a bit line BL. The conductive layer 24 includes, for example, copper (Cu).

A memory pillar MP is, for example, in a pillar shape extending in the Z direction, penetrates the conductive layers 22 and insulating layers (not shown), and has its bottom portion reaching the conductive layer 21. The memory pillar MP includes, for example, a core member 30, a variable resistance layer 31, a semiconductor layer 32, and an insulating layer 33.

A pillar-shaped select pillar SP that penetrates the conductive layers 23 and insulating layers (not shown) and reaches, at its top portion, the conductive layer 24 is formed on the memory pillar MP. The select pillar SP includes, for example, the semiconductor layer 32 and the insulating layer 33.

A layer including an interface between the memory pillar MP and the select pillar SP is included in a layer between the topmost conductive layer 22 and the conductive layers 23.

The core member 30 is, for example, in a pillar shape extending in the Z direction. The core member 30 includes, for example, an insulator such as a silicon nitride (SiN).

The variable resistance layer 31 covers a side surface (outer periphery) of the core member 30 (is in contact with the core member 30). The variable resistance layer 31 is formed, for example, in a cylindrical shape extending in the Z direction. A bottom portion of the variable resistance layer 31 is in contact with the conductive layer 21. Examples of a material of the variable resistance layer 31 include an alloy-based phase-change memory element ($Ge_2Sb_2Te_5$).

The semiconductor layer 32 in the memory pillar MP covers a side surface (outer periphery) of the variable resistance layer 31 (is in contact with the variable resistance layer 31). The semiconductor layer 32 in the memory pillar MP is formed, for example, in a cylindrical shape extending in the Z direction. A bottom portion of the semiconductor layer 32 in the memory pillar MP is in contact with the conductive layer 21.

The semiconductor layer 32 in the select pillar SP is, for example, in a pillar shape extending in the Z direction. A top portion of the semiconductor layer 32 in the select pillar SP is in contact with the conductive layer 24. The bottom portion of the semiconductor layer 32 in the select pillar SP is in contact with the semiconductor layer 32, the variable resistance layer 31, and the core member 30 in the memory pillar MP.

The insulating layer 33 covers a side surface (outer periphery) of the semiconductor layer 32 (is in contact with the semiconductor layer 32). The insulating layer 33 is formed, for example, in a cylindrical shape extending in the Z direction. A portion of the side surface of the insulating layer 33 in the memory pillar MP is covered with the conductive layer 22 (is in contact with the conductive layer 22). A portion of the side surface of the insulating layer 33 in the select pillar SP is covered with the conductive layer 23 (is in contact with the conductive layer 23). The insulating layer 33 includes an insulator such as silicon oxide ($SiO_2$).

The select transistor ST1 includes the conductive layers 23, the semiconductor layer 32, and the insulating layer 33. The memory element MR that is coupled in parallel to the select transistor ST1 may be provided. In such a case, the configuration in which the select transistor ST1 and the memory element MR are coupled in parallel may be the same as the configuration of the memory cell MC. More specifically, the core member 30 and the variable resistance layer 31 may be provided in such a manner that, for example, in FIG. 5, the top portions of the core member 30 and the variable resistance layer 31 are positioned above the conductive layers 23 (positioned closer to the bit line BL). The top portions of the core member 30 and the variable resistance layer 31 may be in contact with the conductive layer 24.

Figure 6:
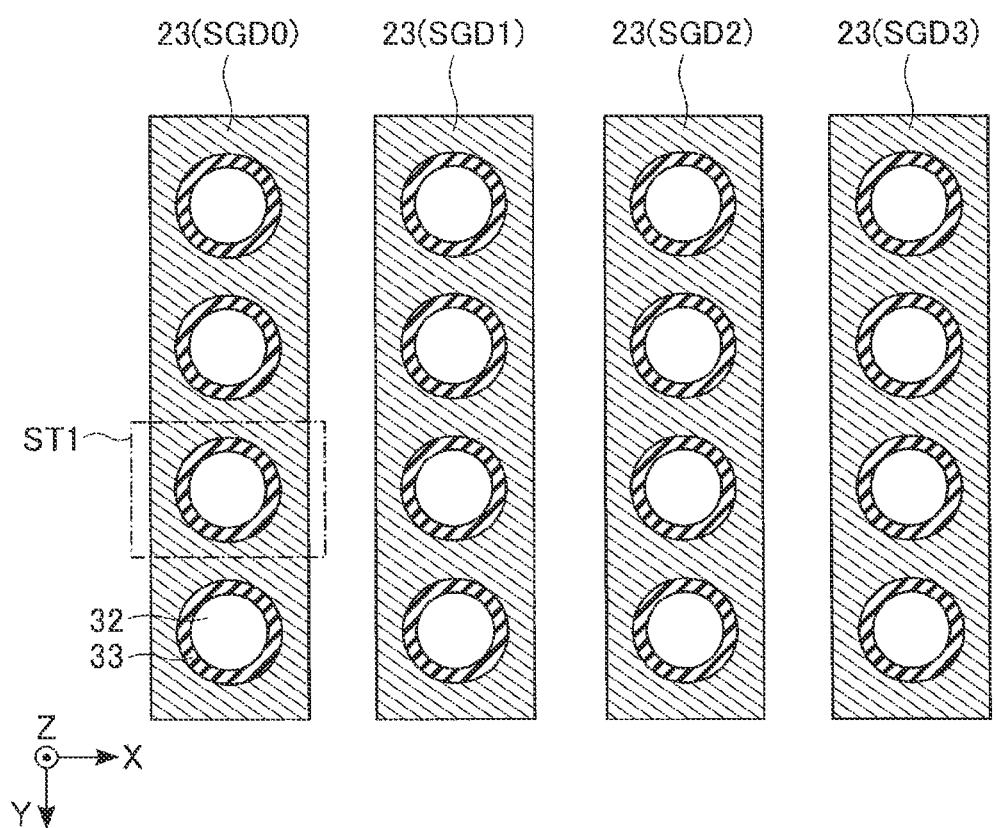
FIG. 6 is a cross-sectional view taken along line A-A of FIG. 5.

Next, a cross-sectional view of the conductive layers 23 will be described with reference to FIG. 6. FIG. 6 is a cross-sectional view which is taken along line A-A in FIG. 5 and is perpendicular to the Z direction.

As shown in FIG. 6, the semiconductor layer 32 and the insulating layer 33 that covers the side surface of the semiconductor layer 32 penetrate the conductive layers 23. The conductive layers 23 function as the select gate lines SGD0 to SGD3 of the select transistor ST1. The insulating layer 33 functions as a gate insulating film of the select transistor ST1. The semiconductor layer 32 functions as a semiconductor layer of the select transistor ST1. Through the use of the select transistor ST1, it is possible to select a memory pillar MP for each word line WL. More specifically, an inversion layer is formed in the semiconductor layer 32 in contact with the variable resistance layer 31 of the memory pillar MP by turning the select transistor ST1 on, and the memory pillar MP can be selected by causing a current to flow through the inversion layer.

Figure 7:
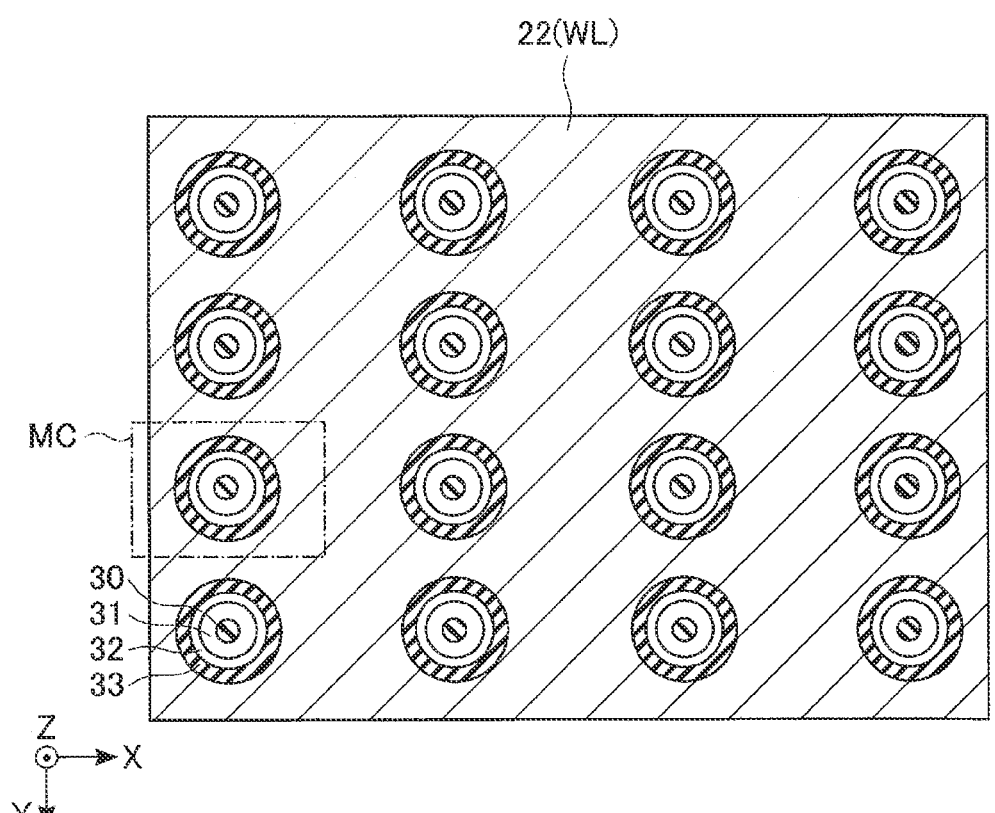
FIG. 7 is a cross-sectional view taken along line B-B of FIG. 5.

Next, a cross-sectional view of the conductive layer 22 will be described with reference to FIG. 7. FIG. 7 is a cross-sectional view which is taken along line B-B in FIG. 5 and is perpendicular to the Z direction.

As shown in FIG. 7, the memory cell MC is provided at an intersection between the plate-shaped word line WL and the memory pillar MP. More specifically, as shown in FIG. 7, the core member 30, the variable resistance layer 31 that covers the side surface of the core member 30, the semiconductor layer 32 that covers the side surface of the variable resistance layer 31, and the insulating layer 33 that covers the side surface of the semiconductor layer 32 penetrate the conductive layer 22. The conductive layer 22 functions as the word line WL of the selector SW of the memory cell MC. The insulating layer 33 functions as a gate insulating layer of the selector SW of the memory cell MC. The semiconductor layer 32 functions as a semiconductor layer of the selector SW of the memory cell MC. The variable resistance layer 31 functions as the memory element MR of the memory cell MC.

<1-1-6> Configuration of Sense Amplifier 140

Figure 8:
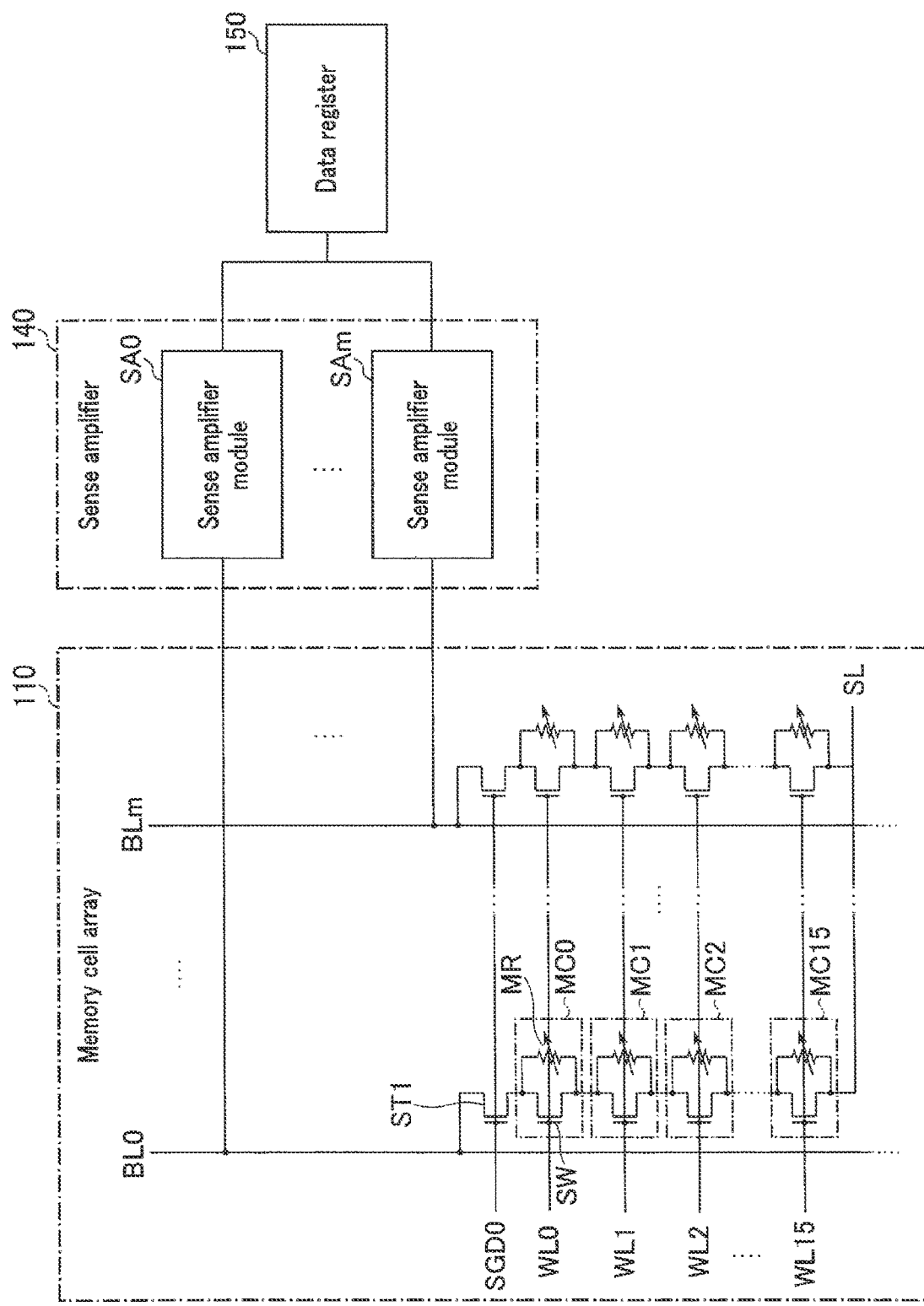
FIG. 8 is a block diagram showing a configuration of a sense amplifier included in the memory chip according to the first embodiment.

Next, details of a configuration of the sense amplifier 140 included in the memory chip 100 according to the present embodiment will be described with reference to FIG. 8. FIG. 8 is a block diagram showing an example of a configuration of the sense amplifier 140 included in the memory chip 100 according to the present embodiment.

As shown in FIG. 8, the sense amplifier 140 includes sense amplifier modules SA (SA0 to SAm, where m is a natural number equal to or greater than 1) equal in number to the bit lines BL. Hereinafter, in the case where the sense amplifier modules SA0 to SAm are not distinguished from each other, they will be simply referred to as a sense amplifier module SA. The sense amplifier modules SA0 to SAm are respectively associated with the bit lines BL0 to BLm. The sense amplifier modules SA0 to SAm are coupled to the data register 150.

When reading data, the sense amplifier module SA senses a voltage of the bit line BL, performs a computation based on a sense result, and transmits computed data DAT to the data register 150. When writing data, the sense amplifier module SA receives write data DAT from the data register 150 and transmits the received write data DAT to the bit line BL.

<1-1-7> Configuration of Sense Amplifier Module SA

Figure 9:
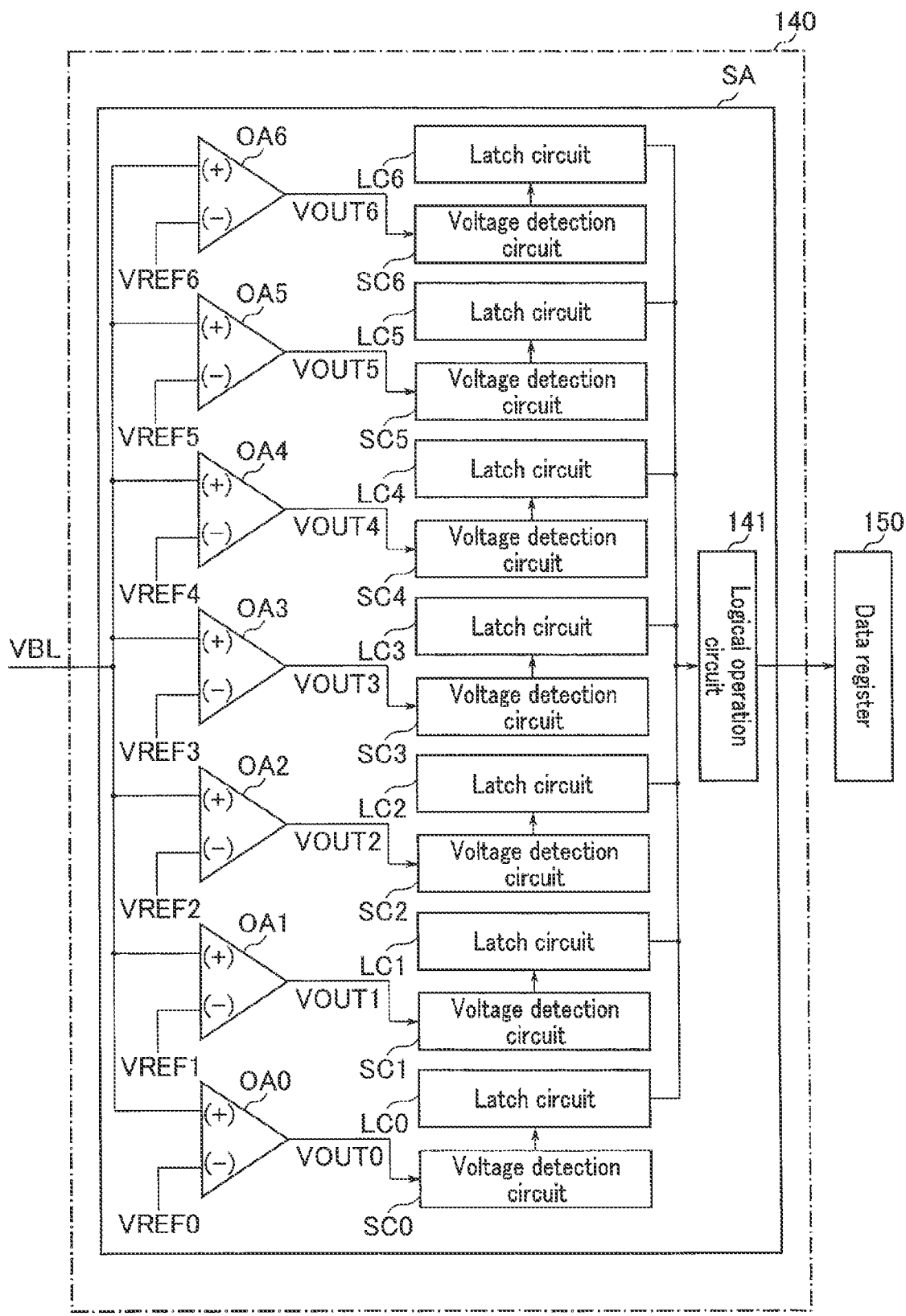
FIG. 9 is a block diagram showing a configuration of a sense amplifier module within the sense amplifier included in the memory chip according to the first embodiment.

Next, details of a configuration of the sense amplifier module SA within the sense amplifier 140 included in the memory chip 100 according to the present embodiment will be described with reference to FIG. 9. FIG. 9 is a block diagram showing an example of a configuration of the sense amplifier module SA included in the memory chip 100 according to the present embodiment. FIG. 9 omits constituent elements such as a function block, interconnect, etc., for transmitting write data DAT from the data register 150 to the bit line BL.

The sense amplifier module SA includes operational amplifiers OA0 to OA6, voltage detection circuits SC0 to SC6, latch circuits LC0 to LC6, and a logical operation circuit 141. Hereinafter, in the case where the operational amplifiers OA0 to OA6 are not distinguished from each other, they will be simply referred to as an operational amplifier OA. In the case where the voltage detection circuits SC0 to SC6 are not distinguished from each other, they will be simply referred to as a voltage detection circuit SC. In the case where the latch circuits LC0 to LC6 are not distinguished from each other, they will be simply referred to as a latch circuit LC.

In the present embodiment, one memory cell MC can store three-bit (octal) data. In order to determine octal data by performing sensing one time, seven reference voltages are set. In order to deal with the seven reference voltages, the sense amplifier module SA includes seven operational amplifiers OA, seven voltage detection circuits SC, and seven latch circuits LC. In the case where one memory cell MC can store two-bit (quaternary) data, the sense amplifier module SA includes three operational amplifiers OA, three voltage detection circuits SC, and three latch circuits LC. In the case where one memory cell MC can store four-bit (hexadecimal) data, the sense amplifier module SA includes 15 operational amplifiers OA, 15 voltage detection circuits SC, and 15 latch circuits LC.

The operational amplifiers OA0 to OA6 respectively compare a voltage VBL of the bit line BL with reference voltages VREF0 to VREF6 (VREF0<VREF1<VREF2<VREF3<VREF4<VREF5< VREF6), and respectively output comparison results as VOUT0 to VOUT6. More specifically, in the case where the voltage VBL is a reference voltage or greater, the operational amplifiers OA0 to OA6 respectively output H-level voltages as VOUT0 to VOUT6. In the case where the voltage VBL is lower than a reference voltage, the operational amplifiers OA0 to OA6 respectively output L-level voltages as VOUT0 to VOUT6. In this description, a voltage that is applied to the operational amplifier OA and is equal to or greater than a reference voltage will be defined as a High-level (H-level) voltage while a voltage that is applied to the operational amplifier OA and is smaller than the reference voltage will be defined as a Low-level (L-level) voltage.

The voltage detection circuits SC0 to SC6 respectively detect whether or not the voltages VOUT0 to VOUT6 respectively supplied from the operational amplifiers OA0 to OA6 are at the L level, and respectively transmit detection results to the latch circuits LC0 to LC6. More specifically, in the case where the voltages VOUT0 to VOUT6 are at the H level, the voltage detection circuits SC0 to SC6 respectively transmit H-level signals to the latch circuits LC0 to LC6. In the case where the voltages VOUT0 to VOUT6 are at the L level, the voltage detection circuits SC0 to SC6 respectively transmit L-level signals to the latch circuits LC0 to LC6.

The latch circuits LC0 to LC6 store the signals received from the voltage detection circuits SC0 to SC6, respectively.

The logical operation circuit 141 performs a logical operation using values (at the H-level/L-level) of the latch circuits LC0 to LC6, and transmits operation results to the data register 150.

<1-2> Operation

<1-2-1> Outline of Read Operation

Next, an outline of a read operation of the memory chip 100 according to the present embodiment will be described. A read operation of the memory chip 100 according to the present embodiment is performed by causing a current to flow between the bit line BL and the source line SL, selecting the memory cell MC which is a read target, and thereafter sensing a voltage of the bit line BL.

Figure 11:
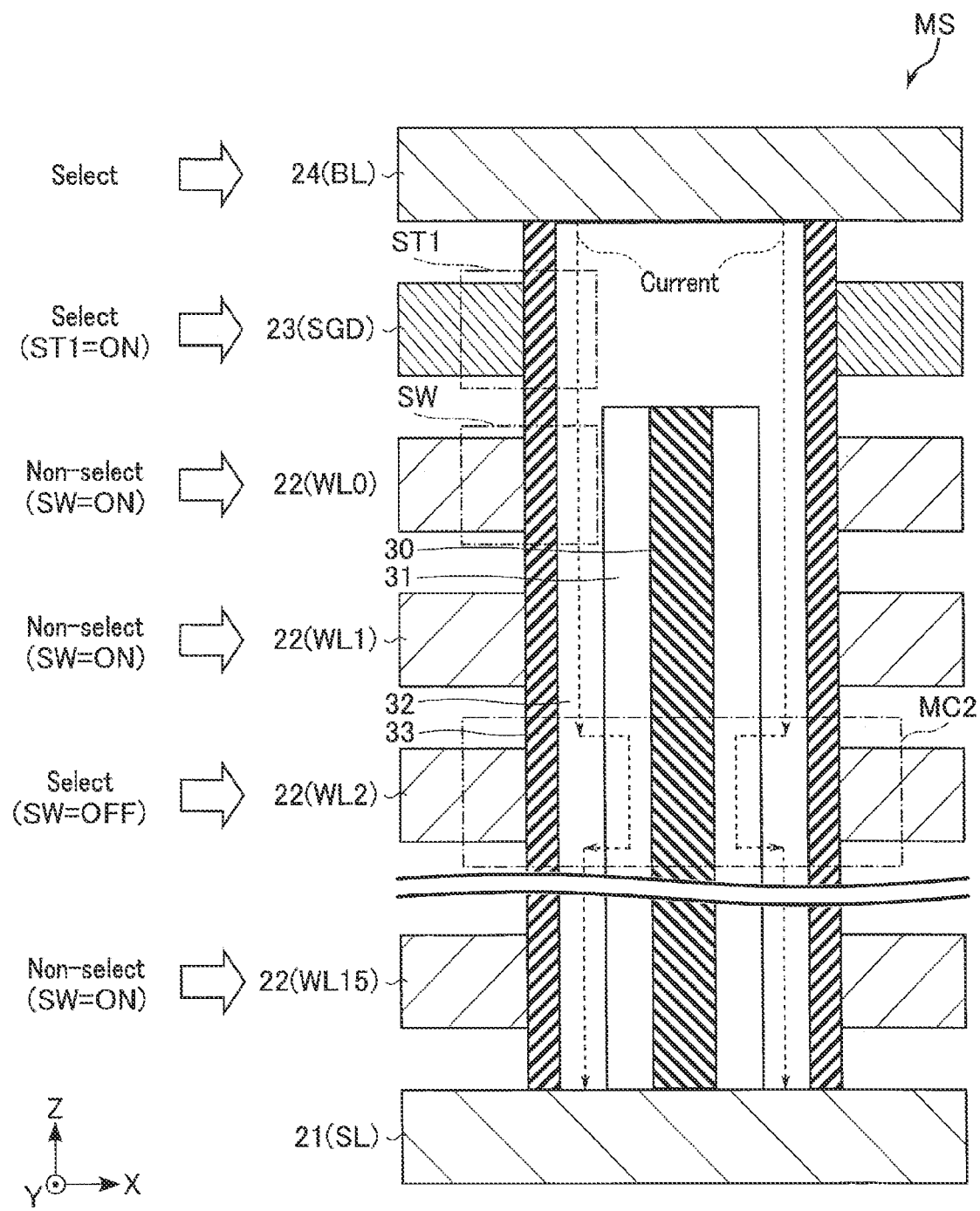
FIG. 11 is a cross-sectional view of one memory cell string within the memory cell array included in the memory chip according to the first embodiment.

First, the method of selecting the memory cell MC which is a read target will be briefly described with reference to FIGS. 10 and 11. FIG. 10 is a circuit diagram of one memory cell string MS within the memory cell array 110 included in the memory chip 100 according to the present embodiment. FIG. 11 is a cross-sectional view of one memory cell string MS within the memory cell array 110 included in the memory chip 100 according to the present embodiment. Hereinafter, a case in which a memory cell MC2 is selected in a read operation will be described as an example.

As shown in FIG. 10, the sequencer 180 turns the select transistor ST1 on. The sequencer 180 then turns off the selector SW of the memory cell MC2 which is a read target (hereinafter, referred to as a "selected memory cell"). Furthermore, the sequencer 180 turns on the selectors SW of the non-selected memory cells MC0, MC1, and MC3 to MC15. This causes a current to flow from the bit line BL to the source line SL through the select transistor ST1, the selectors SW of the non-selected memory cells MC0 and MC1, the memory element MR of the selected memory cell MC2, and the selectors SW of the non-selected memory cells MC3 to MC15.

As shown in FIG. 11, the sequencer 180 applies an H-level voltage (predetermined voltage (positive voltage)) to the select gate line SGD of the select transistor ST1 in contact with the memory pillar MP to which the selected memory cell MC2 belongs. Accordingly, an inversion layer is formed in the semiconductor layer 32 of the select transistor ST1, thereby allowing a current to flow through the select transistor ST1 (on state). This causes the bit line BL, the select transistor ST1, and the semiconductor layer 32 of the memory pillar MP that is in contact with the select transistor ST1 to be brought into conduction. Furthermore, the sequencer 180 applies an L-level voltage (for example, 0 [V]) to the word line WL2 corresponding to the selected memory cell MC2 in such a manner as to prevent formation of an inversion layer in the semiconductor layer 32. The sequencer 180 applies an H-level voltage to the word lines WL0, WL1, and WL3 to WL15 respectively corresponding to the non-selected memory cells MC0, MC1, and MC3 to MC15 in such a manner as to form an inversion layer in the semiconductor layer 32. Accordingly, a current path between the bit line BL and the source line SL extends through the memory element MR in the selected memory cell MC2, and extends through semiconductor layers 32 of the selectors SW in the non-selected memory cells MC0, MC1, and MC3 to MC15. Since the core member 30, which is an insulating layer, is provided at a central portion of the memory pillar MP, as shown in FIG. 11, a current flows through the variable resistance layer 31 that surrounds the core member 30 in the selected memory cell MC2. In this manner, the memory element MR of the memory cell MC2 can be selected at the time of a read operation.

<1-2-2> Sense Operation

Figure 12:
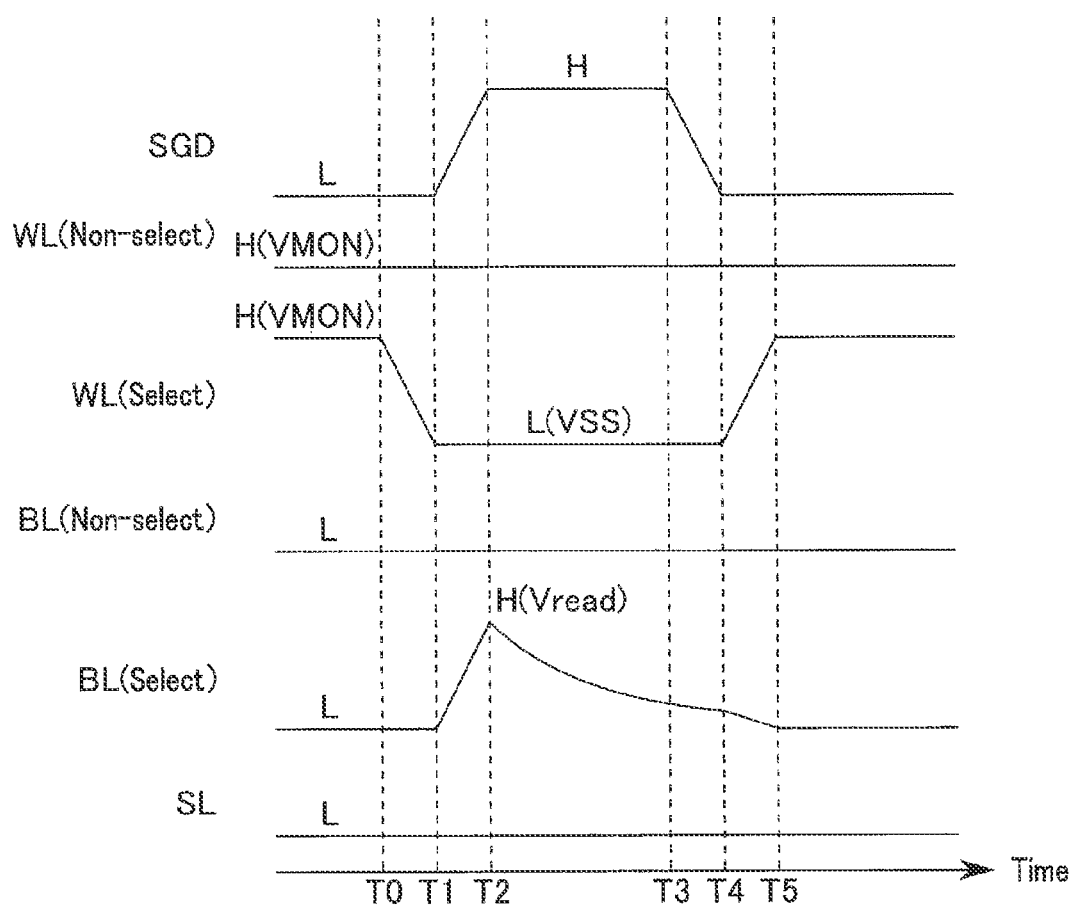
FIG. 12 is a timing chart of various signals during a sense operation of the memory chip according to the first embodiment.

Next, a method of sensing a voltage of the bit line BL will be described with reference to FIG. 12. FIG. 12 is a timing chart of various signals during a sense operation of the memory chip 100 according to the present embodiment.

As shown in FIG. 12, at time T0, the sequencer 180 maintains a voltage of the select gate line SGD, a voltage of the bit line BL, and a voltage of the source line SL at the L level, maintains a voltage of the non-selected word line WL at the H level (VMON), and drops a voltage of the selected word line WL from the H level (VMON) to the L level (VSS). The voltage VSS is a voltage that turns off the selector SW of the memory cell MC or the select transistor ST1. In other words, the voltage VSS is a voltage that enables transmission of a voltage of the bit line BL to be stopped. The voltage VMON is a voltage that enables a channel to be formed in the selector SW of the memory cell MC or the semiconductor layer of the select transistor ST1. The voltage VSS is, for example, 0 [V], and the voltage VMON is, for example, 2 [V].

During a period from the time T1 to the time T4, the sequencer 180 sets a voltage of the selected word line WL to the L level. Accordingly, during the period from the time T1 to the time T4, among the memory cells MC within the selected memory cell string MS, the selector SW of the non-selected memory cell MC is turned on whereas the selector SW of the selected memory cell MC is turned off. At the time T1, the sequencer 180 raises a voltage of the select gate line SGD from the L level to the H level, and raises a voltage of the selected bit line BL from the L level to the H level (read voltage Vread). The voltage Vread is, for example, 0.3 [V].

During a period from the time T2 to the time T3, the sequencer 180 sets a voltage of the select gate line SGD to the H level. This turns on the select transistor ST1, thereby electrically coupling the bit line BL and the memory cell string MS to each other.

At the time T2, the sequencer 180 applies the read voltage Vread to the selected bit line BL, and thereafter electrically decouples the sense amplifier 140 and the selected bit line BL from each other. Accordingly, during the period from the time T2 to the time T3, a voltage of the selected bit line BL drops (attenuates) in accordance with a resistance state of the memory element MR of the selected memory cell MC. After a certain period of time has elapsed from the application of the read voltage Vread to the selected bit line BL, the sequencer 180 electrically couples the operational amplifier OA in the sense amplifier 140 to the selected bit line BL, and the sense amplifier 140 senses, as a sense operation, a voltage of the selected bit line BL. The sense amplifier 140 transmits a sense result to the data register 150.

At the time T3, the sequencer 180 drops a voltage of the select gate line SGD from the H level to the L level. Accordingly, the select transistor ST1 is turned off. During a period after the time T4, the sequencer 180 sets a voltage of the select gate line SGD to the L level.

At the time T4, the sequencer 180 raises a voltage of the select word line WL from the L level (VSS) to the H level (VMON), and sets a voltage of the selected bit line BL to the L level.

During a period after the time T5, the sequencer 180 sets a voltage of the selected word line WL to the H level (VMON). Accordingly, the selectors SW of all memory cells MC are turned on. During the period after the time T5, the sequencer 180 sets a voltage of the selected bit line BL to the L level.

<1-2-3> Operation of Sense Amplifier Module SA

Next, an operation of the sense amplifier module SA within the sense amplifier 140 included in the memory chip 100 according to the present embodiment will be described with reference to FIGS. 13 and 14.

Figure 13:
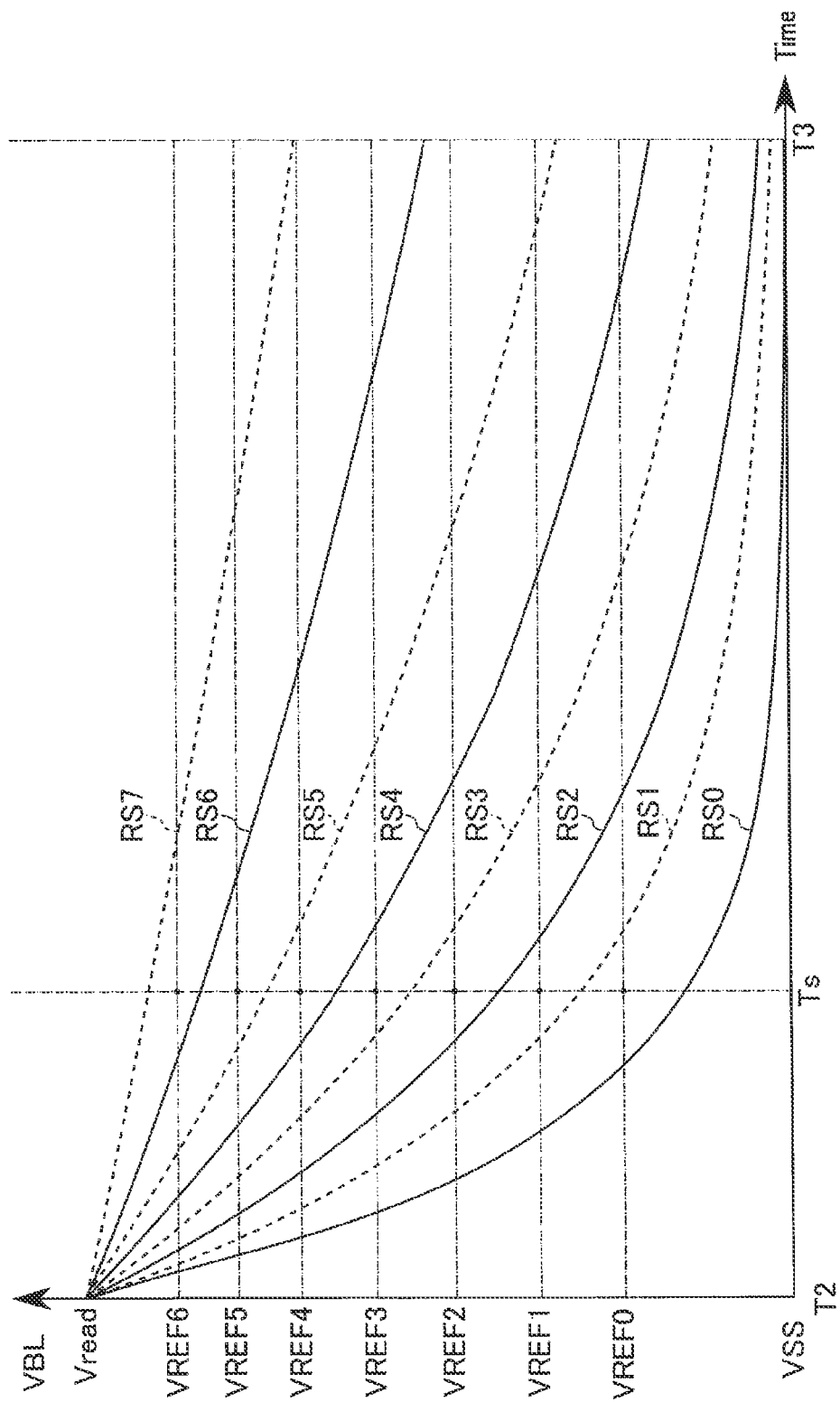
FIG. 13 is a view showing a relationship between a voltage of a bit line and a time period after a read voltage is applied to a selected bit line in the memory chip according to the first embodiment.

FIG. 13 is a view showing a relationship between a voltage of the selected bit line BL and a time period after the read voltage Vread is applied to the selected bit line BL in the memory chip 100 according to the present embodiment. In FIG. 13, the vertical axis represents a voltage VBL of the bit line BL, and the horizontal axis represents an elapsed time period after the voltage Vread is applied to the bit line BL. The times T2 to T3 of the horizontal axis correspond to the times T2 to T3 shown in FIG. 12.

As shown in FIG. 13, at the time T2, the sequencer 180 applies the read voltage Vread to the selected bit line BL, and thereafter electrically decouples the sense amplifier 140 and the selected bit line BL from each other. Accordingly, a voltage of the bit line BL attenuates in accordance with resistance states RS0 to RS7. Hereinafter, voltages of the bit line BL, which correspond to the resistance states RS0 to RS7, will be respectively referred to as voltages VBL(RS0) to VBL(RS7). As described above, among the resistance states RS0 to RS7, the resistance state RS0 is the lowest resistance state while the resistance state RS7 is the highest resistance state. Therefore, a voltage of the bit line BL attenuates at the lowest speed in the case of the resistance state RS0 and attenuates at the highest speed in the case of the resistance state RS7. Accordingly, after the time T2, the magnitude relationship of the voltages VBL(RS0) to VBL (RS7) at the same time is expressed as VBL(RS0)<VBL (RS1)<VBL(RS2)<VBL(RS3)<VBL(RS4)<VBL(RS5) <VBL(RS6)<VBL(RS7)<Vread. The operational amplifiers OA0 to OA6 within the sense amplifier module SA sense an attenuated voltage at, e.g., time Ts.

Reference voltages VREF0 to VREF6 and the time Ts are set in such a manner as to secure a sufficient margin for a voltage difference and a time period to the extent that, for example, the sense amplifier 140 can discriminate (avoid misrecognition) between the resistance states RS0 to RS7. These values can be determined by, for example, actual measurement and simulations.

More specifically, the time Ts is set between the times T2 and T3.

Furthermore, the reference voltage VREF0 is set between VBL(RS0) and VBL(RS1) at the time Ts. The reference voltage VREF1 is set between VBL(RS1) and VBL(RS2) at the time Ts. The reference voltage VREF2 is set between VBL(RS2) and VBL(RS3) at the time Ts. The reference voltage VREF3 is set between VBL(RS3) and VBL(RS4) at the time Ts. The reference voltage VREF4 is set between VBL(RS4) and VBL(RS5) at the time Ts. The reference voltage VREF5 is set between VBL(RS5) and VBL(RS6) at the time Ts. The reference voltage VREF6 is set between VBL(RS6) and VBL(RS7) at the time Ts. The magnitude relationship of the reference voltages VREF0 to VREF6 is expressed as VSS<VREF0<VREF1<VREF2<VREF3<VREF4< VREF5<VREF6<Vread.

FIG. 14 is a flowchart showing an example of a sense operation of the sense amplifier module SA included in the memory chip 100 according to the present embodiment.

Hereinafter, "sense timing" means the time Ts at which the operational amplifier OA performs sensing, and the present embodiment assumes one sense timing. Furthermore, "the number of sensings" means the number of times the operational amplifier OA performs sensing, and the total number of sensings of the operational amplifiers OA0 to OA6 is seven in the present embodiment.

As shown in FIG. 14, after the read voltage Vread is applied to the selected bit line BL at the time T2, the sequencer 180 determines whether or not a current time corresponds to the sense timing (time Ts) (step S10). A period from the time T2 to the time Ts is, for example, 0.75 [μs]. In the case where the current time corresponds to the time Ts (Yes in step S10), each of the operational amplifiers OA0 to OA6 senses the voltage VBL of the bit line BL (step S11). More specifically, the operational amplifiers OA0 to OA6 respectively compare the voltage VBL with the reference voltages VREF0 to VREF6, and respectively output comparison results as VOUT0 to VOUT6. For example, the voltage VREF0 is 0.07 [V], the voltage VREF1 is 0.11 [V], the voltage VREF2 is 0.145 [V], the voltage VREF3 is 0.18 [V], the voltage VREF4 is 0.21 [V], the voltage VREF5 is 0.24 [V], and the voltage VREF6 is 0.265 [V]. On the other hand, in the case where the current time does not correspond to the time Ts (No in step S10), the sequencer 180 performs step S10 mentioned in the above.

Next, the voltage detection circuits SC0 to SC6 respectively detect whether or not the voltages VOUT0 to VOUT6 respectively supplied from the operational amplifiers OA0 to OA6 are at the L level (step S12). Subsequently, the voltage detection circuits SC0 to SC6 respectively transmit detection results to the latch circuits LC0 to LC6 (step S13). More specifically, in the case of the voltage VOUT0 being at the L level, the voltage detection circuit SC0 transmits a signal at the L level to the latch circuit LC0, and the latch circuit LC0 stores the signal at the L level. On the other hand, in the case of the voltage VOUT0 being at the H level, the voltage detection circuit SC0 transmits a signal at the H level to the latch circuit LC0, and the latch circuit LC0 stores the signal at the H level. In the case of the voltages VOUT1 to VOUT6 being at the "L level/H level", the voltage detection circuits SC1 to SC6 operate in a similar manner.

Next, the logical operation circuit 141 performs a logical operation using values of the latch circuits LC0 to LC6 (step S14), and outputs operation results (step S15).

More specifically, for example, in the case where values of the latch circuits LC0 to LC6 are at the L level, the logical operation circuit 141 transmits the value "000" indicative of the resistance state RS0 to the data register 150. In the case where a value of the latch circuit LC0 is at the H level and values of the latch circuits LC1 to LC6 are at the L level, the logical operation circuit 141 transmits the value "001" indicative of the resistance state RS1 to the data register 150. In the case where values of the latch circuits LC0 and LC1 are at the H level and values of the latch circuits LC2 to LC6 are at the L level, the logical operation circuit 141 transmits the value "010" indicative of the resistance state RS2 to the data register 150. In the case where values of the latch circuits LC0 to LC2 are at the H level and values of the latch circuits LC3 to LC6 are at the L level, the logical operation circuit 141 transmits the value "011" indicative of the resistance state RS3 to the data register 150. In the case where values of the latch circuits LC0 to LC3 are at the H level and values of the latch circuits LC4 to LC6 are at the L level, the logical operation circuit 141 transmits the value "100" indicative of the resistance state RS4 to the data register 150. In the case where values of the latch circuits LC0 to LC4 are at the H level and values of the latch circuits LC5 and LC6 are at the L level, the logical operation circuit 141 transmits the value "101" indicative of the resistance state RS5 to the data register 150. In the case where values of the latch circuits LC0 to LC5 are at the H level and a value of the latch circuit LC6 is at the L level, the logical operation circuit 141 transmits the value "110" indicative of the resistance state RS6 to the data register 150. In the case where values of the latch circuits LC0 to LC6 are at the H level, the logical operation circuit 141 transmits the value "111" indicative of the resistance state RS7 to the data register 150.

<1-3> Effects

The memory chip 100 according to the present embodiment includes, in the sense amplifier module SA, the plurality of operational amplifiers OA, the plurality of voltage detection circuits SC, and the plurality of latch circuits LC. Different reference voltages VREF are respectively applicable to the operational amplifiers OA. By each of the operational amplifiers OA performing sensing one time at the same sense timing, the resistance state (one of RS0 to RS7) of the memory element MR of the selected memory cell MC can be determined.

With the configuration according to the present embodiment, data can be sensed using the plurality of operational amplifiers OA corresponding to the plurality of reference voltages, thereby realizing an improved processing capacity of the memory device.

<1-4> Modification

The memory chip 100 according to a modification of the first embodiment will be described with reference to FIGS. 15 to 18. The memory chip 100 according to the present modification differs from the memory chip 100 according to the first embodiment in that each of the memory cell strings MS within the memory cell array 110 includes a select transistor ST2 coupled in parallel to the memory element MR.

<1-4-1> Circuit Configuration of Memory Cell Array 110

Figure 15:
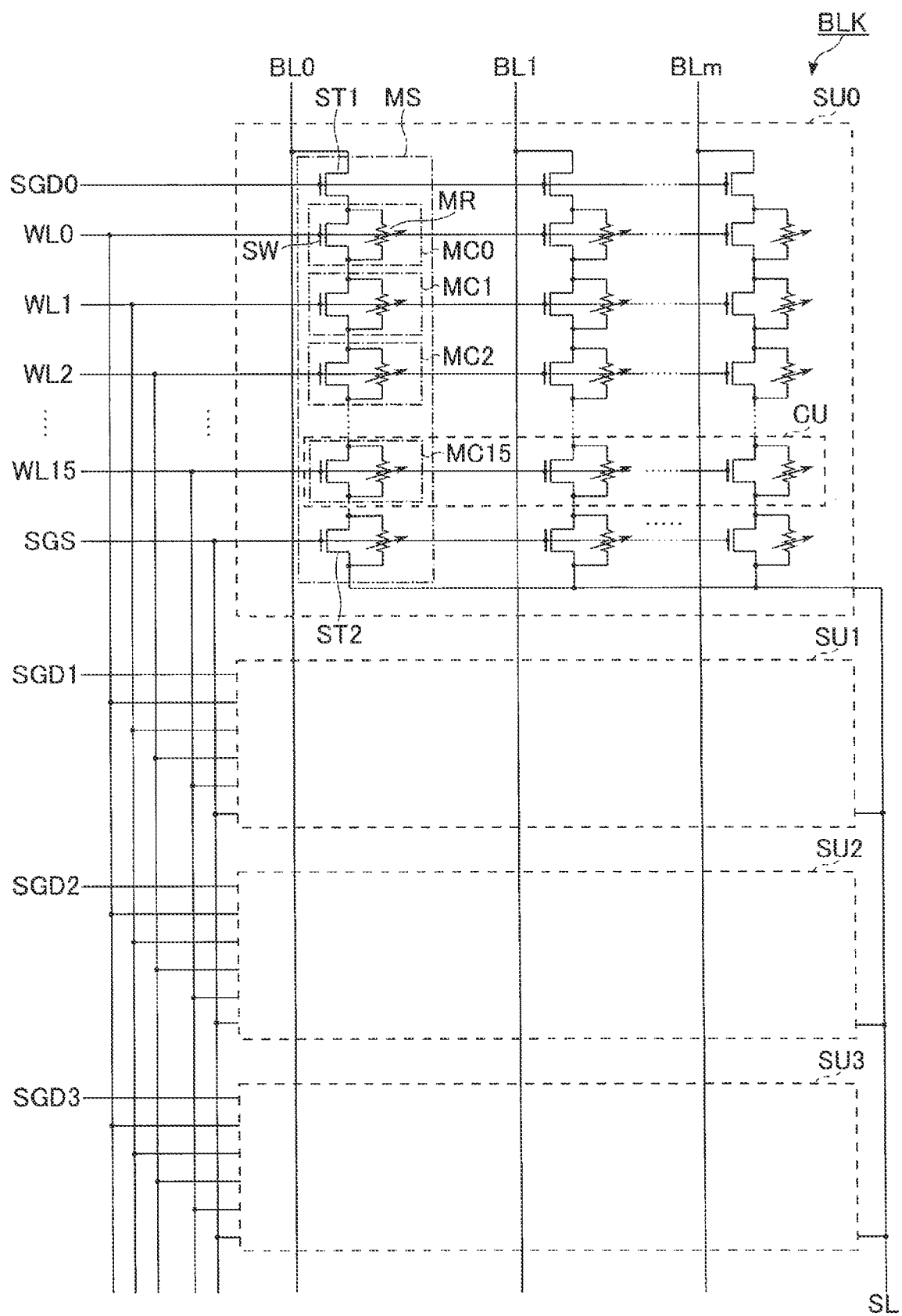
FIG. 15 is a circuit diagram of a memory cell array included in a memory chip according to a modification of the first embodiment.

FIG. 15 shows an example of a circuit configuration of the memory cell array 110 included in the memory chip 100 according to the present modification by extracting one of the blocks BLK included in the memory cell array 110.

As shown in FIG. 15, each of the memory cell strings MS includes, for example, the select transistor ST2 coupled in parallel to the memory element MR in addition to the 16 memory cells MC (MC0 to MC15) and the select transistor ST1, as compared with the circuit shown in FIG. 2. The configuration in which the select transistor ST2 and the memory element MR are coupled in parallel to each other may be the same as the configuration of the memory cell MC.

The memory cells MC0 to MC15 included in each of the memory cell strings MS are coupled in series between the select transistor ST1 and the select transistor ST2 (and the memory element MR coupled in parallel to the select transistor ST2). The memory element MR that is coupled in parallel to the select transistor ST1 may be provided. In such a case, the configuration in which the select transistor ST1 and the memory element MR are coupled in parallel to each other may be the same as the configuration of the memory cell MC.

Gates of the select transistors ST2 in each of the blocks BLK are commonly coupled to the select gate line SGS. The select gate line SGS may be provided for each string unit SU.

Drains of the select transistors ST2 are respectively coupled to sources of the memory cells MC15 within the memory cell strings MS, and sources of the select transistors ST2 are commonly coupled to the source line SL. Similarly, one ends of the memory elements MR coupled in parallel to the select transistors ST2 are respectively coupled to sources of the memory cells MC15, and the other ends of the memory elements MR are commonly coupled to the source line SL.

Each of the select gate lines SGD and SGS and each of the word lines WL are independently controlled by the row decoder 120.

<1-4-2> Structure of Memory Cell Array 110

Figure 16:
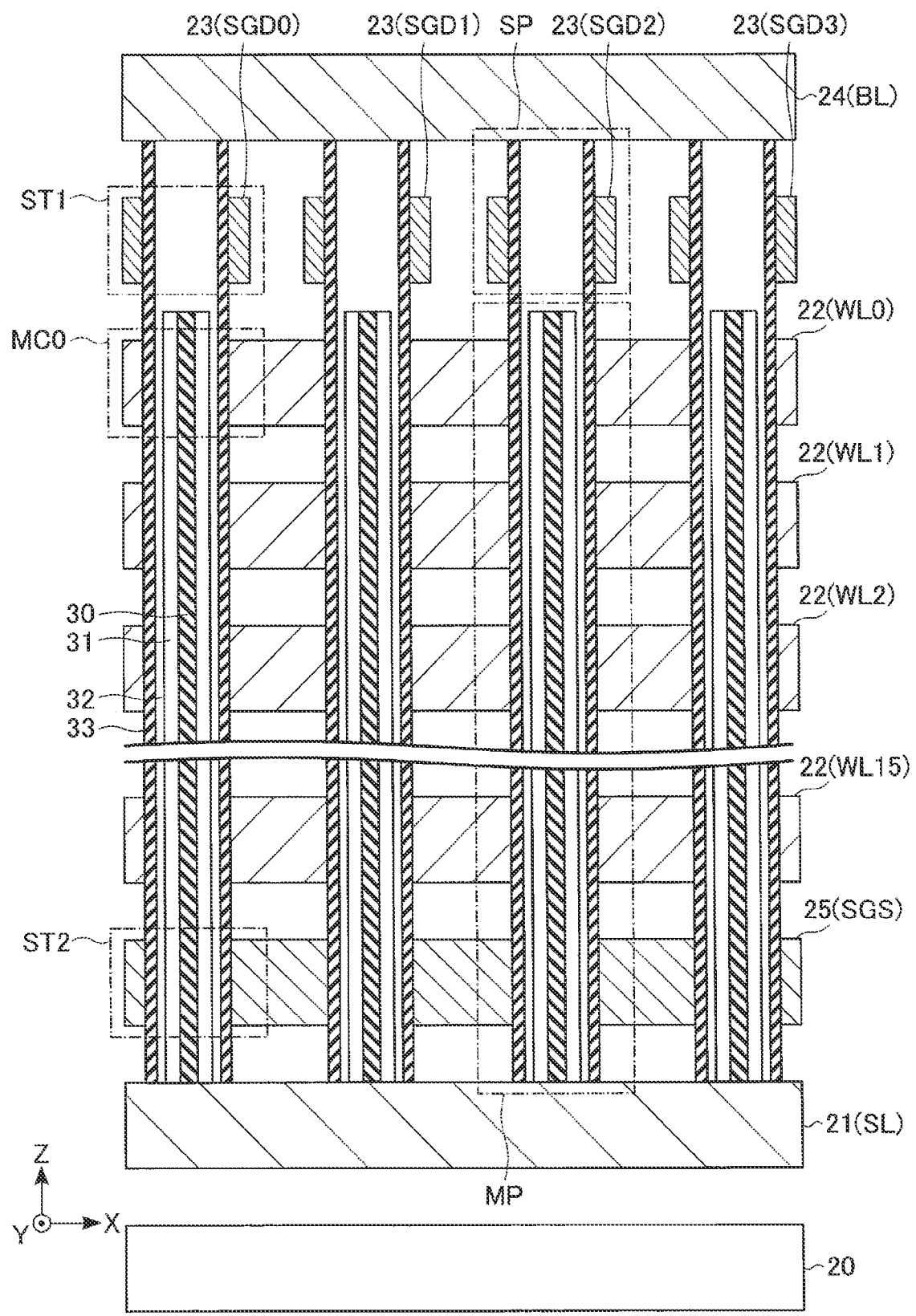
FIG. 16 is a cross-sectional view of the memory cell array included in the memory chip according to the modification of the first embodiment.

FIG. 16 shows an example of a cross-sectional structure of the memory cell array 110 included in the memory chip 100 according to the present modification.

As shown in FIG. 16, the memory cell array 110 includes, for example, a conductive layer 25 in addition to the conductive layers 21 to 24, as compared with the structure shown in FIG. 5. The conductive layer 25 is formed between the conductive layer 21 functioning as the source line SL and the lowermost conductive layer 22 (WL15).

More specifically, the conductive layer (voltage application electrode) 25 is provided above the conductive layer 21 in the Z direction with an insulating layer (not shown) intervening therebetween. The conductive layer 25 is formed, for example, in a plate-like shape extending in the XY plane, and is used as the select gate line SGS. The conductive layer 25 includes, for example, tungsten (W).

The lowermost conductive layer 22 (WL15) is provided above the conductive layer 25 in the Z direction with an insulating layer (not shown) intervening therebetween.

The memory pillar MP is, for example, in a pillar shape extending in the Z direction, penetrates the conductive layers 22, insulating layers (not shown), and the conductive layer 25, and has its bottom portion reaching the conductive layer 21.

The select transistor ST2 includes the conductive layer 25, the core member 30, the variable resistance layer 31, the semiconductor layer 32, and the insulating layer 33. By turning the select transistor ST2 on, an inversion layer is formed in the semiconductor layer 32, thereby allowing a current to flow through the inversion layer.

The structure above the lowermost conductive layer 22 (WL15) is similar to the structure shown in FIG. 5.

<1-4-3> Outline of Read Operation

Next, an outline of a read operation of the memory chip 100 according to the present modification will be described. As with the first embodiment, a read operation of the memory chip 100 according to the present modification is performed by causing a current to flow between the bit line BL and the source line SL, selecting the memory cell MC which is a read target, and thereafter sensing a voltage of the bit line BL.

First, a method of selecting the memory cell MC which is a read target will be briefly described with reference to FIG. 17. FIG. 17 is a circuit diagram of one memory cell string MS within the memory cell array 110 included in the memory chip 100 according to the present modification. Hereinafter, a case in which a memory cell MC2 is selected in a read operation will be described as an example.

As shown in FIG. 17, the sequencer 180 turns on the select transistors ST1 and ST2. The sequencer 180 then turns off the selector SW of the selected memory cell MC2. Furthermore, the sequencer 180 turns on the selectors SW of the non-selected memory cells MC0, MC1, and MC3 to MC15. This causes a current to flow from the bit line BL to the source line SL through the select transistor ST1, the selectors SW of the non-selected memory cells MC0 and MC1, the memory element MR of the selected memory cell MC2, the selectors SW of the non-selected memory cells MC3 to MC15, and the select transistor ST2.

<1-4-4> Sense Operation

Figure 18:
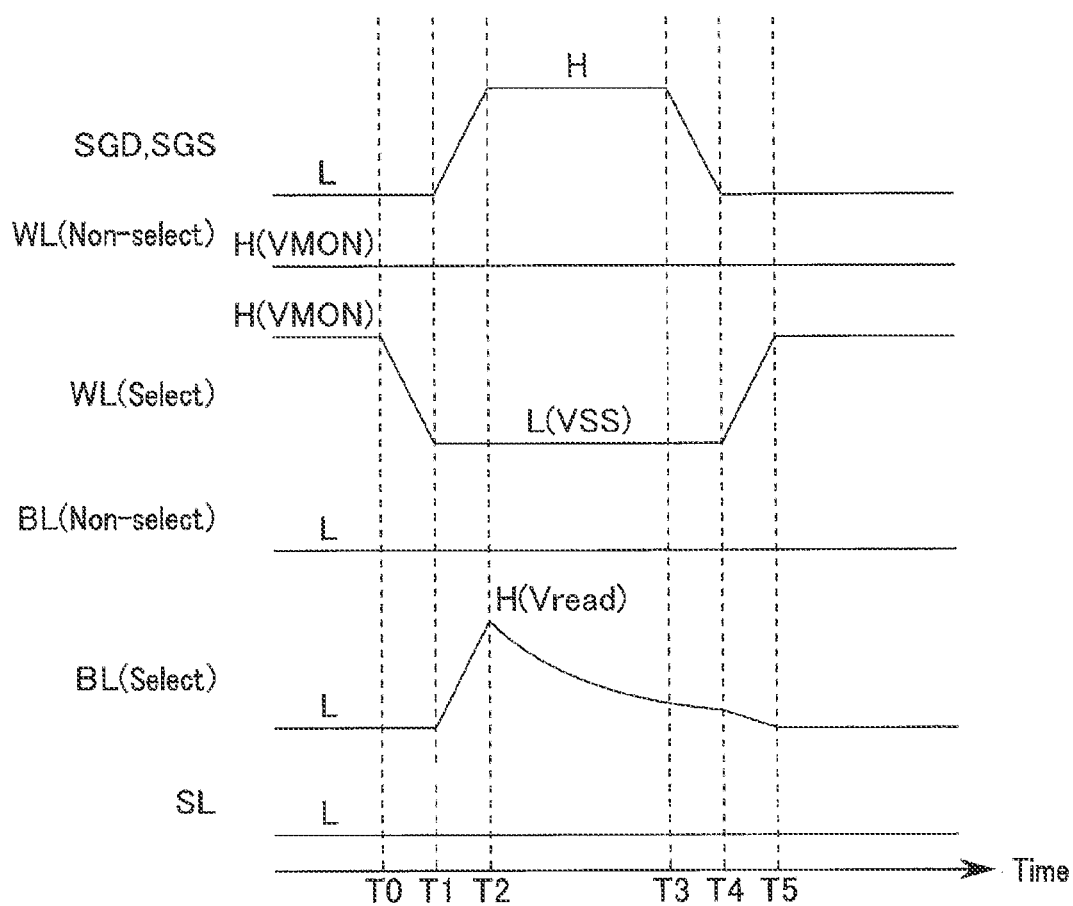
FIG. 18 is a timing chart of various signals during a sense operation of the memory chip according to the modification of the first embodiment.

Next, a method of sensing a voltage of the bit line BL will be described with reference to FIG. 18. FIG. 18 is a timing chart of various signals during a sense operation of the memory chip 100 according to the present modification.

As shown in FIG. 18, at the time T0, the sequencer 180 maintains voltages of the select gate lines SGD and SGS, a voltage of the bit line BL, and a voltage of the source line SL at the L level, maintains a voltage of the non-selected word line WL at the H level (VMON), and drops a voltage of the selected word line WL from the H level (VMON) to the L level (VSS).

During a period from the time T1 to the time T4, the sequencer 180 sets a voltage of the selected word line WL to the L level. Accordingly, during the period from the time T1 to the time T4, among the memory cells MC within the selected memory cell string MS, the selector SW of the non-selected memory cell MC is turned on whereas the selector SW of the selected memory cell MC is turned off. At the time T1, the sequencer 180 raises voltages of the select gate lines SGD and SGS from the L level to the H level, and raises a voltage of the selected bit line BL from the L level to the H level (read voltage Vread).

During a period from the time T2 to the time T3, the sequencer 180 sets voltages of the selection gate lines SGD and SGS to the H level. This turns on the select transistors ST1 and ST2, thereby electrically coupling the bit line BL and the memory cell string MS to each other.

At the time T2, the sequencer 180 applies the read voltage Vread to the selected bit line BL, and thereafter electrically decouples the sense amplifier 140 and the selected bit line BL from each other. Accordingly, during the period from the time T2 to the time T3, a voltage of the selected bit line BL drops (attenuates) in accordance with a resistance state of the memory element MR of the selected memory cell MC. After a certain period of time has elapsed from the application of the read voltage Vread to the selected bit line BL, the sequencer 180 electrically couples the operational amplifier OA in the sense amplifier 140 to the selected bit line BL, and the sense amplifier 140 senses, as a sense operation, a voltage of the selected bit line BL. The sense amplifier 140 transmits a sense result to the data register 150.

At the time T3, the sequencer 180 drops voltages of the select gate line SGD and SGS from the H level to the L level. Accordingly, the select transistor ST1 and ST2 are turned off. During a period after the time T4, the sequencer 180 sets voltages of the select gate lines SGD and SGS to the L level.

At the time T4, the sequencer 180 raises a voltage of the select word line WL from the L level (VSS) to the H level (VMON), and sets a voltage of the selected bit line BL to the L level.

During a period after the time T5, the sequencer 180 sets a voltage of the selected word line WL to the H level (VMON). Accordingly, the selectors SW of all memory cells MC are turned on. During the period after the time T5, the sequencer 180 sets a voltage of the selected bit line BL to the L level.

<1-4-5> Effects

As with the first embodiment, the configuration according to the present modification can improve a processing capacity of the memory device.

<2> Second Embodiment

The memory chip 100 according to a second embodiment will be described. Unlike the first embodiment, the memory chip 100 according to the present embodiment includes, in the sense amplifier module SA, one operational amplifier OA, one voltage detection circuit SC, and one latch circuit LC. The following description will in principle concentrate on the features different from the first embodiment.

<2-1> Configuration of Sense Amplifier Module SA

Figure 19:
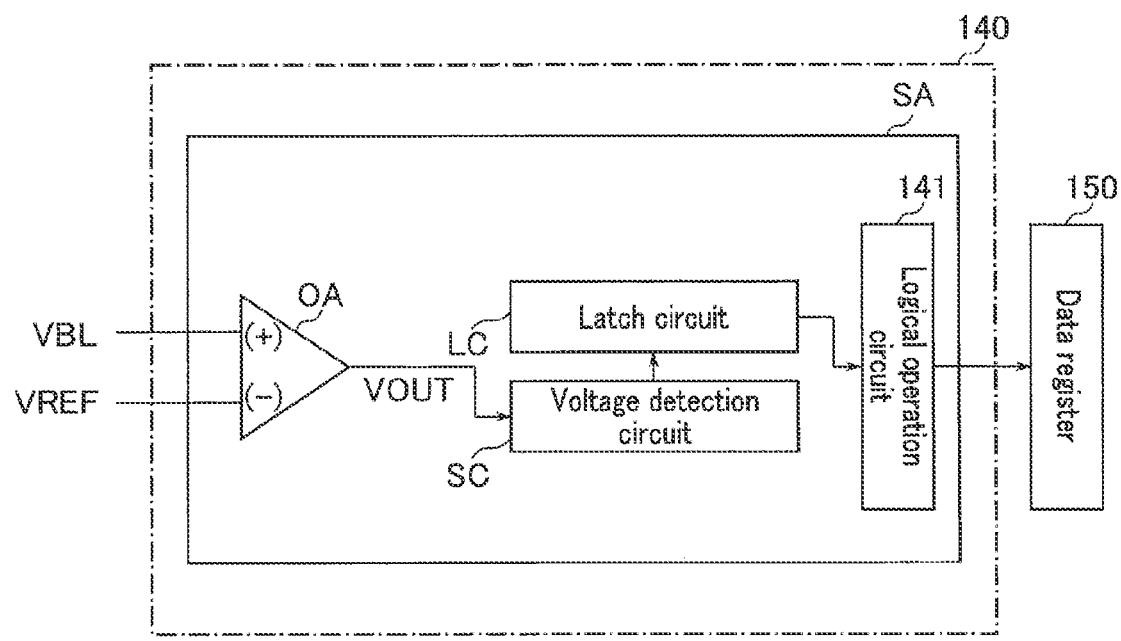
FIG. 19 is a block diagram showing a configuration of a sense amplifier module within a sense amplifier included in a memory chip according to a second embodiment.

First, the, details of a configuration of the sense amplifier module SA within the sense amplifier 140 included in the memory chip 100 according to the present embodiment will be described with reference to FIG. 19. FIG. 19 is a block diagram showing an example of a configuration of the sense amplifier module SA included in the memory chip 100 according to the present embodiment. FIG. 19 omits constituent elements such as a function block, interconnect, etc., for transmitting write data DAT from the data register 150 to the bit line BL.

The sense amplifier module SA includes the operational amplifier OA, the voltage detection circuit SC, the latch circuit LC, and the logical operation circuit 141. The operational amplifier OA, the voltage detection circuit SC, the latch circuit LC, and the logical operation circuit 141 are the same as those in the first embodiment shown in FIG. 9.

<2-2> Operation of Sense Amplifier Module SA

Next, an operation of the sense amplifier module SA within the sense amplifier 140 included in the memory chip 100 according to the present embodiment will be described with reference to FIGS. 20 and 21.

FIG. 20 is a view showing a relationship between a voltage of the selected bit line BL and a time period after the read voltage Vread is applied to the selected bit line BL in the memory chip 100 according to the present embodiment. In FIG. 20, the vertical axis represents a voltage VBL of the bit line BL, and the horizontal axis represents an elapsed time period after the voltage Vread is applied to the bit line BL. The time T2 to the time T3 of the horizontal axis correspond to the time T2 to the time T3 in the first embodiment shown in FIG. 12.

In the present embodiment, one memory cell MC can store three-bit data. In order to determine octal data using one reference voltage, seven sense timings are set. Accordingly, the operational amplifier OA performs sensing seven times at the maximum by using one reference voltage. Meanwhile, in the case where one memory cell MC can store two-bit data, three sense timings are set. In that case, the operational amplifier OA performs sensing three times at the maximum. Furthermore, in the case where one memory cell MC can store four-bit data, 15 sense timings are set. In that case, the operational amplifier OA performs sensing 15 times at the maximum.

Figure 21:
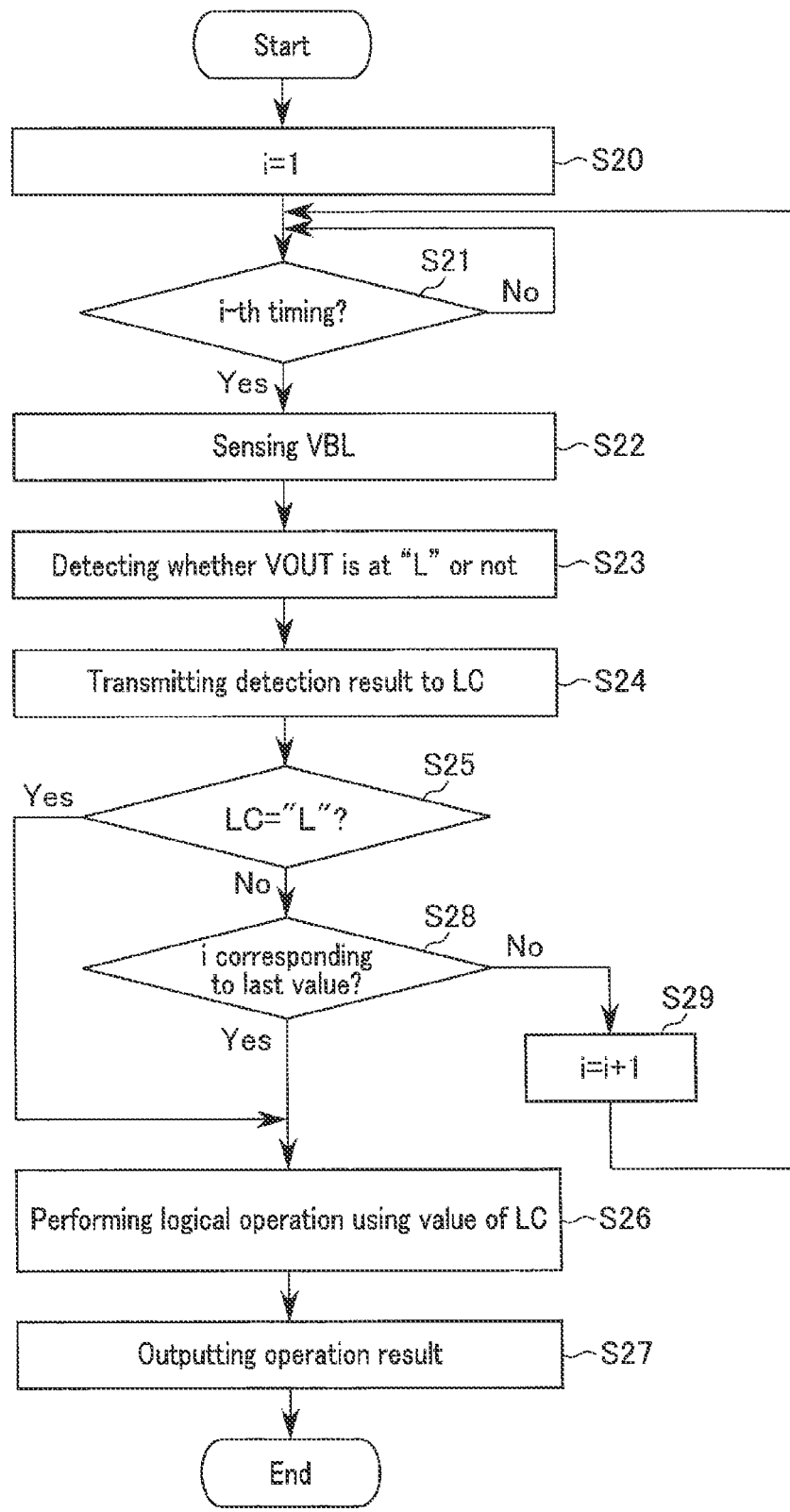
FIG. 21 is a flowchart showing a sense operation of the sense amplifier module included in the memory chip according to the second embodiment.

FIG. 21 is a flowchart showing an example of a sense operation of the sense amplifier module SA included in the memory chip 100 according to the present embodiment. In FIG. 21, the number of sensings by the operational amplifier OA is represented by i (where i is a natural number equal to or greater than 1 and equal to or less than 7). The number i is incremented by, for example, the sequencer 180. The upper limit of i depends on the number of bits that one memory cell MC can store. For example, the upper limit of i is seven in the case where one memory cell MC can store three bits. The upper limit of i is three in the case where one memory cell MC can store two bits. The upper limit of i is 15 in the case where one memory cell MC can store four bits.

As shown in FIG. 20, the operational amplifier OA senses an attenuated voltage from, e.g., the time Ts0 to the time Ts6.

As with the first embodiment, the reference voltage VREF and the times Ts0 to Ts6 are set in such a manner as to secure a sufficient margin for a voltage difference and a time period to the extent that, for example, the sense amplifier 140 can discriminate between the resistance states RS0 to RS7.

More specifically, the reference voltage VREF is set between the voltage VSS and the voltage Vread.

Furthermore, the time Ts0 is set between a time at which VBL(RS0) becomes equal to the reference voltage VREF and a time at which VBL(RS1) becomes equal to the reference voltage VREF. The time Ts1 is set between a time at which VBL(RS1) becomes equal to the reference voltage VREF and a time at which VBL(RS2) becomes equal to the reference voltage VREF. The time Ts2 is set between a time at which VBL(RS2) becomes equal to the reference voltage VREF and a time at which VBL(RS3) becomes equal to the reference voltage VREF. The time Ts3 is set between a time at which VBL(RS3) becomes equal to the reference voltage VREF and a time at which VBL(RS4) becomes equal to the reference voltage VREF. The time Ts4 is set between a time at which VBL(RS4) becomes equal to the reference voltage VREF and a time at which VBL(RS5) becomes equal to the reference voltage VREF. The time Ts5 is set between a time at which VBL(RS5) becomes equal to the reference voltage VREF and a time at which VBL(RS6) becomes equal to the reference voltage VREF. The time Ts6 is set between a time at which VBL(RS6) becomes equal to the reference voltage VREF and a time at which VBL(RS7) becomes equal to the reference voltage VREF. The magnitude relationship of the times Ts0 to Ts6 is expressed as T2<Ts0<Ts1<Ts2<Ts3<Ts4<Ts5<Ts6<T3.

As shown in FIG. 21, after the read voltage Vread is applied to the selected bit line BL at the time T2, the sequencer 180 sets i=1 (step S20). Subsequently, the sequencer 180 determines whether or not a current time corresponds to the i-th sense timing (time Ts(i−1)) (step S21). For example, a period from the time T2 to the time Ts0 is 0.6 [μs], a period from the time T2 to the time Ts1 is 0.8 [μs], a period from the time T2 to the time Ts2 is 1.2 [μs], a period from the time T2 to the time Ts3 is 1.6 [μs], a period from the time T2 to the time Ts4 is 2.4 [μs], a period from the time T2 to the time Ts5 is 3.6 [μs], and a period from the time T2 to the time Ts6 is 6.5 [μs]. In the case where the current time corresponds to the time Ts(i−1) (Yes in step S21), the operational amplifier OA senses the voltage VBL of the bit line BL (step S22). More specifically, the operational amplifier OA compares the voltage VBL with the reference voltage VREF and outputs a comparison result as VOUT. The voltage VREF is, for example, 0.1 [V]. On the other hand, in the case where the current time does not correspond to the time Ts(i−1) (No in step S21), the sequencer 180 performs step S21 mentioned in the above.

Next, the voltage detection circuit SC detects whether or not the voltage VOUT supplied from the operational amplifier OA is at the L level (step S23). Subsequently, the voltage detection circuit SC transmits a detection result to the latch circuit LC (step S24). Details of steps S23 and S24 are the same as steps S12 and S13 in the first embodiment.

Next, the sequencer 180 determines whether or not a value of the latch circuit LC is at the L level (step S25). In the case where the value of the latch circuit LC is at the L level (Yes in step S25), the logical operation circuit 141 performs a logical operation using the value of the latch circuit LC (step S26), and outputs an operation result (step S27).

More specifically, for example, in the case where a sense result at the time Ts0 shows that the value of the latch circuit LC is at the L level, the logical operation circuit 141 transmits the value "000" indicative of the resistance state RS0 to the data register 150. In the case where a sense result at the time Ts1 shows that the value of the latch circuit LC is at the L level, the logical operation circuit 141 transmits the value "001" indicative of the resistance state RS1 to the data register 150. In the case where a sense result at the time Ts2 shows that the value of the latch circuit LC is at the L level, the logical operation circuit 141 transmits the value "010" indicative of the resistance state RS2 to the data register 150. In the case where a sense result at the time Ts3 shows that the value of the latch circuit LC is at the L level, the logical operation circuit 141 transmits the value "011" indicative of the resistance state RS3 to the data register 150. In the case where a sense result at the time Ts4 shows that the value of the latch circuit LC is at the L level, the logical operation circuit 141 transmits the value "100" indicative of the resistance state RS4 to the data register 150. In the case where a sense result at the time Ts5 shows that the value of the latch circuit LC is at the L level, the logical operation circuit 141 transmits the value "101" indicative of the resistance state RS5 to the data register 150. In the case where a (last) sense result at the time Ts6 shows that the value of the latch circuit LC is at the L level, the logical operation circuit 141 transmits the value "110" indicative of the resistance state RS6 to the data register 150.

On the other hand, in the case where the value of the latch circuit LC is not at the L level (No in step S25), the sequencer 180 determines whether or not i is the last value (i=7) (step S28). In the case where i is the last value (Yes in step S28), the logical operation circuit 141 performs a logical operation using the value of the latch circuit LC (step S26), and outputs an operation result (step S27). More specifically, for example, in the case where the sense result at the time Ts6 shows that the value of the latch circuit LC is at the H level, the logical operation circuit 141 transmits the value "111" indicative of the resistance state RS7 to the data register 150. On the other hand, in the case where i is not the last value (No in step S28), the sequencer 180 increments i to set i=i+1 (step S29), and performs step S21 mentioned in the above.

<2-3> Effects

The memory chip 100 according to the present embodiment includes, in the sense amplifier module SA, one operational amplifier OA, one voltage detection circuit SC, and one latch circuit LC, and the resistance state (one of RS0 to RS7) of the memory element MR of the selected memory cell MC can be determined by one operational amplifier OA performing sensing a plurality of times.

With the configuration according to the present embodiment, the number of operational amplifiers OA included in the sense amplifier module SA can be made smaller than the number of sensings. This suppresses an increase in the chip area. As a matter of course, the sense amplifier module SA according to the present embodiment is applicable to the memory chip 100 according to the modification of the first embodiment.

<3> Third Embodiment

The memory chip 100 according to a third embodiment will be described. Unlike the first embodiment, the memory chip 100 according to the present embodiment includes, in the sense amplifier module SA, two operational amplifiers OA, two voltage detection circuits SC, and two registers REG. The following description will in principle concentrate on the features different from the first embodiment and the second embodiment.

<3-1> Configuration of Sense Amplifier Module SA

Figure 22:
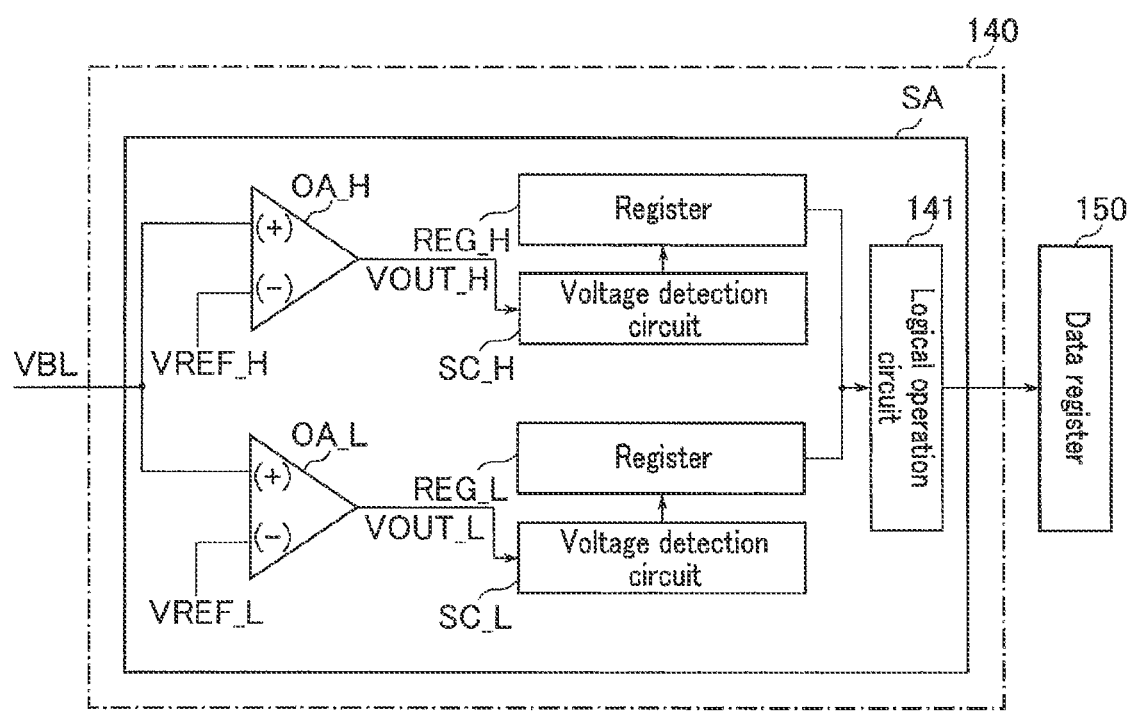
FIG. 22 is a block diagram showing a configuration of a sense amplifier module within a sense amplifier included in a memory chip according to a third embodiment.

First, details of a configuration of the sense amplifier module SA within the sense amplifier 140 included in the memory chip 100 according to the present embodiment will be described with reference to FIG. 22. FIG. 22 is a block diagram showing an example of a configuration of the sense amplifier module SA included in the memory chip 100 according to the present embodiment. FIG. 22 omits constituent elements such as a function block, interconnect, etc., for transmitting write data DAT from the data register 150 to the bit line BL.

The sense amplifier module SA includes operational amplifiers OA_L and OA_H, voltage detection circuits SC_L and SC_H, registers REG_L and REG_H, and the logical operation circuit 141. The register REG_L includes a plurality of latch circuits LC_L, and the register REG_H includes a plurality of latch circuits LC_H. The operational amplifiers OA_L and OA_H, the voltage detection circuits SC_L and SC_H, the latch circuits LC_L and LC_H, and the logical operation circuit 141 are the same as those in the first embodiment shown in FIG. 9.

<3-2> Operation of Sense Amplifier Module SA

Next, an operation of the sense amplifier module SA within the sense amplifier 140 included in the memory chip 100 according to the present embodiment will be described with reference to FIGS. 23 to 26.

FIG. 23 is a view showing a relationship between a voltage of the selected bit line BL and a time period after the read voltage Vread is applied to the selected bit line BL in the memory chip 100 according to the present embodiment. In FIG. 23, the vertical axis represents a voltage VBL of the bit line BL, and the horizontal axis represents an elapsed time period after the voltage Vread is applied to the bit line BL. The time T2 to the time T3 of the horizontal axis correspond to time T2 to time T3 in the first embodiment shown in FIG. 12.

In the present embodiment, one memory cell MC can store three-bit data. Sensing seven times, which corresponds to the aforementioned memory cell MC configured to store three-bit data, can be performed by the operational amplifier OA_L or the operational amplifier OA_H. In other words, the number of sensings (seven) can be freely allocated to the operational amplifier OA_L and the operational amplifier OA_H. Hereinafter, the case in which the number of sensings is divided in such a manner that four sensings are allocated to the operational amplifier OA_L and three sensings are allocated to the operational amplifier OA_H will be described. In this case, the operational amplifier OA_L performs sensing four times, and the operational amplifier OA_H performs sensing three times. The register REG_L includes the same number (four) of latch circuits LC_L to the number of sensings by the operational amplifier OA_L (hereinafter, referred to as "latch circuits LC_L0 to LC_L3"), and the register REG_H includes the same number (three) of latch circuits LC_H to the number of sensings by the operational amplifier OA_H (hereinafter, referred to as "latch circuits LC_H0 to LC_H2"). Hereinafter, the allocation of the number of sensings is not limited to the case in which four sensings are allocated to the operational amplifier OA_L and three sensings are allocated to the operational amplifier OA_H. In the case where one memory cell MC can store two-bit data, the number of sensings (three) can be freely allocated to the operational amplifier OA_L and the operational amplifier OA_H. Furthermore, in the case where one memory cell MC can store four-bit data, the number of sensings (15) can be freely allocated to the operational amplifier OA_L and the operational amplifier OA_H.

As shown in FIG. 23, the operational amplifier OA_L senses the four resistance states RS0 to RS3, in which a resistance value R is relatively low (attenuation of the voltage VBL from the voltage Vread is relatively large), by using a reference voltage VREF_L at, for example, time TsL0 to time TsL3. The operational amplifier OA_H senses the four resistance states RS4 to RS7, in which a resistance value R is relatively high (attenuation of the voltage VBL from the voltage Vread is relatively small) by using a reference voltage VREF_H at, for example, from the time TsH0 to time TsH2.

As with the first embodiment, the reference voltages VREF_L and VREF_H, the times TsL0 to TsL3, and the times TsH0 to TsH2 are set in such a manner as to secure a sufficient margin for a voltage difference and a time period to the extent that, for example, the sense amplifier 140 can discriminate between the resistance states RS0 to RS7.

More specifically, the reference voltages VREF_L and VREF_H are set between the voltage VSS and the voltage Vread. The magnitude relationship of the reference voltages VREF_L and VREF_H is expressed as VSS<VREF_L<VREF_H<Vread.

The time TsL0 is set between a time at which VBL(RS0) becomes equal to the reference voltage VREF_L and a time at which VBL(RS1) becomes equal to the reference voltage VREF_L. The time TsL1 is set between a time at which VBL(RS1) becomes equal to the reference voltage VREF_L and a time at which VBL(RS2) becomes equal to the reference voltage VREF_L. The time TsL2 is set between a time at which VBL(RS2) becomes equal to the reference voltage VREF_L and a time at which VBL(RS3) becomes equal to the reference voltage VREF_L. The time TsL3 is set between a time at which VBL(RS3) becomes equal to the reference voltage VREF_L and a time at which VBL(RS4) becomes equal to the reference voltage VREF_L. In the case of the resistance states RS0 to RS3, the reference voltage VREF_L is applied since a sufficient margin for a voltage difference and a time period to discriminate between resistance states cannot be secured with the reference voltage VREF_H.

The time TsH0 is set between a time at which VBL(RS4) becomes equal to the reference voltage VREF_H and a time at which VBL(RS5) becomes equal to the reference voltage VREF_H. The time TsH1 is set between a time at which VBL(RS5) becomes equal to the reference voltage VREF_H and a time at which VBL(RS6) becomes equal to the reference voltage VREF_H. The time TsH2 is set between a time at which VBL(RS6) becomes equal to the reference voltage VREF_H and a time at which VBL(RS7) becomes equal to the reference voltage VREF_H. In the case of the resistance states RS4 to RS7, the reference voltage VREF_H is applied since an elapsed time period after the time T2 is extended with the reference voltage VREF_L. In the case of the resistance states RS4 to RS7, a sufficient margin for a voltage difference and a time period to discriminate resistance states can be secured even with the reference voltage VREF_H.

The times TsL0 to TsL3 and the times TsH0 to TsH2 are set between the time T2 and the time T3. The magnitude relationship of the times TsL0 to TsL3 is expressed as T2<TsL0<TsL1<TsL2<TsL3<T3. The magnitude relationship of the times TsH0 to TsH2 is expressed as T2<TsH0<TsH1<TsH2<T3.

First, a sense operation of the operational amplifier OA_L will be described with reference to FIG. 24. FIG. 24 is a flowchart showing an example of the sense operation of the operational amplifier OA_L within the sense amplifier module SA included in the memory chip 100 according to the present embodiment. In FIG. 24, the number of sensings by the operational amplifier OA_L is represented by i (where i is a natural number equal to or greater than 1 and equal to or less than 4). The number i is incremented by, for example, the sequencer 180.

As shown in FIG. 24, after the read voltage Vread is applied to the selected bit line BL at the time T2, the sequencer 180 sets i=1 (step S30). Subsequently, the sequencer 180 determines whether or not a current time corresponds to the i-th sense timing (time TsL(i−1)) of the operational amplifier OA_L (step S31). For example, a period from the time T2 to the time TsL0 is 0.45 [μs], a period from the time T2 to the time TsL1 is 0.7 [μs], a period from the time T2 to the time TsL2 is 0.95 [μs], and a period from the time T2 to the time TsL3 is 1.4 [μs]. In the case where the current time corresponds to the time TsL(i−1) (Yes in step S31), the operational amplifier OA_L senses the voltage VBL of the bit line BL (step S32). More specifically, the operational amplifier OA_L compares the voltage VBL with the reference voltage VREF_L and outputs a comparison result as VOUT_L. The voltage VREF_L is, for example, 0.11 [V]. On the other hand, in the case where the current time does not correspond to the time TsL(i−1) (No in step S31), the sequencer 180 performs step S31 mentioned in the above.

Next, the voltage detection circuit SC_L detects whether or not the voltage VOUT_L supplied from the operational amplifier OA_L is at the L level (step S33). Subsequently, the voltage detection circuit SC_L transmits a detection result to the latch circuit LC_L(i−1) of the register REG_L (step S34). Details of steps S33 and S34 are the same as steps S12 and S13 in the first embodiment. After step S34 is performed, a first sense result of the operational amplifier OA_L is stored in the latch circuit LC_L0, a second sense result of the operational amplifier OA_L is stored in the latch circuit LC_L1, a third sense result of the operational amplifier OA_L is stored in the latch circuit LC_L2, and the fourth sense result of the operational amplifier OA_L is stored in the latch circuit LC_L3.

Next, the sequencer 180 determines whether or not i is the last value (i=4) (step S35). In the case where i is the last value (Yes in step S35), the operational amplifier OA_L terminates the sense operation. On the other hand, in the case where i is not the last value (No in step S35), the sequencer 180 increments i to set i=i+1 (step S36), and performs step S31 mentioned in the above.

Next, a sense operation of the operational amplifier OA_H will be described with reference to FIG. 25. FIG. 25 is a flowchart showing an example of the sense operation of the operational amplifier OA_H within the sense amplifier module SA included in the memory chip 100 according to the present embodiment. In FIG. 25, the number of sensings by the operational amplifier QA_H is represented by j (where j is a natural number equal to or greater than 1 and equal to or less than 3). The number j is incremented by, for example, the sequencer 180. The upper limits of i and j depend on the number of bits that one memory cell MC can store. For example, the upper limits of i and j can be determined in such a manner as to satisfy i+j=7 in the case where the number of bits is three, i+j=3 in the case where the number of bits is two, and i+j=15 in the case where the number of bits is four.

As shown in FIG. 25, after the read voltage Vread is applied to the selected bit line BL at the time T2, the sequencer 180 sets j=1 (step S40). Subsequently, the sequencer 180 determines whether or not a current time corresponds to the j-th sense timing (time TsH(j-1)) of the operational amplifier OA_H (step S41). For example, a period from the time T2 to the time TsH0 is 0.6 [µs], a period from the time T2 to the time TsH1 is 0.95 [µs], and a period from the time T2 to the time TsH2 is 1.7 [µs]. In the case where the current time corresponds to the time TsH(j-1) (Yes in step S41), the operational amplifier OA__H senses the voltage VBL of the bit line BL (step S42). More specifically, the operational amplifier OA_H compares the voltage VBL with the reference voltage VREF_H and outputs a comparison result as VOUT_H. The voltage VREF_H is, for example, 0.225 [V].

On the other hand, in the case where the current time does not correspond to the time TsH(j-1) (No in step S41), the sequencer 180 performs step S41 mentioned in the above.

Next, the voltage detection circuit SC_H detects whether or not the voltage VOUT_H supplied from the operational amplifier OA_H is at the L level (step S43). Subsequently, the voltage detection circuit SC_H transmits a detection result to the latch circuit LC_H(j-1) of the register REG_H (step S44). Details of steps S43 and S44 are the same as step S12 and S13 in the first embodiment. After step S44 is performed, the first sense result of the operational amplifier OA_H is stored in the latch circuit LC_H0, the second sense result of the operational amplifier OA_H is stored in the latch circuit LC_H1, and the third sense result of the operational amplifier OA_H is stored in the latch circuit LC_H2.

Next, the sequencer 180 determines whether or not j is the last value (j=3) (step S45). In the case where j is the last value (Yes in step S45), the operational amplifier OA_H terminates the sense operation. On the other hand, in the case where j is not the last value (No in step S45), the sequencer 180 increments j to set j=j+1 (step S46), and performs step S41 mentioned in the above.

Subsequently, a computation operation of the logical operation circuit 141 will be described with reference to FIG. 26. FIG. 26 is a flowchart showing an example of a computation operation of the logical operation circuit 141 within the sense amplifier module SA included in the memory chip 100 according to the present embodiment.

As shown in FIG. 26, the sequencer 180 determines whether or not sensing by the operational amplifiers OA_L and OA_H has been completed (step S50). In the case where the sensing by the operational amplifiers OA_L and OA_H has been completed (Yes in step S50), the sequencer 180 determines whether or not a value of the latch circuit LC_L3 (the fourth sense result of the operational amplifier OA_L) is at the L level (step S51). In the case where the value of the latch circuit LC_L3 is at the L level (Yes in step S51), the logical operation circuit 141 performs a logical operation using values of the latch circuits LC_L0 to LC_L3 (step S52), and outputs operation results (step S54). Hereinafter, this will be described in more detail with reference to FIG. 27. FIG. 27 is a view showing an example of a relationship between the resistance states RS0 to RS7 of the memory element MR and sense results of the operational amplifiers OA_L and OA_H in the memory chip 100 according to the present embodiment.

As shown in FIG. 27, in the case where the first sense result of the operational amplifier OA_L (a value of the latch circuit LC_L0) is at the L level, the second sense result of the operational amplifier OA_L (a value of the latch circuit LC_L1) is at the L level, the third sense result of the operational amplifier OA_L (a value of the latch circuit LC_L2) is at the L level, and a fourth sense result of the operational amplifier OA_L (a value of the latch circuit LC_L3) is at the L level, the logical operation circuit 141 transmits the value "000" indicative of the resistance state RS0 to the data register 150.

In the case where the first sense result of the operational amplifier OA_L is at the H level, the second sense result of the operational amplifier OA_L is at the L level, the third sense result of the operational amplifier OA_L is at the L level, and the fourth sense result of the operational amplifier OA_L is at the L level, the logical operation circuit 141 transmits the value "001" indicative of the resistance state RS1 to the data register 150.

In the case where the first sense result of the operational amplifier OA_L is at the H level, the second sense result of the operational amplifier OA_L is at the H level, the third sense result of the operational amplifier OA_L is at the L level, and the fourth sense result of the operational amplifier OA_L is at the L level, the logical operation circuit 141 transmits the value "010" indicative of the resistance state RS2 to the data register 150.

In the case where the first sense result of the operational amplifier OA_L is at the H level, the second sense result of the operational amplifier OA_L is at the H level, the third sense result of the operational amplifier OA_L is at the H level, and the fourth sense result of the operational amplifier OA_L is at the L level, the logical operation circuit 141 transmits the value "011" indicative of the resistance state RS3 to the data resistor 150.

On the other hand, in the case where the value of the latch circuit LC_L3 is not at the L level (No in step S51), the logical operation circuit 141 performs a logical operation using values of the latch circuits LC_H0 to LC_H2 (step S53), and output operation results (step S54). Hereinafter, this will be described in more detail with reference to FIG. 27.

In the case where the first sense result of the operational amplifier OA_H (a value of the latch circuit LC_H0) is at the L level, the second sense result of the operational amplifier OA_H (a value of the latch circuit LC_H1) is at the L level, and the third sense result of the operational amplifier OA_H (a value of the latch circuit LC_H2) is at the L level, the logical operation circuit 141 transmits the value "100" indicative of the resistance state RS4 to the data register 150.

In the case where the first sense result of the operational amplifier OA_H is at the H level, the second sense result of the operational amplifier OA_H is at the L level, and the third sense result of the operational amplifier OA_H is at the L level, the logical operation circuit 141 transmits the value "101" indicative of the resistance state RS5 to the data register 150.

In the case where the first sense result of the operational amplifier OA_H is at the H level, the second sense result of the operational amplifier OA_H is at the H level, and the third sense result of the operational amplifier OA_H is at the L level, the logical operation circuit 141 transmits the value "110" indicative of the resistance state RS6 to the data register 150.

In the case where the first sense result of the operational amplifier OA_H is at the H level, the second sense result of the operational amplifier OA_H is at the H level, and the third sense result of the operational amplifier OA_H is at the H level, the logical operation circuit 141 transmits the value "111" indicative of the resistance state RS7 to the data register 150.

On the other hand, in the case where the sensing by the operational amplifiers OA_L and OA_H has not been completed (No in step S50), the sequencer 180 performs step S50 mentioned in the above.

3-3> Effects

The memory chip 100 according to the present embodiment includes, in the sense amplifier module SA, the plurality of operational amplifiers OA, the plurality of voltage detection circuits SC, and the plurality of registers REG. Different reference voltages VREF are respectively applicable to the operational amplifiers OA. By the plurality of operational amplifiers OA each performing sensing the number of sensings allocated to each of them, the resistance state (one of RS0 to RS7) of the memory element MR of the selected memory cell MC can be determined.

With the configuration according to the present embodiment, the number of operational amplifiers OA included in the sense amplifier module SA can be made smaller than the number of sensings. This suppresses an increase in the chip area. With the configuration according to the present embodiment, data can be sensed using the plurality of operational amplifiers OA corresponding to the plurality of reference voltages, thereby realizing an improved processing capacity of the memory device.

As a matter of course, the sense amplifier module SA according to the present embodiment is applicable to the memory chip 100 according to the modification of the first embodiment.

<4> Fourth Embodiment

The memory chip 100 according to a fourth embodiment will be described. Unlike the first embodiment, the memory chip 100 according to the present embodiment includes, in the sense amplifier module SA, five operational amplifiers OA, five voltage detection circuits SC, and five latch circuits LC, and involves two sense timings. The following description will in principle concentrate on the features different from the first embodiment to the third embodiment.

<4-1> Configuration of Sense Amplifier Module SA

Figure 28:
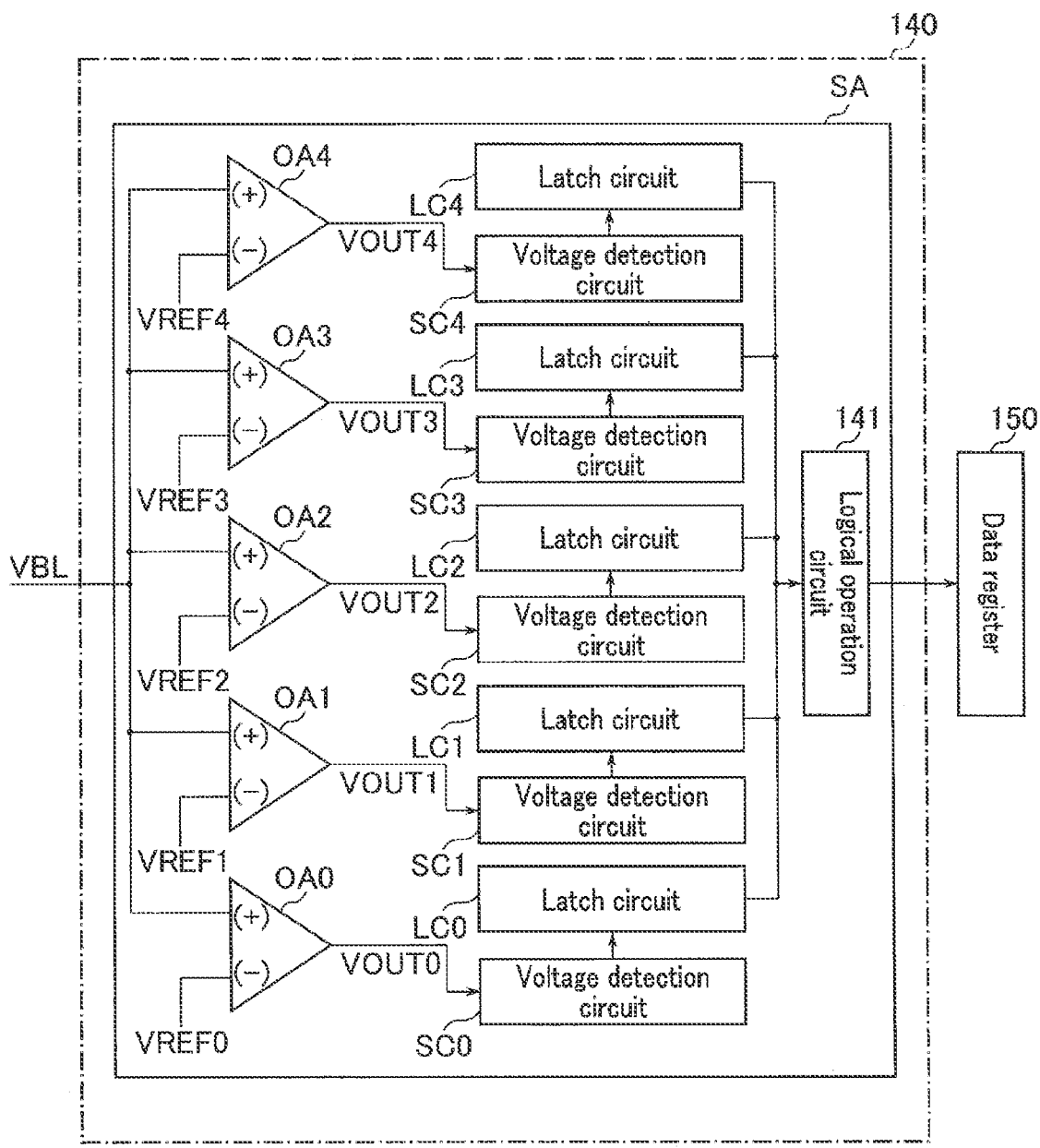
FIG. 28 is a block diagram showing a configuration of a sense amplifier module within a sense amplifier included in a memory chip according to a fourth embodiment.

First, details of a configuration of the sense amplifier module SA within the sense amplifier 140 included in the memory chip 100 according to the present embodiment will be described with reference to FIG. 28. FIG. 28 is a block diagram showing an example of a configuration of the sense amplifier module SA included in the memory chip 100 according to the present embodiment. FIG. 28 omits constituent elements such as a function block, interconnect, etc., for transmitting write data DAT from the data register 150 to the bit line BL.

The sense amplifier module SA includes operational amplifiers OA0 to OA4, voltage detection circuits SC0 to SC4, latch circuits LC0 to LC4, and the logical operation circuit 141. The operational amplifiers OA0 to OA4, the voltage detection circuits SC0 to SC4, the latch circuits LC0 to LC4, and the logical operation circuit 141 are the same as those in the first embodiment shown in FIG. 9. The number of operational amplifiers OA, the number of voltage detection circuits SC, and the number of latch circuits LC included in the sense amplifier module SA are respectively not limited to five. In the case where one memory cell MC can store two-bit data, the sense amplifier module SA includes fewer than three operational amplifiers OA, fewer than three voltage detection circuits SC, and fewer than three latch circuits LC. In the case where one memory cell MC can store four-bit data, the sense amplifier module SA includes fewer than 15 operational amplifiers OA, fewer than 15 voltage detection circuits SC, and fewer than 15 latch circuits LC.

<4-2> Operation of Sense Amplifier Module SA

Next, an operation of the sense amplifier module SA within the sense amplifier 140 included in the memory chip 100 according to the present embodiment will be described with reference to FIGS. 29 and 30.

FIG. 29 is a view showing a relationship between a voltage of the selected bit line BL and a time period after the read voltage Vread is applied to the selected bit line BL in the memory chip 100 according to the present embodiment. In FIG. 29, the vertical axis represents a voltage VBL of the bit line BL, and the horizontal axis represents an elapsed time period after the voltage Vread is applied to the bit line BL. The time T2 to the time T3 of the horizontal axis corresponds to time T2 to time T3 in the first embodiment shown in FIG. 12.

In the present embodiment, one memory cell MC can store three-bit data. Sensing seven times, which corresponds to the aforementioned memory cell MC configured to store three-bit data, can be performed at two sense timings. In other words, the number of sensings (seven) can be freely allocated to two sense timings (hereinafter, occasionally referred to as a "first sense timing" and a "second sense timing"). Hereinafter, the case in which the number of sensings is divided in such a manner that three sensings are allocated to the first sense timing and four sensings are allocated to the second sense timing will be described. More specifically, one sensing is allocated to each of the operational amplifiers OA0 to OA2 (three sensings in total) at the first sense timing, and one sensing is allocated to each of the operational amplifiers OA1 to OA4 (four sensings in total) at the second sense timing. In this case, the operational amplifier OA0 performs sensing one time at the maximum, the operational amplifiers OA1 and OA2 perform sensing two times at the maximum, and the operational amplifiers OA3 and OA4 perform sensing one time at the maximum. The allocation of the number of sensings is not limited to the case in which three sensings are allocated to the first sense timing and four sensings are allocated to the second sense timing. In the case where one memory cell MC can store two-bit data, the number of sensings (three) can be freely allocated to the first sense timing and the second sense timing. In the case where one memory cell MC can store four-bit data, the number of sensings (15) can be freely allocated to the first sense timing and the second sense timing.

As shown in FIG. 29, the operational amplifiers OA0 to OA2 sense the three resistance states RS0 to RS2, in which a resistance value R is relatively low (attenuation of the voltage VBL from the voltage Vread is relatively large), by using reference voltages VREF0 to VREF2 at, for example, the time Ts0. The operational amplifiers OA1 to OA4 sense the five resistance states RS3 to RS7, in which a resistance value R is relatively high (attenuation of the voltage VBL from the voltage Vread is relatively small), by using reference voltages VREF1 to VREF4 at, for example, the time Ts1.

As with the first embodiment, the reference voltages VREF0 to VREF4 and the times Ts0 and Tal are set in such a manner as to secure a sufficient margin for a voltage difference and a time period to the extent that, for example, the sense amplifier 140 can discriminate between the resistance states RS0 to RS7.

More specifically, the times Ts0 and Ts1 are set between the times T2 and T3. The magnitude relationship of the times Ts0 and Ts1 is expressed as T2<Ts0<Ts1<T3.

The reference voltage VREF0 is set between VBL(RS0) and VBL(RS1) at the time Ts0. The reference voltage VREF1 is set between VBL(RS1) and VBL(RS2) at the time Ts0. The reference voltage VREF2 is set between VBL(RS2) and VBL(RS3) at the time Ts0. In the case of the resistance states RS0 to RS2, the time Ts0 is applied since a sufficient margin for a voltage difference and a time period to discriminate between resistance states cannot be secured with the time Tal.

The reference voltage VREF1 is set between VBL(RS3) and VBL(RS4) at the time Ts1. The reference voltage VREF2 is set between VBL(RS4) and VBL(RS5) at the time Ts1. The reference voltage VREF3 is set between VBL(RS5) and VBL(RS6) at the time Ts1. The reference voltage VREF4 is set between VBL(RS6) and VBL(RS7) at the time Ts1. In the case of the resistance states RS3 to RS7, the time Ts1 is applied since a sufficient margin for a voltage difference and a time period to discriminate between resistance states cannot be secured with the time Ts0. With the time Ts1, an elapsed time period after the time T2 becomes relatively short.

The reference voltages VREF0 to VREF4 are set between the voltage VSS and the voltage Vread. The magnitude relationship of the reference voltages VREF0 to VREF4 is expressed as VSS<VREF0<VREF1<VREF2<VREF3<VREF4<Vread.

Figure 30:
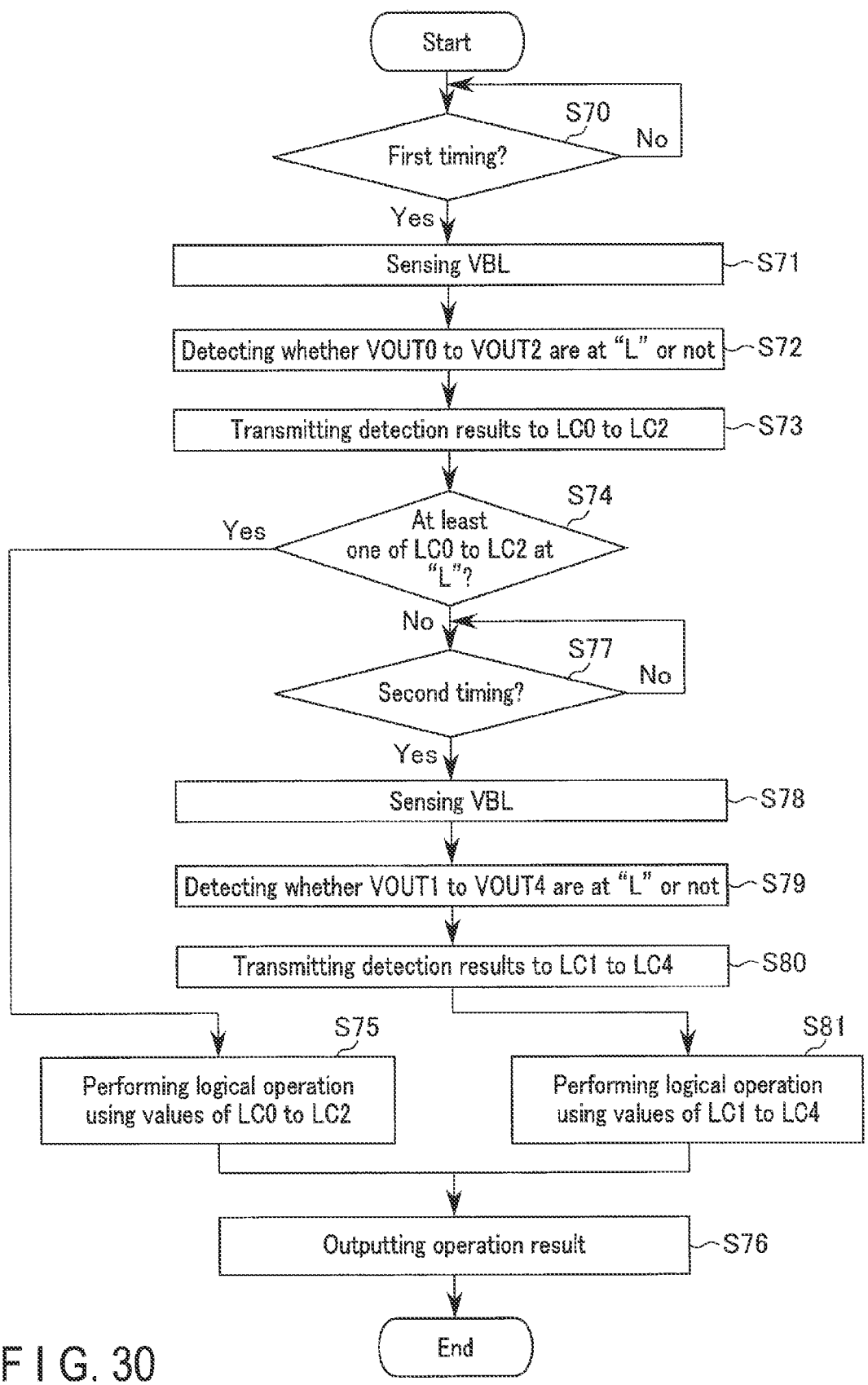
FIG. 30 is a flowchart showing a sense operation of the sense amplifier module included in the memory chip according to the fourth embodiment.

FIG. 30 is a flowchart showing an example of a sense operation of the sense amplifier module SA included in the memory chip 100 according to the present embodiment.

As shown in FIG. 30, after the read voltage Vread is applied to the selected bit line BL at the time T2, the sequencer 180 determines whether or not a current time corresponds to the first sense timing (time Ts0) (step S70). A period from the time T2 to the time Ts0 is, for example, 0.75 [μs]. In the case where the current time corresponds to the time Ts0 (Yes in step S70), each of the operational amplifiers OA0 to OA2 senses the voltage VBL of the bit line BL (step S71). More specifically, the operational amplifiers OA0 to OA2 respectively compare the voltage VBL with the reference voltages VREF0 to VREF2, and output comparison results as VOUT0 to VOUT2. For example, the voltage VREF0 is 0.07 [V], the voltage VREF1 is 0.11 [V], and the voltage VREF2 is 0.145 [V]. On the other hand, in the case where the current time does not correspond to the time Ts0 (No in step S70), the sequencer 180 performs step S70 mentioned in the above.

Next, the voltage detection circuits SC0 to SC2 respectively detect whether or not the voltages VOUT0 to VOUT2 respectively supplied from the operational amplifiers OA0 to OA2 are at the L level (step S72). Subsequently, the voltage detection circuits SC0 to SC2 respectively transmit detection results to the latch circuits LC0 to LC2 (step S73). Details of steps S72 and S73 are the same as steps S12 and S13 in the first embodiment.

Next, the sequencer 180 determines whether or not at least one of the values of the latch circuits LC0 to LC2 is at the L level (step S74). In the case where at least one of the values of the latch circuits LC0 to LC2 is at the L level (Yes in step S74), the logical operation circuit 141 performs a logical operation using the values of the latch circuits LC0 to LC2 (step S75), and outputs operation results (step S76). Hereinafter, this will be described in more detail with reference to FIG. 31. FIG. 31 is a view showing an example of a relationship between the resistance states RS0 to RS7 of the memory element MR and sense results of the operational amplifiers OA0 to OA4 that can specify the resistance states RS0 to RS7 in the memory chip 100 according to the present embodiment.

As shown in FIG. 31, in the case where sense results of the operational amplifiers OA0 to OA2 at the time Ts0 show that values of the latch circuits LC0 to LC2 are at the L level, the resistance state RS0 is specified. In this case, the logical operation circuit 141 transmits the value "000" indicative of the resistance state RS0 to the data register 150.

In the case where the sense results of the operational amplifiers OA0 to OA2 at the time Ts0 show that the value of the latch circuit LC0 is at the H level and the values of the latch circuits LC1 and LC2 are at the L level, the resistance state RS1 is specified. In this case, the logical operation circuit 141 transmits the value "001" indicative of the resistance state RS1 to the data register 150.

In the case where the sense results of the operational amplifiers OA0 to OA2 at the time Ts0 show that the values of the latch circuits LC0 and LC1 are at the H level and the value of the latch circuit LC2 is at the L level, the resistance state RS2 is specified. In this case, the logical operation circuit 141 transmits the value "010" indicative of the resistance state RS2 to the data register 150.

As described above, the resistance states RS0 to RS2 can be specified by the operational amplifiers OA0 to OA2 each performing sensing one time at the time Ts0.

On the other hand, in the case where at least one of the values of the latch circuits LC0 to LC2 is not at the L level (No in step S74), the sequencer 180 determines whether or not a current time corresponds to the second sense timing (time Ts1) (step S77). A period from the time T2 to the time Ts1 is, for example, 1.5 [μs]. In the case where the current time corresponds to the time Ts1 (Yes in step S77), each of the operational amplifiers OA1 to OA4 senses the voltage VBL of the bit line BL (step S78). More specifically, the operational amplifiers OA1 to OA4 respectively compare the voltage VBL with the reference voltages VREF1 to VREF4, and output comparison results as VOUT1 to VOUT4. For example, the voltage VREF1 is 0.11 [V], the voltage VREF2 is 0.145 [V], the voltage VREF3 is 0.185 [V], and the voltage VREF4 is 0.225 [V]. On the other hand, in the case in which the current time does not correspond to the time Tel (No in step S77), the sequencer 180 performs step S77 mentioned in the above.

Next, the voltage detection circuits SC1 to SC4 respectively detect whether or not the voltages VOUT1 to VOUT4 respectively supplied from the operational amplifiers OA1 to OA4 are at the L level (step S79). Subsequently, the voltage detection circuits SC1 to SC4 respectively transmit detection results to the latch circuits LC1 to LC4 (step S80). Details of steps S79 and S80 are the same as steps S72 and S73 mentioned in the above.

Next, the logical operation circuit 141 performs a logical operation using values of the latch circuits LC1 to LC4 (step S81), and outputs operation results (step S76). Hereinafter, this will be described in more detail with reference to FIG. 31.

As shown in FIG. 31, in the case where the sense results of the operational amplifiers OA0 to OA2 at the time Ts0 show that the values of the latch circuits LC0 to LC2 are at the H level, and where sense results of the operational amplifiers OA1 to OA4 at the time Ts1 show that the values of the latch circuits LC1 and LC4 are at the L level, the resistance state RS3 is specified. In this case, the logical operation circuit 141 transmits the value "011" indicative of the resistance state RS3 to the data register 150.

In the case where the sense results of the operational amplifiers OA0 to OA2 at the time Ts0 show that the values of the latch circuits LC0 to LC2 are at the H level, and where the sense results of the operational amplifiers OA1 to OA4 at the time Ts1 show that the value of the latch circuit LC1 is at the H level and the values of the latch circuits LC2 to LC4 are at the L level, the resistance state RS4 is specified. In this case, the logical operation circuit 141 transmits the value "100" indicative of the resistance state RS4 to the data register 150.

In the case where the sense results of the operational amplifiers OA0 to OA2 at the time Ts0 show that the values of the latch circuits LC0 to LC2 are at the H level, and where the senses results of the operational amplifiers OA1 to OA4 at the time Ts1 show that the values of the latch circuits LC1 and LC2 are at the H level and the values of the latch circuits LC3 and LC4 are at the L level, the resistance state RS5 is specified. In this case, the logical operation circuit 141 transmits the value "101" indicative of the resistance state RS5 to the data register 150.

In the case where the sense results of the operational amplifiers OA0 to OA2 at the time Ts0 show that the values of the latch circuits LC0 to LC2 are at the H level, and where the sense results of the operational amplifiers OA1 to OA4 at the time Ts1 show that the values of the latch circuits LC1 to LC3 are at the H level and the value of the latch circuit LC4 is at the L level, the resistance state RS6 is specified. In this case, the logical operation circuit 141 transmits the value "110" indicative of the resistance state RS6 to the data register 150.

In the case where the sense results of the operational amplifiers OA0 to OA2 at the time Ts0 show that the values of the latch circuits LC0 to LC2 are at the H level, and where the sense results of the operational amplifiers OA1 to OA4 at the time Ts1 show that the values of the latch circuits LC1 and LC4 are at the H level, the resistance state RS7 is specified. In this case, the logical operation circuit 141 transmits the value "111" indicative of the resistance state RS7 to the data register 150.

As described in the above, the resistance states RS3 to RS7 can be specified by the operational amplifiers OA0 to OA2 each performing sensing one time at the time Ts0 and the operational amplifiers OA1 to OA4 each performing sensing one time at the time Ts1.

<4-3> Effects

The memory chip 100 according to the present embodiment includes, in the sense amplifier module SA, the plurality of operational amplifiers OA, the plurality of voltage detection circuits SC, and the plurality of latch circuits LC, and the resistance state (one of RS0 to RS7) of the memory element MR of the selected memory cell MC can be discriminated by the operational amplifiers OA each performing sensing up to the number of sensings allocated to each of them.

With the configuration according to the present embodiment, the number of operational amplifiers OA included in the sense amplifier module SA can be made smaller than the number of sensings. This suppresses an increase in the chip area. With the configuration according to the present embodiment, data can be sensed using the plurality of operational amplifiers OA corresponding to the plurality of reference voltages, thereby realizing an improved processing capacity of the memory device.

As a matter of course, the sense amplifier module SA according to the present embodiment is applicable to the memory chip 100 according to the modification of the first embodiment.

<5> Fifth Embodiment

The memory chip 100 according to a fifth embodiment will be described. The memory chip 100 according to the present embodiment uses a current mirror circuit C/M as the operational amplifiers (OA0 to OA6) within the sense amplifier module SA included in the memory chip 100 according to the first embodiment.

<5-1> Configuration of Sense Amplifier Module SA

Figure 32:
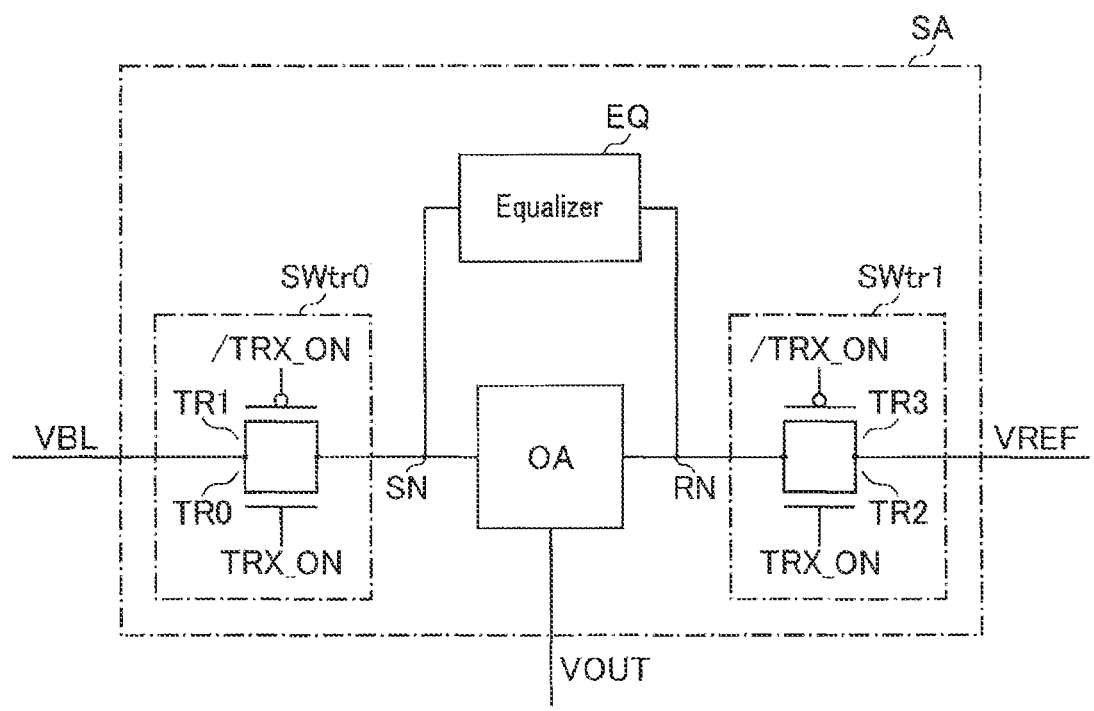
FIG. 32 is a circuit diagram showing a configuration of a sense amplifier module within a sense amplifier included in a memory chip according to a fifth embodiment.

First, details of a configuration of the sense amplifier module SA within the sense amplifier 140 included in the memory chip 100 according to the present embodiment will be described with reference to FIG. 32. FIG. 32 is a circuit diagram showing an example of a configuration of the sense amplifier module SA included in the memory chip 100 according to the present embodiment. FIG. 32 omits the voltage detection circuit SC, the latch circuit LC, and the logical operation circuit 141 within the sense amplifier module SA. Hereinafter, in the case where a source and a drain of a transistor are not distinguished from each other, one of them will be referred to as "one end of a transistor" and the other of them will be referred to as "the other end of the transistor".

As shown in FIG. 32, the sense amplifier module SA further includes switches SWtr0 and SWtr1 and an equalizer EQ. The switches SWtr0 and SWtr1 and the equalizer EQ are provided for each operational amplifier OA.

The switch SWtr0 couples the operational amplifier OA to the bit line BL. The switch SWtr0 includes an n-channel MOS transistor TR0 and a p-channel MOS transistor TR1.

A voltage TRX_ON is applied to a gate of the transistor TR0. One end of the transistor TR0 is coupled to the bit line BL. The other end of the transistor TR0 is coupled to a node SN.

A voltage /TRX_ON is applied to a gate of the transistor TR1. The voltage /TRX_ON is a voltage obtained by inverting a logical level of the voltage TRX_ON. One end of the transistor TR1 is coupled to the bit line BL. The other end of the transistor TR1 is coupled to the node SN.

The switch SWtr1 couples the operational amplifier OA to the interconnect to which the reference voltage VREF is applied. The switch SWtr1 includes an n-channel MOS transistor TR2 and a p-channel MOS transistor TR3.

The voltage TRX_ON is applied to a gate of the transistor TR2. One end of the transistor TR2 is coupled to the interconnect to which the reference voltage VREF is applied. The other end of the transistor TR2 is coupled to a node RN.

The voltage /TRX_ON is applied to a gate of the transistor TR3. One end of the transistor TR3 is coupled to the interconnect to which the reference voltage VREF is applied. The other end of the transistor TR3 is coupled to the node RN.

The equalizer EQ is coupled to the nodes SN and RN and equalizes a voltage of the node SN and a voltage of the node RN. Details of the equalizer EQ will be described later.

The operational amplifier OA is coupled to the nodes SN and RN and outputs a voltage VOUT based on a voltage of the node SN and a voltage of the node RN. Details of the operational amplifier OA will be described later.

<5-2> Configuration of Equalizer EQ

Figure 33:
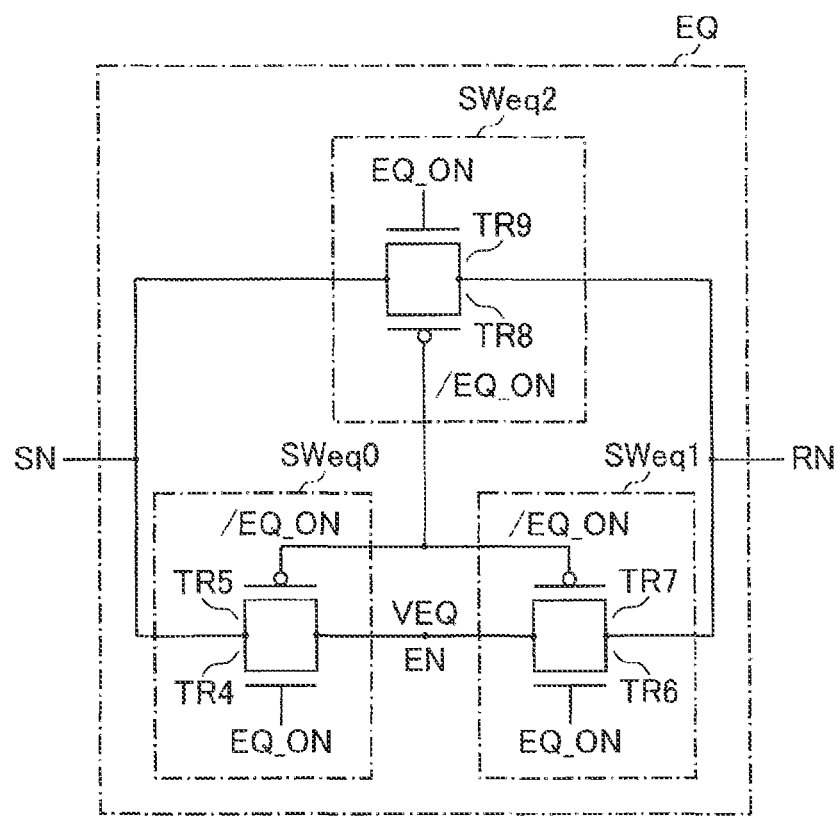
FIG. 33 is a circuit diagram showing a configuration of an equalizer within the sense amplifier module included in the memory chip according to the fifth embodiment.

Next, details of a configuration of the equalizer EQ within the sense amplifier SA included in the memory chip 100 according to the present embodiment will be described with reference to FIG. 33. FIG. 33 is a circuit diagram showing an example of a configuration of the equalizer EQ within the sense amplifier module SA included in the memory chip 100 according to the present embodiment.

As shown in FIG. 33, the equalizer EQ includes switches SWeq0 to SWeq2.

The switch SWeq0 couples the node SN to the node EN. The switch SWeq0 includes an n-channel MOS transistor TR4 and a p-channel MOS transistor TR5.

A voltage EQ_ON is applied to a gate of the transistor TR4. One end of the transistor TR4 is coupled to the node EN. A voltage of the node EN with the switches SWtr0 and SWtr1 being in an on state is defined as a voltage VEQ. The voltage VEQ is, for example, a read voltage Vread/2. In this case, the voltage VEQ is, for example, 0.3 [V]/2=0.15 [V]. The voltage VEQ may be (Vread+VREF)/2 [V]. In this case, with the reference voltage VREF being 0.11 [V], the voltage VEQ may be (0.3 [V]+0.11 [V])/2=0.205 [V], for example. The other end of the transistor TR4 is coupled to the node SN.

A voltage /EQ_ON is applied to a gate of the transistor TR5. The voltage /EQ_ON is a voltage obtained by inverting a logical level of the voltage EQ_ON. One end of the transistor TR5 is coupled to the node EN. The other end of the transistor TR5 is coupled to the node SN.

The switch SWeq1 couples the node RN to the node EN. The switch SWeq1 includes an n-channel MOS transistor TR6 and a p-channel MOS transistor TR7.

The voltage EQ_ON is applied to a gate of the transistor TR6. One end of the transistor TR6 is coupled to the node EN. The other end of the transistor TR6 is coupled to the node RN.

The voltage /EQ_ON is applied to a gate of the transistor TR7. One end of the transistor TR7 is coupled to the node EN. The other end of the transistor TR7 is coupled to the node RN.

The switch SWeq2 couples the node SN to the node RN. The switch SWeq2 includes a p-channel MOS transistor TR8 and an n-channel MOS transistor TR9.

The voltage /EQ_ON is applied to a gate of the transistor TR8. One end of the transistor TR8 is coupled to the node SN. The other end of the transistor TR8 is coupled to the node RN.

The voltage EQ_ON is applied to a gate of the transistor TR9. One end of the transistor TR9 is coupled to the node SN. The other end of the transistor TR9 is coupled to the node RN.

<5-3> Configuration of Operational Amplifier OA

Next, details of a configuration of the operational amplifier OA within the sense amplifier 140 included in the memory chip 100 according to the present embodiment will be described with reference to FIG. 34. FIG. 34 is a circuit diagram showing an example of a configuration of the operational amplifier OA within the sense amplifier module SA included in the memory chip 100 according to the present embodiment.

As shown in FIG. 34, the operational amplifier OA includes p-channel MOS transistors TR10 to TR12 and n-channel transistors TR13 and TR14. The transistor TR10 is a drive transistor, the transistors TR11 and TR12 are input transistors, and the transistors TR13 and TR14 are current mirror transistors.

A voltage /SAP is applied to a gate of the transistor TR10. A voltage VDD is applied to a source of the transistor TR10. The voltage VDD is, for example, 2.5 [V]. A drain of the transistor TR10 is coupled to a node N0.

A gate of the transistor TR11 is coupled to the node SN. A source of the transistor TR11 is coupled to the node N0. A drain of the transistor TR11 is coupled to a node N1.

A gate of the transistor TR12 is coupled to the node RN. A source of the transistor TR12 is coupled to the node N0. A drain of the transistor TR12 is coupled to a node N2.

A gate of the transistor TR13 is coupled to a node N3. The node N3 is coupled to the node N1. A drain of the transistor TR13 is coupled to the node N1. The ground voltage VSS is applied to a source of the transistor TR13.

A gate of the transistor TR14 is coupled to the node N3. A drain of the transistor TR14 is coupled to the node N2. The ground voltage VSS is applied to a source of the transistor TR14.

The operational amplifier OA outputs a voltage of the node N2 as VOUT.

<5-4> Operation of Sense Amplifier Module SA

Figure 36:
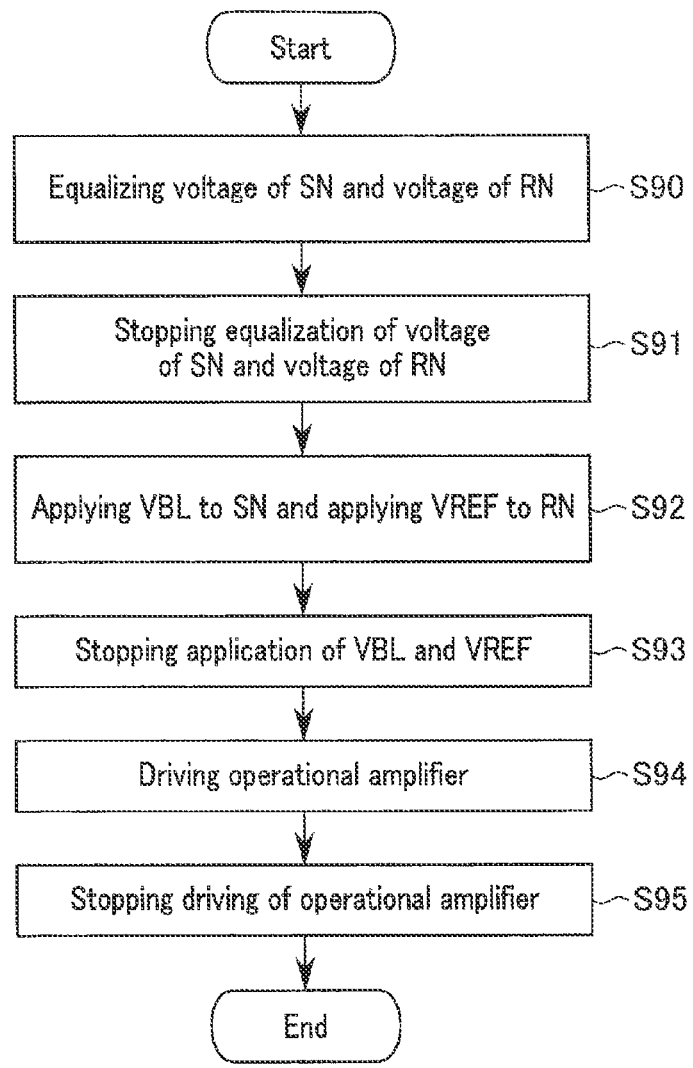
FIG. 36 is a flowchart showing the sense operation of the sense amplifier module included in the memory chip according to the fifth embodiment.

Next, an operation of the sense amplifier module SA within the sense amplifier 140 included in the memory chip 100 according to the present embodiment will be described with reference to FIGS. 35 and 36. FIG. 35 is a timing chart of various signals during a sense operation of the sense amplifier module SA included in the memory chip 100 according to the present embodiment. FIG. 36 is a flowchart showing an example of a sense operation of the sense amplifier module SA included in the memory chip 100 according to the present embodiment.

An operation of the sense amplifier module SA described below corresponds to the operation performed in step S11 of the first embodiment shown in FIG. 14.

As shown in FIG. 35, at time T10, the sequencer 180 raises the voltage EQ_ON from the L level to the H level. Accordingly, the transistors TR4 to TR9 within the equalizer EQ are turned on. That is, the switches SWeq0 to SWeq2 within the equalizer EQ are turned on. This causes the equalizer EQ to equalize a voltage of the node SN and a voltage of the node RN (step S90 in FIG. 36).

At time T11, the sequencer 180 drops the voltage EQ_ON from the H level to the L level. Accordingly, the transistors TR4 to TR9 within the equalizer EQ are turned off. That is, the switches SWeq0 to SWeq2 within the equalizer EQ are turned off. This causes the equalizer EQ to stop equalizing a voltage of the node SN and a voltage of the node RN (step S91 in FIG. 36).

At time T12, the sequencer 180 raises the voltage TRX_ON from the L level to the H level. Accordingly, the transistors TR0 to TR3 are turned on. That is, the switches SWtr0 and SWtr1 are turned on. In this manner, the voltage VBL is applied to the node SN, whereas the reference voltage VREF is applied to the node RN (step S92 in FIG. 36).

At time T13, the sequencer 180 drops the voltage TRX_ON from the H level to the L level. Accordingly, the transistors TR0 to TR3 are turned off. That is, the switches SWtr0 and SWtr1 are turned off. In this manner, application of the voltage VBL and the reference voltage VREF to the operational amplifier OA is stopped (step S93 in FIG. 36).

At time T14, the sequencer 180 drops the voltage /SAP from the H level to the L level. Accordingly, the transistor TR10 within the operational amplifier OA is turned on. In this manner, the operational amplifier OA is driven (step S94 in FIG. 36).

During a period from time T14 to time T15, since a voltage of the node SN is higher than a voltage of the node RN, the operational amplifier OA outputs a voltage at the H level as voltage VOUT.

At time T15, the sequencer 180 raises the voltage /SAP from the L level to the H level. Accordingly, the transistor TR10 within the operational amplifier OA is turned off. In this manner, the operational amplifier OA stops being driven (step S95 in FIG. 36).

An operation of the sense amplifier module SA after time T16 is the same as the operation during the period from the time T10 to the time T15.

At time T17, the sequencer 180 raises the voltage TRX_ON from the L level to the H level. In this manner, the voltage VBL is applied to the node SN, whereas the reference voltage VREF is applied to the node RN (step S92 in FIG. 36). During a period from time T17 to time T18, the voltage VBL becomes lower than the reference voltage VREF.

At time T18, the sequencer 180 drops the voltage TRX_ON from the H level to the L level. In this manner, application of the voltage VBL and the reference voltage VREF to the operational amplifier OA is stopped (step S93 in FIG. 36).

At time T19, the sequencer 180 drops the voltage /SAP from the H level to the L level. In this manner, the operational amplifier OA is driven (step S94 in FIG. 36).

During a period from time T19 to time T20, since a voltage of the node SN is lower than a voltage of the node RN, the operational amplifier OA outputs a voltage at the L level as the voltage VOUT.

At time T20, the sequencer 180 raises the voltage /SAP from the L level to the H level. In this manner, the operational amplifier OA stops being driven (step S95 in FIG. 36).

<5-5> Effects

The configuration according to the present embodiment is applicable to the first embodiment. As a matter of course, the sense amplifier module SA according to the present embodiment is applicable to the second embodiment to the fourth embodiment. The sense amplifier module SA according to the present embodiment is applicable to the memory chip 100 according to the modification of the first embodiment.

<6> Sixth Embodiment

The memory chip 100 according to a sixth embodiment will be described. Unlike the fifth embodiment, the memory chip 100 according to the present embodiment uses two p-channel MOS transistors as the current mirror transistor within the operational amplifier OA. The following description will in principle concentrate on the features different from the fifth embodiment.

<6-1> Configuration of Operational Amplifier OA

Details of a configuration of the operational amplifier OA within the sense amplifier 140 included in the memory chip 100 according to the present embodiment will be described with reference to FIG. 37. FIG. 37 is a circuit diagram showing an example of a configuration of the operational amplifier OA within the sense amplifier module SA included in the memory chip 100 according to the present embodiment.

As shown in FIG. 37, the operational amplifier OA includes n-channel MOS transistors TR15 to TR17 and p-channel MOS transistors TR18 and TR19. The transistor TR15 is a drive transistor, the transistors TR16 and TR17 are input transistors, and the transistors TR18 and TR19 are current mirror transistors.

A voltage SAN is applied to a gate of the transistor TR15. A drain of the transistor TR15 is coupled to a node N4. The ground voltage VSS is applied to a source of the transistor TR15.

A gate of the transistor TR16 is coupled to the node SN. A drain of the transistor TR16 is coupled to a node N5. A source of the transistor TR16 is coupled to the node N4.

A gate of the transistor TR17 is coupled to the node RN. A drain of the transistor TR17 is coupled to a node N6. A source of the transistor TR17 is coupled to the node N4.

A gate of the transistor TR18 is coupled to a node N7. The node N7 is coupled to the node N5. The voltage VDD is applied to a source of the transistor TR18. The voltage VDD is, for example, 2.5 [V]. A drain of the transistor TR18 is coupled to the node N5.

A gate of the transistor TR19 is coupled to the node N7. The voltage VDD is applied to a source of the transistor TR19. A drain of the transistor TR19 is coupled to the node N6.

The operational amplifier OA outputs a voltage of the node N6 as VOUT.

<6-2> Operation of Sense Amplifier Module SA

Next, an operation of the sense amplifier module SA within the sense amplifier 140 included in the memory chip 100 according to the present embodiment will be described with reference to FIG. 38. FIG. 38 is a timing chart of various signals during a sense operation of the sense amplifier module SA included in the memory chip 100 according to the present embodiment. The flowchart showing an example of the sense operation of the sense amplifier module SA included in the memory chip 100 according to the present embodiment is the same as that in the fifth embodiment shown in FIG. 36.

An operation of the sense amplifier module SA described below corresponds to the operation performed in step S11 of the first embodiment shown in FIG. 14.

As shown in FIG. 38, at the time T10, the sequencer 180 raises the voltage EQ_ON from the L level to the H level. This causes the equalizer EQ to equalize a voltage of the node SN and a voltage of the node RN (step S90 in FIG. 36).

At time T11, the sequencer 180 drops the voltage EQ_ON from the H level to the L level. This causes the equalizer EQ to stop equalizing a voltage of the node SN and a voltage of the node RN (step S91 in FIG. 36).

At time T12, the sequencer 180 raises the voltage TRX_ON from the L level to the H level. In this manner, the voltage VBL is applied to the node SN, whereas the reference voltage VREF is applied to the node RN (step S92 in FIG. 36).

At time T13, the sequencer 180 drops the voltage TRX_ON from the H level to the L level. In this manner, application of the voltage VBL and the reference voltage VREF to the operational amplifier OA is stopped (step S93 in FIG. 36).

At the time T14, the sequencer 180 raises the voltage SAN from the L level to the H level. Accordingly, the transistor TR15 within the operational amplifier OA is turned on. In this manner, the operational amplifier OA is driven (step S94 in FIG. 36).

During a period from the time T14 to the time T15, since a voltage of the node SN is higher than a voltage of the node RN, the operational amplifier OA outputs a voltage at the H level as the voltage VOUT.

At time T15, the sequencer 180 drops the voltage SAN from the H level to the L level. Accordingly, the transistor TR15 within the operational amplifier OA is turned off. In this manner, the operational amplifier OA stops being driven (step S95 in FIG. 36).

An operation of the sense amplifier module SA after the time T16 is the same as the operation during the period from the time T10 to the time T15.

At time T17, the sequencer 180 raises the voltage TRX_ON from the L level to the H level. In this manner, the voltage VBL is applied to the node SN, whereas the reference voltage VREF is applied to the node RN (step S92 in FIG. 36). During a period from the time T17 to the time T18, the voltage VBL becomes lower than the reference voltage VREF.

At the time T18, the sequencer 180 drops the voltage TRX_ON from the H level to the L level. In this manner, application of the voltage VBL and the reference voltage VREF to the operational amplifier OA is stopped (step S93 in FIG. 36).

At time T19, the sequencer 180 raises the voltage SAN from the L level to the H level. In this manner, the operational amplifier OA is driven (step S94 in FIG. 36).

During a period from time T19 to time T20, since a voltage of the node SN becomes lower than a voltage of the node RN, the operational amplifier OA outputs a voltage at the L level as the voltage VOUT.

At time T20, the sequencer 180 drops the voltage SAN from the H level to the L level. In this manner, the operational amplifier OA stops being driven (step S95 in FIG. 36).

<6-3> Effects

The configuration according to the present embodiment is applicable to the first embodiment. As a matter of course, the sense amplifier module SA according to the present embodiment is applicable to the second embodiment to the fourth embodiment. The sense amplifier module SA according to the present embodiment is applicable to the memory chip 100 according to the modification of the first embodiment.

<7> Seventh Embodiment

The memory chip 100 according to a seventh embodiment will be described. The memory chip 100 according to the present embodiment uses a flip-flop circuit F/F instead of the operational amplifier OA (OA0 to OA6) within the sense amplifier module SA included in the memory chip 100 according to the first embodiment.

<7-1> Configuration of Sense Amplifier Module SA

First, details of the configuration of the sense amplifier module SA within the sense amplifier 140 included in the memory chip 100 according to the present embodiment will be described with reference to FIG. 39. FIG. 39 is a circuit diagram showing an example of a configuration of the sense amplifier module SA included in the memory chip 100 according to the present embodiment. FIG. 39 omits the voltage detection circuit SC, the latch circuit LC, and the logical operation circuit 141 within the sense amplifier module SA.

As shown in FIG. 39, the sense amplifier module SA includes the switches SWtr0 and Swtr1, the equalizer EQ, and the flip-flop circuit F/F. The switches SWtr0 and SWtr1 and the equalizer EQ are provided for each flip-flop circuit F/F.

The switches SWtr0 and SWtr1 are the same as those in the fifth embodiment shown in FIG. 32. The equalizer EQ is the same as that in the fifth embodiment shown in FIG. 33.

The flip-flop circuit F/F is coupled to the nodes SN and RN and outputs a voltage VOUT based on a voltage of the node SN and a voltage of the node RN. Details of the circuit F/F will be described later.

<7-2> Configuration of Flip-Flop Circuit F/F

Next, details of a configuration of the flip-flop circuit F/F within the sense amplifier 140 included in the memory chip 100 according to the present embodiment will be described with reference to FIG. 40. FIG. 40 is a circuit diagram showing an example of a configuration of a flip-flop circuit F/F within the sense amplifier module SA included in the memory chip 100 according to the present embodiment.

As shown in FIG. 40, the flip flop circuit F/F includes p-channel MOS transistors TR20 to TR22, n-channel MOS transistors TR23 to TR25, and inverter circuits INV0 and INV1. The transistors TR20 and TR25 are drive transistors, and the transistors TR21 to TR24 are input transistors.

The voltage /SAP is applied to a gate of the transistor TR20. The voltage VDD is applied to a source of the transistor TR20. A drain of the transistor TR20 is coupled to a node N8.

A gate of the transistor TR21 is coupled to the node RN. A source of the transistor TR21 is coupled to the node N8. A drain of the transistor TR21 is coupled to the node SN.

A gate of the transistor TR22 is coupled to the node SN. A source of the transistor TR22 is coupled to the node N8. A drain of the transistor TR22 is coupled to the node RN.

A gate of the transistor TR23 is coupled to the node RN. A drain of the transistor TR23 is coupled to the node SN. A source of the transistor TR23 is coupled to a node N9.

A gate of the transistor TR24 is coupled to the node SN. A drain of the transistor TR24 is coupled to the node RN. A source of the transistor TR24 is coupled to the node N9.

The voltage SAN is applied to a gate of the transistor TR25. A drain of the transistor TR25 is coupled to the node N9. The ground voltage VSS is applied to a source of the transistor TR25.

The inverter circuit INV0 supplies, to the inverter circuit INV1, a voltage obtained by inverting a logic level of a voltage of the node SN.

The inverter circuit INV1 outputs, as VOUT, a voltage obtained by inverting a logic level of a voltage supplied from the inverter circuit INV0.

The flip-flop circuit F/F outputs an output voltage of the inverter circuit INV1 as VOUT.

<7-3> Operation of Sense Amplifier Module SA

Figure 42:
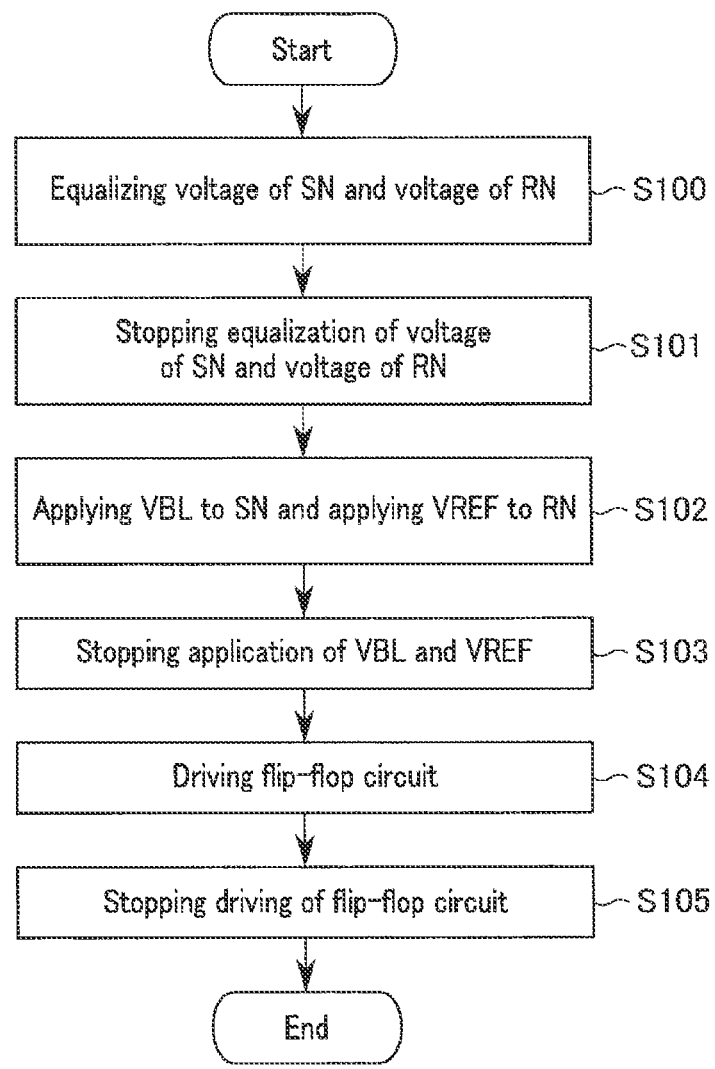
FIG. 42 is a flowchart showing the sense operation of the sense amplifier module included in the memory chip according to the seventh embodiment.

Next, an operation of the sense amplifier module SA within the sense amplifier 140 included in the memory chip 100 according to the present embodiment will be described with reference to FIGS. 41 and 42. FIG. 41 is a timing chart of various signals during a sense operation of the sense amplifier module SA included in the memory chip 100 according to the present embodiment. FIG. 42 is a flowchart showing an example of a sense operation of the sense amplifier module SA included in the memory chip 100 according to the present embodiment.

An operation of the sense amplifier module SA described below corresponds to the operation performed in step S11 of the first embodiment shown in FIG. 14.

As shown in FIG. 41, at the time T10, the sequencer 180 raises the voltage EQ_ON from the L level to the H level.

This causes the equalizer EQ to equalize a voltage of the node SN and a voltage of the node RN (step S100 in FIG. 42).

At the time T11, the sequencer 180 drops the voltage EQ_ON from the H level to the L level. This causes the equalizer EQ to stop equalizing a voltage of the node SN and a voltage of the node RN (step S101 in FIG. 42).

At the time T12, the sequencer 180 raises the voltage TRX_ON from the L level to the H level. In this manner, the voltage VBL is applied to the node SN, whereas the reference voltage VREF is applied to the node RN (step S102 in FIG. 42).

At the time T13, the sequencer 180 drops the voltage TRX_ON from the H level to the L level. In this manner, application of the voltage VBL and the reference voltage VREF to the flip-flop circuit F/F is stopped (step S103 in FIG. 42).

At the time T14, the sequencer 180 drops the voltage /SAP from the H level to the L level and raises the voltage SAN from the L level to the H level. Accordingly, the transistors TR20 and TR25 within the flip-flop circuit F/F are turned on. In this manner, the flip-flop circuit F/F is driven (step S104 in FIG. 42).

More specifically, during a period from the time T14 to the time T15, since a voltage of the node SN is higher than a voltage of the node RN, the transistor TR22 within the flip-flop circuit F/F is turned off, whereas the transistor TR24 within the flip-flop circuit F/F is turned on. As a result, a voltage of the node RN becomes the voltage VSS. Accordingly, the transistor TR21 is turned on, whereas the transistor TR23 is turned off. As a result, a voltage of the node SN becomes the voltage VDD. Accordingly, the flip-flop circuit F/F outputs, as the voltage VOUT, a voltage (VDD) at the H level through the inverter circuits INV0 and INV1.

At the time T15, the sequencer 180 raises the voltage /SAP from the L level to the H level and drops the voltage SAN from the H level to the L level. Accordingly, the transistors TR20 and TR25 within the flip-flop circuit F/F are turned off. In this manner, the flip-flop circuit F/F stops being driven (step S105 in FIG. 42).

An operation of the sense amplifier module SA after time T16 is the same as the operation during the period from the time T10 to the time T15.

At the time T17, the sequencer 180 raises the voltage TRX_ON from the L level to the H level. In this manner, the voltage VBL is applied to the node SN, whereas the reference voltage VREF is applied to the node RN (step S102 in FIG. 42). During a period from time T17 to time T18, the voltage VBL becomes lower than the reference voltage VREF.

At the time T18, the sequencer 180 drops the voltage TRX_ON from the H level to the L level. In this manner, application of the voltage VBL and the reference voltage VREF to the flip-flop circuit F/F is stopped (step S103 in FIG. 42).

At the time T19, the sequencer 180 drops the voltage /SAP from the H level to the L level and raises the voltage SAN from the L level to the H level. In this manner, the flip-flop circuit F/F is driven (step S104 in FIG. 42).

More specifically, during a period from the time T19 to the time T20, since a voltage of the node SN is lower than a voltage of the node RN, the transistor TR22 within the flip-flop circuit F/F is turned on, whereas the transistor TR24 within the flip-flop circuit F/F is turned off. As a result, a voltage of the node RN becomes the voltage VDD.

Accordingly, the transistor TR21 is turned off, whereas the transistor TR23 is turned on. As a result, a voltage of the node SN becomes the voltage VSS. Accordingly, the flip-flop circuit F/F outputs, as the voltage VOUT, a voltage (VSS) at the L level through the inverter circuits INV0 and INV1.

At the time T20, the sequencer 180 raises the voltage /SAP from the L level to the H level and drops the voltage SAN from the H level to the L level. In this manner, the flip-flop circuit F/F stops being driven (step S105 in FIG. 42).

<7-4> Effects

The configuration according to the present embodiment is applicable to the first embodiment. As a matter of course, the sense amplifier module SA according to the present embodiment is applicable to the second embodiment to the fourth embodiment. The sense amplifier module SA according to the present embodiment is applicable to the memory chip 100 according to the modification of the first embodiment.

<8> Eighth Embodiment

The memory chip 100 according to an eighth embodiment will be described. Unlike the seventh embodiment, in the memory chip 100 according to the present embodiment, the bit line BL is not directly coupled to the node SN within the sense amplifier module SA, and the reference voltage VREF is not directly applied to the node RN within the sense amplifier module SA. The following description will in principle concentrate on the features different from the seventh embodiment.

<8-1> Configuration of Sense Amplifier Module SA

First, details of the configuration of the sense amplifier module SA within the sense amplifier 140 included in the memory chip 100 according to the present embodiment will be described with reference to FIG. 43. FIG. 43 is a circuit diagram showing an example of a configuration of the sense amplifier module SA included in the memory chip 100 according to the present embodiment. FIG. 43 omits the voltage detection circuit SC, the latch circuit LC, and the logical operation circuit 141 within the sense amplifier module SA.

As shown in FIG. 43, the sense amplifier module SA includes the switches SWtr0 and SWtr1, the equalizer EQ, the flip-flop circuit F/F, and the p-channel MOS transistors TR26 to TR29. The switches SWtr0 and SWtr1, the equalizer EQ, and the p-channel MOS transistors TR26 to TR29 are provided for each flip-flop circuit F/F.

The switch SWtr0 couples the node SN to a node N10. The switch SWtr0 is the same as that in the fifth embodiment shown in FIG. 32. One end of the transistor TR0 and one end of the transistor TR1 are coupled to the node N10.

The switch SWtr1 couples the node RN to a node N11. The switch SWtr1 is the same as that in the fifth embodiment shown in FIG. 32. One end of the transistor TR2 and one end of the transistor TR3 are coupled to the node N11.

The equalizer EQ is the same as that in the fifth embodiment shown in FIG. 33. The flip-flop circuit F/F is the same as that in the seventh embodiment shown in FIG. 40.

The voltage VBL is applied to a gate of the transistor TR26. A source of the transistor TR26 is coupled to the node N10. The ground voltage VSS is applied to a drain of the transistor TR26.

A voltage PGATE is applied to a gate of the transistor TR27. The voltage PGATE is generated by a gate voltage generator (not shown in FIG. 43) to be described later. The voltage PGATE is, for example, 2 [V]. The voltage VDD is applied to a source of the transistor TR27. A drain of the transistor TR27 is coupled to the node N10.

The reference voltage VREF is applied to a gate of the transistor TR28. A source of the transistor TR28 is coupled to the node N11. The ground voltage VSS is applied to a drain of the transistor TR28.

The voltage PGATE is applied to a gate of the transistor TR29. The voltage VDD is applied to a source of the transistor TR29. A drain of the transistor TR29 is coupled to the node N11.

<8-2> Configuration of Gate Voltage Generator

Figure 44:
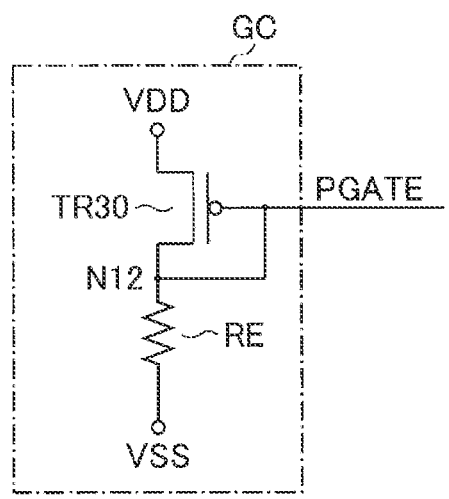
FIG. 44 is a circuit diagram showing a configuration of a gate voltage generator within the sense amplifier module included in the memory chip according to the eighth embodiment.

Next, details of a configuration of the gate voltage generator within the sense amplifier module SA included in the memory chip 100 according to the present embodiment will be described with reference to FIG. 44. FIG. 44 is a circuit diagram showing an example of a configuration of the gate voltage generator within the sense amplifier module SA included in the memory chip 100 according to the present embodiment.

As shown in FIG. 44, a gate voltage generator GC includes a p-channel MOS transistor TR30 and a resistance element RE.

The voltage PGATE is applied to a gate of the transistor TR30. A gate of the transistor TR30 is coupled to a node N12. The voltage VDD is applied to a source of the transistor TR30. A drain of the transistor TR30 is coupled to the node N12.

One end of the resistance element RE is coupled to the node N12. The ground voltage VSS is applied to the other end of the resistance element RE. A resistance value of the resistance element RE is, for example, 10 [MI].

When the voltage VDD rises after the memory chip 100 is powered on, a current starts to flow through the resistance element RE, and the voltage PGATE rises from the L level. After a certain period of time has elapsed, the voltage PGATE becomes a fixed voltage (for example, 2 [V]). This voltage is applied to each of the gates of the transistors TR27 and TR29.

<8-3> Operation of Sense Amplifier Module SA

Figure 45:
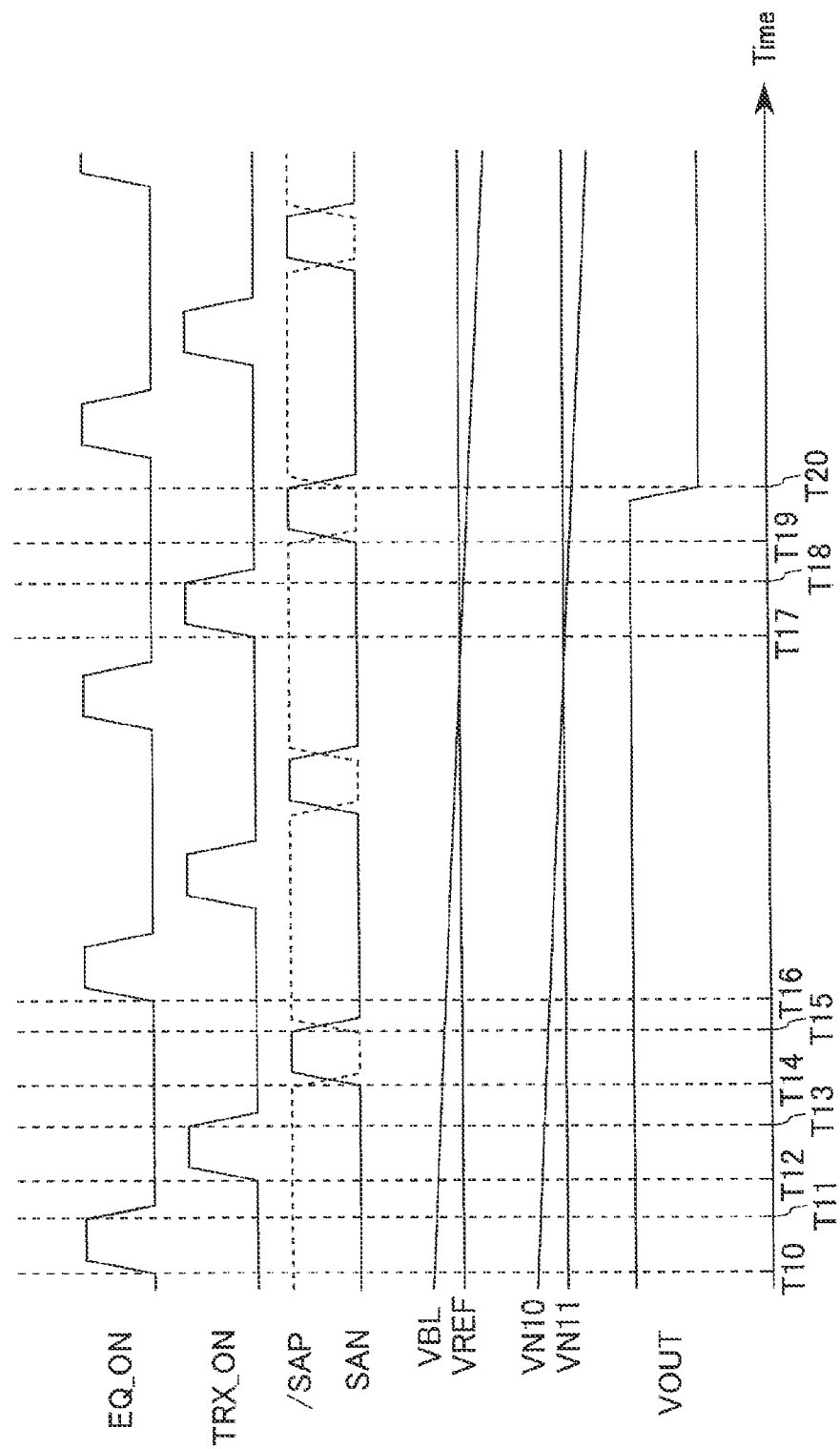
FIG. 45 is a timing chart of various signals during a sense operation of the sense amplifier module included in the memory chip according to the eighth embodiment.

Next, an operation of the sense amplifier module SA within the sense amplifier 140 included in the memory chip 100 according to the present embodiment will be described with reference to FIGS. 45 and 46. FIG. 45 is a timing chart of various signals during a sense operation of the sense amplifier module SA included in the memory chip 100 according to the present embodiment. FIG. 46 is a flowchart showing an example of a sense operation of the sense amplifier module SA included in the memory chip 100 according to the present embodiment.

An operation of the sense amplifier module SA described below corresponds to the operation performed in step S11 of the first embodiment shown in FIG. 14.

As shown in FIG. 45, at the time T10, the sequencer 180 raises the voltage EQ_ON from the L level to the H level. This causes the equalizer EQ to equalize a voltage of the node SN and a voltage of the node RN (step S110 in FIG. 46).

At the time T11, the sequencer 180 drops the voltage EQ_ON from the H level to the L level. This causes the equalizer EQ to stop equalizing a voltage of the node SN and a voltage of the node RN (step S111 in FIG. 46).

At the time T12, the sequencer 180 raises the voltage TRX_ON from the L level to the H level. In this manner, a voltage based on the voltage VBL (a voltage VN10 of the node N10) is applied to the node SN, and a voltage based on the reference voltage VREF (a voltage VN11 of the node N11) is applied to the node RN (step S112 in FIG. 46).

More specifically, during a period from the time T12 to the time T13, the transistors TR28 and TR29 are turned on. An on resistance value of the transistor TR28 is based on the reference voltage VREF. Accordingly, the voltage VN11 of the node N11 depends on the reference voltage VREF and becomes higher than the voltage VSS and lower than the voltage VDD. Thus, during the period from the time T12 to the time T13, the voltage VN11 that is higher than the voltage VSS and lower than the voltage VDD is applied to the node RN. Furthermore, during the period from the time T12 to the time T13, since the voltage VBL is higher than the reference voltage VREF, the voltage VN10 of the node N10 depends on the voltage VBL and becomes higher than the voltage VN11 of the node N11 and lower than the voltage VDD. Accordingly, during the period from the time T12 to the time T13, the voltage VN10 that is higher than the voltage VN11 and lower than the voltage VDD is applied to the node SN.

At the time T13, the sequencer 180 drops the voltage TRX_ON from the H level to the L level. In this manner, application of the voltage VN10 to the node SN and application of the voltage VN11 to the node RN are stopped (step S113 in FIG. 46).

At the time T14, the sequencer 180 drops the voltage /SAP from the H level to the L level and raises the voltage SAN from the L level to the H level. In this manner, the flip-flop circuit F/F is driven (step S114 in FIG. 46).

More specifically, during a period from the time T14 to the time T15, since a voltage of the node SN is higher than a voltage of the node RN, the transistor TR22 within the flip-flop circuit F/F is turned off, whereas the transistor TR24 within the flip-flop circuit F/F is turned on. As a result, a voltage of the node RN becomes the voltage VSS. Accordingly, the transistor TR21 is turned on, whereas the transistor TR23 is turned off. As a result, a voltage of the node SN becomes the voltage VDD. Accordingly, the flip-flop circuit F/F outputs, as the voltage VOUT, a voltage (VDD) at the H level through the inverter circuits INV0 and INV1.

At the time T15, the sequencer 180 raises the voltage /SAP from the L level to the H level, and drops the voltage SAN from the H level to the L level. In this manner, the flip-flop circuit F/F stops being driven (step S115 in FIG. 46).

An operation of the sense amplifier module SA after the time T16 is the same as the operation during the period from the time T10 to the time T15.

At the time T17, the sequencer 180 raises the voltage TRX_ON from the L level to the H level. In this manner, the voltage VN10 is applied to the node SN, and the voltage VN11 is applied to the node RN (step S112 in FIG. 46).

More specifically, during a period from the time T17 to the time T18, the voltage VN11 that is higher than the voltage VSS and lower than the voltage VDD is applied to the node RN. Furthermore, during the period from the time T17 to the time T18, since the voltage VBL is lower than the reference voltage VREF, the voltage VN10 of the node N10 depends on the voltage VBL and becomes higher than the voltage VSS and lower than the voltage VN11 of the node N11. Thus, during the period from the time T17 to the time T18, the voltage VN10 that is higher than the voltage VSS and lower than the voltage NN11 is applied to the node SN.

At the time T18, the sequencer 180 drops the voltage TRX_ON from the H level to the L level. In this manner, application of the voltage VN10 to the node SN and application of the voltage VN11 to the node RN are stopped (step S113 in FIG. 46).

At the time T19, the sequencer 180 drops the voltage /SAP from the H level to the L level and raises the voltage SAN from the L level to the H level. In this manner, the flip-flop circuit F/F is driven (step S114 in FIG. 46).

More specifically, during a period from the time T19 to the time T20, since a voltage of the node SN is lower than a voltage of the node RN, the transistor TR22 within the flip-flop circuit F/F is turned on, whereas the transistor TR24 within the flip-flop circuit F/F is turned off. As a result, a voltage of the node RN becomes the voltage VDD. Accordingly, the transistor TR21 is turned off, whereas the transistor TR23 is turned on. As a result, a voltage of the node SN becomes the voltage VSS. In this manner, the flip-flop circuit F/F outputs, as the voltage VOUT, a voltage (VSS) at the L level through the inverter circuits INV0 and INV1.

At the time T20, the sequencer 180 raises the voltage /SAP from the L level to the H level and drops the voltage SAN from the H level to the L level. In this manner, the flip-flop circuit F/F stops being driven (step S115 in FIG. 46).

Next, a timing when the output voltage VOUT of the flip-flop circuit F/F switches from the H level to the L level will be described with reference to FIG. 47. FIG. 47 is a view showing an example of a relationship among a resistance state RS of the memory element MR, the number of clocks, and an output voltage of the flip-flop circuit F/F after the read voltage Vread is applied to the selected bit line BL in the memory chip 100 according to the present embodiment.

In FIG. 47, the "number of clocks" indicates the number of times the clock signal CLK rises from the L level to the H level, and counting of the number of clocks is started when the read voltage Vread is applied to the selected bit line BL. The clock signal CLK determines a timing for raising the voltage EQ_ON, which the sequencer 180 supplies to the equalizer EQ, from the L level to the H level. The sequencer 180 raises the voltage EQ_ON from the L level to the H level in synchronization with rising of the clock signal CLK, for example. "H/L" is a value of the output voltage VOUT of the flip-flop circuit F/F. Regarding the resistance state RS7, the output voltage VOUT is at the H level (fixed), and values of the output voltage VOUT are indicated by "-".

In FIG. 47, a transition of timing when the output voltage VOUT in each resistance state changes from the H level to the L level is indicated by an arrow for each reference voltage. From the result shown in FIG. 47, it is understood that as the resistance state becomes higher, a timing when the output voltage VOUT of the flip-flop circuit F/F switches from the H level to the L level is further delayed.

As shown in FIG. 47, in the case where the resistance state of the memory element MR is the resistance state RS0 ("000"), the voltage VOUT transitions to the L level when the number of clocks reaches three. In the case where the resistance state of the memory element MR is the resistance state RS1 ("001"), the voltage VOUT transitions to the L level when the number of clocks reaches four. In the case where the resistance state of the memory element MR is the resistance state RS2 ("010"), the voltage VOUT transitions to the L level when the number of clocks reaches six. In the case where the resistance state of the memory element MR is the resistance state RS3 ("011"), the voltage VOUT transitions to the L level when the number of clocks reaches nine. In the case where the resistance state of the memory element MR is the resistance state RS4 ("100"), the voltage VOUT transitions to the L level when the number of clocks reaches five. In the case where the resistance state of the memory element MR is the resistance state RS5 ("101"), the voltage VOUT transitions to the L level when the number of clocks reaches eight. In the case where the resistance state of the memory element MR is the resistance state RS6 ("110"), the voltage VOUT transitions to the L level when the number of clocks reaches 15.

<8-4> Effects

The configuration according to the present embodiment is applicable to the first embodiment.

In the flip-flop circuit F/F, each of the node SN portion and the node RN portion may have a parasitic capacitance (for example, 20 [fF]). With this parasitic capacitance, there is a possibility that the switch SWtr0 will be turned on and every time the voltage VBL of the bit line BL is supplied to the node SN, the voltage VBL may drop or rise.

In the sense amplifier module SA according to the present embodiment, the bit line BL is not directly coupled to the node SN. Accordingly, the voltage VBL can be prevented from fluctuating by the switch SWtr0 being turned on. This achieves an improved operation reliability of the memory device.

As a matter of course, the sense amplifier module SA according to the present embodiment is applicable to the second embodiment to the fourth embodiment. The sense amplifier module SA according to the present embodiment is applicable to the memory chip 100 according to the modification of the first embodiment.

<9> Ninth Embodiment

The memory chip 100 according to a ninth embodiment will be described. Unlike the eighth embodiment, in the memory chip 100 according to the present embodiment, the switches SWtr0 and SWtr1 are not provided in the sense amplifier module SA. The following description will in principle concentrate on the features different from the eighth embodiment.

<9-1> Configuration of Sense Amplifier Module SA

First, details of the configuration of the sense amplifier module SA within the sense amplifier 140 included in the memory chip 100 according to the present embodiment will be described with reference to FIG. 48. FIG. 48 is a circuit diagram showing an example of a configuration of the sense amplifier module SA included in the memory chip 100 according to the present embodiment. FIG. 48 omits the voltage detection circuit SC, the latch circuit LC, and the logical operation circuit 141 within the sense amplifier module SA.

As shown in FIG. 48, the sense amplifier module SA includes the equalizer EQ, the flip-flop circuit F/F, the p-channel MOS transistors TR26 to TR29, TR32, and TR34, and the n-channel MOS transistors TR31 and TR33. The equalizer EQ and the transistors TR26 to TR34 are provided for each flip-flop circuit F/F.

The equalizer EQ is the same as that in the fifth embodiment shown in FIG. 33. The flip-flop circuit F/F is the same as that in the seventh embodiment shown in FIG. 40.

The voltage VBL is applied to a gate of the transistor TR26. A source of the transistor TR26 is coupled to the node SN. A drain of the transistor TR26 is coupled to a node N13.

The voltage PGATE is applied to a gate of the transistor TR27. The voltage VDD is applied to a source of the transistor TR27. A drain of the transistor TR27 is coupled to a node N14.

The reference voltage VREF is applied to a gate of the transistor TR28. A source of the transistor TR28 is coupled to the node RN. A drain of the transistor TR28 is coupled to a node N15.

The voltage PGATE is applied to a gate of the transistor TR29. The voltage VDD is applied to a source of the transistor TR29. A drain of the transistor TR29 is coupled to a node N16.

A voltage SWGATE is applied to a gate of the transistor TR31. A drain of the transistor TR31 is coupled to the node N13. The ground voltage VSS is applied to a source of the transistor TR31.

A voltage /SWGATE is applied to a gate of the transistor TR32. The voltage /SWGATE is a voltage obtained by inverting a logical level of the voltage SWGATE. A source of the transistor TR32 is coupled to the node N14. The drain of the transistor TR32 is coupled to the node SN.

The voltage SWGATE is applied to a gate of the transistor TR33. A drain of the transistor TR33 is coupled to the node N15. The ground voltage VSS is applied to a source of the transistor TR33.

A voltage /SWGATE is applied to a gate of the transistor TR34. A source of the transistor TR34 is coupled to the node N16. A drain of the transistor TR34 is coupled to the node RN.

<9-2> Operation of Sense Amplifier Module SA

Figure 49:
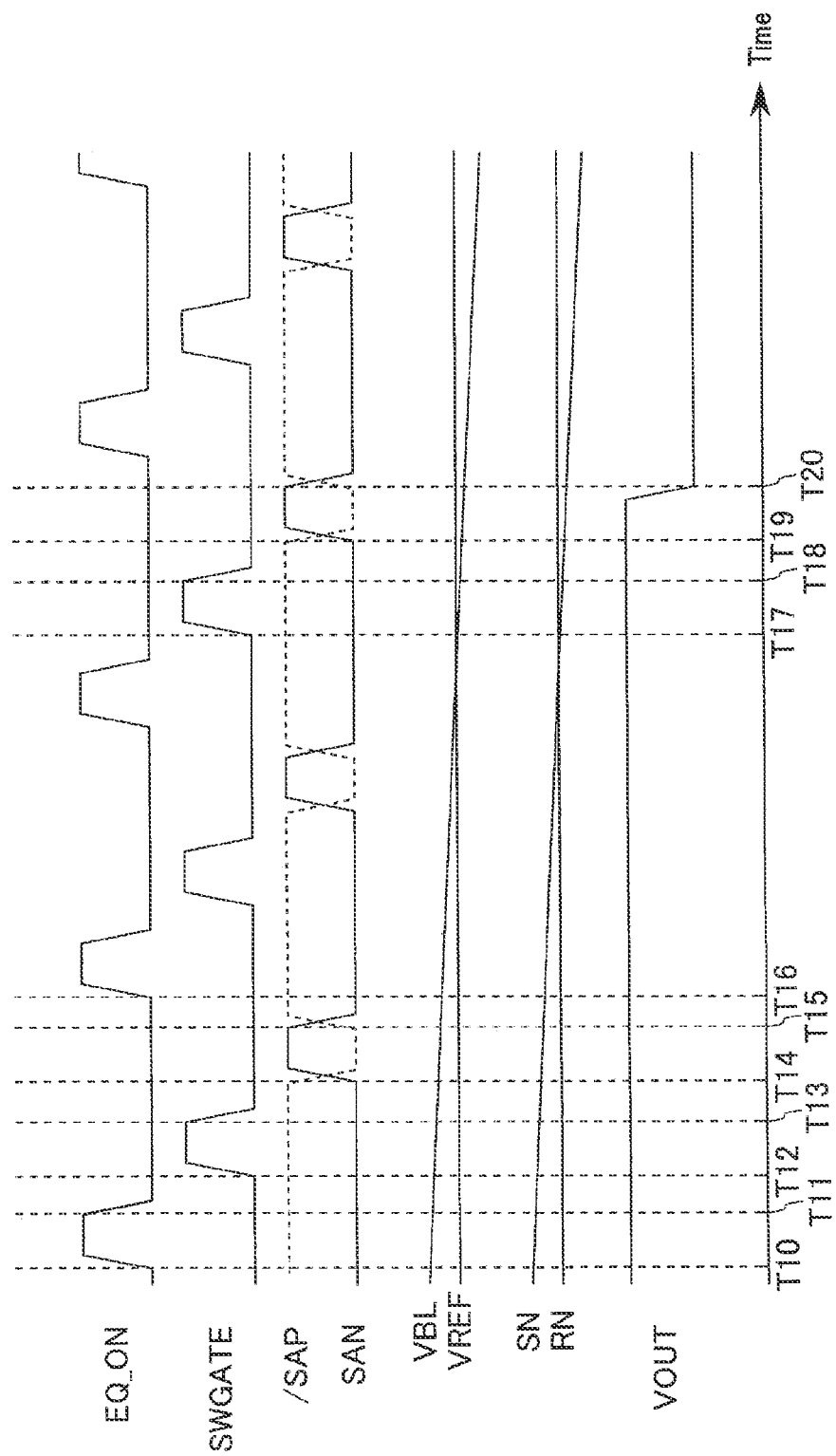
FIG. 49 is a timing chart of various signals during a sense operation of the sense amplifier module included in the memory chip according to the ninth embodiment.

Next, an operation of the sense amplifier module SA within the sense amplifier 140 included in the memory chip 100 according to the present embodiment will be described with reference to FIG. 49. FIG. 49 is a timing chart of various signals during a sense operation of the sense amplifier module SA included in the memory chip 100 according to present embodiment. The flowchart showing an example of the sense operation of the sense amplifier module SA included in the memory chip 100 according to the present embodiment is the same as that in the eighth embodiment shown in FIG. 46.

An operation of the sense amplifier module SA described below corresponds to the operation performed in step S11 of the first embodiment shown in FIG. 14.

As shown in FIG. 49, at time T10, the sequencer 180 raises the voltage EQ_ON from the L level to the H level. This causes the equalizer EQ to equalize a voltage of the node SN and a voltage of the node RN (step S110 in FIG. 46).

At the time T11, the sequencer 180 drops the voltage EQ_ON from the H level to the L level. This causes the equalizer EQ to stop equalizing a voltage of the node SN and a voltage of the node RN (step S111 in FIG. 46).

At the time T12, the sequencer 180 raises the voltage SWGATE from the L level to the H level. Accordingly, the transistors TR31 and TR32 are turned on, and the transistor TR33 or TR34 is turned on. In this manner, a voltage based on the voltage VBL is applied to the node SN, and a voltage based on the reference voltage VREF is applied to the node RN (step S112 in FIG. 46).

More specifically, during a period from the time T12 to the time T13, the transistors TR28 and TR29 are in an on state. An on resistance value of the transistor TR28 is based on the reference voltage VREF. Accordingly, a voltage of the node RN depends on the reference voltage VREF and becomes higher than the voltage VSS and lower than the voltage VDD. Thus, during the period from the time T12 to the time T13, a voltage that is higher than the voltage VSS and lower than the voltage VDD is applied to the node RN. Furthermore, during the period from the time T12 to the time T13, since the voltage VBL is higher than the reference voltage VREF, a voltage of the node SN depends on the voltage VBL and is higher than a voltage of the node RN and lower than the voltage VDD. Accordingly, during the period from the time T12 to the time T13, a voltage that is higher than a voltage of the node RN and lower than the voltage VDD is applied to the node SN.

At time T13, the sequencer 180 drops the voltage SWGATE from the H level to the L level. In this manner, application of a voltage based on the voltage VBL to the node SN and application of a voltage based on the reference voltage VREF to the node RN are stopped (step S113 in FIG. 46).

At the time T14, the sequencer 180 drops the voltage /SAP from the H level to the L level and raises the voltage SAN from the L level to the H level. In this manner, the flip-flop circuit F/F is driven (step S114 in FIG. 46).

More specifically, during a period from the time T14 to the time T15, since a voltage of the node SN is higher than a voltage of the node RN, the transistor TR22 within the flip-flop circuit F/F is turned off, whereas the transistor TR24 within the flip-flop circuit F/F is turned on. As a result, a voltage of the node RN becomes the voltage VSS. Accordingly, the transistor TR21 is turned on, whereas the transistor TR23 is turned off. As a result, a voltage of the node SN becomes the voltage VDD. In this manner, the flip-flop circuit F/F outputs, as the voltage VOUT, a voltage (VDD) at the H level through the inverter circuits INV0 and INV1.

At the time T15, the sequencer 180 raises the voltage /SAP from the L level to the H level and drops the voltage SAN from the H level to the L level. In this manner, the flip-flop circuit F/F stops being driven (step S115 in FIG. 46).

An operation of the sense amplifier module SA after time T16 is the same as the operation during the period from the time T10 to the time T15.

At the time T17, the sequencer 180 raises the voltage SWGATE from the L level to the H level. In this manner, a voltage based on the voltage VBL is applied to the node SN, and a voltage based on the reference voltage VREF is applied to the node RN (step S112 in FIG. 46).

More specifically, during a period from the time T17 to the time T18, a voltage that is higher than the voltage VSS and lower than the voltage VDD is applied to the node RN. Furthermore, during the period from the time T17 to the time T18, since the voltage VBL is lower than the reference voltage VREF, a voltage of the node SN depends on the voltage VBL and is higher than the voltage VSS and lower than a voltage of the node RN. Thus, during the period from the time T17 to the time T18, a voltage that is higher than the voltage VSS and lower than a voltage of the node RN is applied to the node SN.

At the time T18, the sequencer 180 drops the voltage SWGATE from the H level to the L level. In this manner, application of a voltage based on the voltage VBL to the node SN and application of a voltage based on the reference voltage VREF to the node RN are stopped (step S113 in FIG. 46).

At the time T19, the sequencer 180 drops the voltage /SAP from the H level to the L level and raises the voltage SAN from the L level to the H level. In this manner, the flip-flop circuit F/F is driven (step S114 in FIG. 46).

More specifically, during a period from the time T19 to the time T20, since a voltage of the node SN is lower than a voltage of the node RN, the transistor TR22 within the flip-flop circuit F/F is turned on, whereas the transistor TR24 within the flip-flop circuit F/F is turned off. As a result, a voltage of the node RN becomes the voltage VDD. Accordingly, the transistor TR21 is turned off, whereas the transistor TR23 is turned on. As a result, a voltage of the node SN becomes the voltage VSS. In this manner, the flip-flop circuit F/F outputs, as the voltage VOUT, a voltage (VSS) at the L level through the inverter circuits INV0 and INV1.

At the time T20, the sequencer 180 raises the voltage /SAP from the L level to the H level and drops the voltage SAN from the H level to the L level. In this manner, the flip-flop circuit F/F stops being driven (step S115 in FIG. 46).

<9-3> Effects

The configuration according to the present embodiment is applicable to the first embodiment. In the sense amplifier module SA according to the present embodiment, since the bit line BL is not directly coupled to the node SN, the fluctuation of the voltage VBL can be prevented as with the eighth embodiment. This achieves an improved operation reliability of the memory device. As a matter of course, the sense amplifier module SA according to the present embodiment is applicable to the second embodiment to the fourth embodiment. The sense amplifier module SA according to the present embodiment is applicable to the memory chip 100 according to the modification of the first embodiment.

<10> Tenth Embodiment

The memory chip 100 according to a tenth embodiment will be described. Unlike the fifth embodiment, in the memory chip 100 according to the present embodiment, the sense amplifier module SA according to the fifth embodiment is applied to the third embodiment, and further, a counter for controlling a sense timing is provided within the sense amplifier module SA. The following description will in principle concentrate on the features different from the fifth embodiment.

<10-1> Configuration of Sense Amplifier Module SA

Figure 50:
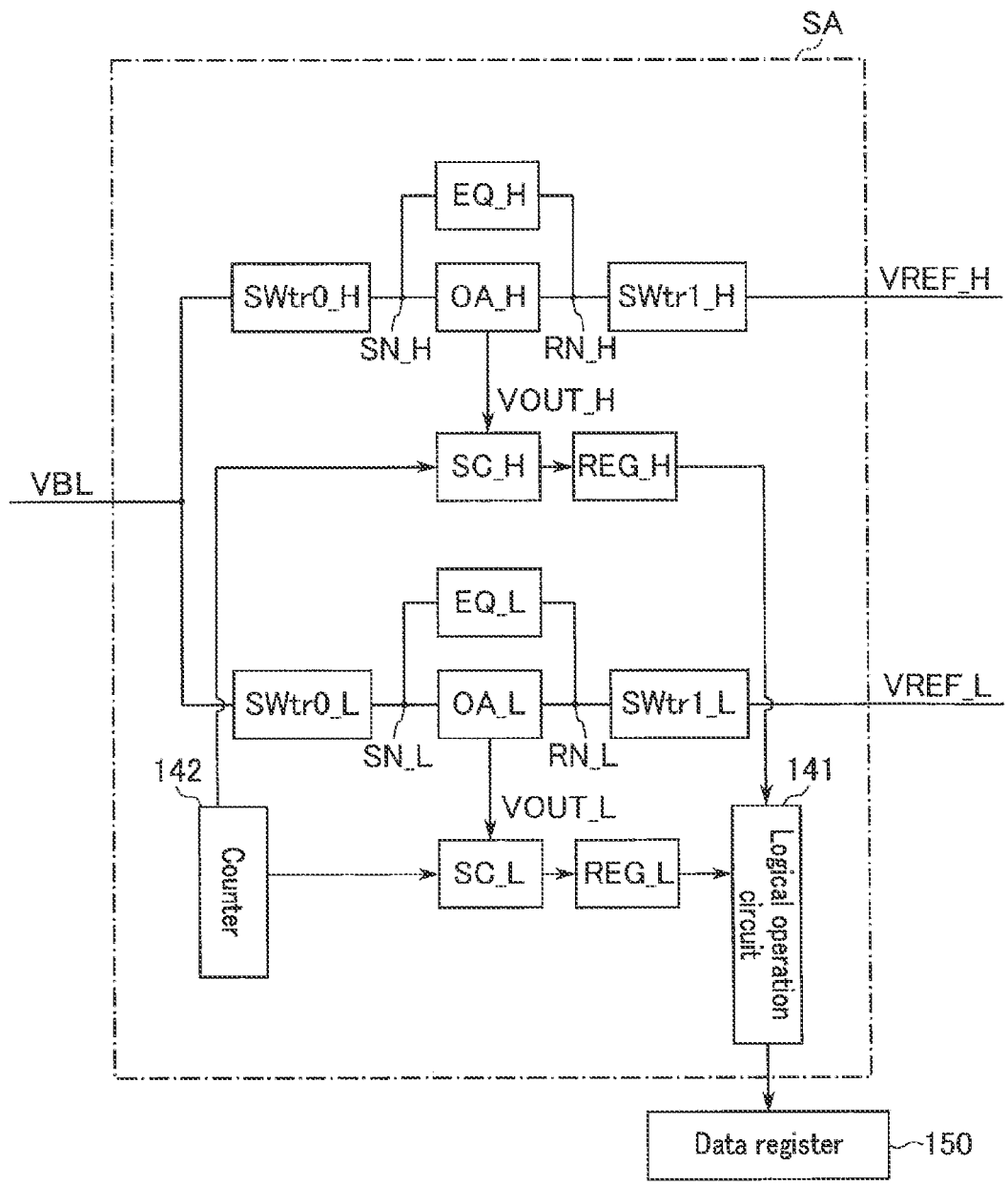
FIG. 50 is a block diagram showing a configuration of a sense amplifier module within a sense amplifier included in a memory chip according to a tenth embodiment.

First, details of the configuration of the sense amplifier module SA within the sense amplifier 140 included in the memory chip 100 according to the present embodiment will be described with reference to FIG. 50. FIG. 50 is a block diagram showing an example of a configuration of the sense amplifier module SA included in the memory chip 100 according to the present embodiment. FIG. 50 omits constituent elements such as a function block, interconnect, etc., for transmitting write data DAT from the data register 150 to the bit line BL.

The sense amplifier module SA includes the operational amplifiers OA_L and OA_H, the switches SWtr0_L and SWtr0_H, the switches SWtr1_L and SWtr1_H, the equalizers EQ_L and EQ_H, the voltage detection circuits SC_L and SC_H, the registers REG_L and REG_H, the logical operation circuit 141, and the counter 142.

The operational amplifiers OA_L and OA_H are the same as the operational amplifier OA in the fifth embodiment shown in FIG. 34. Hereinafter, the voltage /SAP that is supplied to the operational amplifier OA_L will be referred to as "voltage /SAP_L", whereas the voltage /SAP that is supplied to the operational amplifier OA_H will be referred to as "voltage /SAP_H".

The switches SWtr0_L and SWtr0_H are the same as the switch SWtr0 in the fifth embodiment shown in FIG. 32. The switches SWtr1_L and SWtr1_H are the same as the switch SWtr1 in the fifth embodiment shown in FIG. 32. Hereinafter, the voltages TRX_ON and /TRX_ON that are supplied to the switches SWtr0_L and SWtr1_L will be referred to as "a voltage TRX_ON_L and a voltage /TRX_ON_L", whereas the voltages TRX_ON and /TRX_ON that are supplied to the switches SWtr0_H and SWtr1_H will be referred to as "a voltage TRX_ON_H and a voltage /TRX_ON_H".

The equalizers EQ_L and EQ_H are the same as the equalizer EQ in the fifth embodiment shown in FIG. 33. Hereinafter, the voltages EQ_ON and /EQ_ON that are supplied to the equalizer EQ_L will be referred to as "a voltage EQ_ON_L and a voltage /EQ_ON_L", whereas the voltages EQ_ON and /EQ_ON that are supplied to the equalizer EQ_H will be referred to as "a voltage EQ_ON_H and a voltage /EQ_ON_H".

The registers REG_L and REG_H are the same as those in the third embodiment shown in FIG. 22. The register REG_L includes a plurality of latch circuits LC_L, and the register REG_H includes a plurality of latch circuits LC_H.

The voltage detection circuit SC_L detects whether or not the voltage VOUT_L supplied from the operational amplifier OA_L is at the L level and transmits a detection result to the register REG_L. The voltage detection circuit SC_H detects whether or not the voltage VOUT_H supplied from the operational amplifier OA_H is at the L level and transmits a detection result to the register REG_H. More specifically, in the case where the voltage VOUT_L is at the L level, the voltage detection circuit SC_L transmits, to the latch circuit LC_L of the register REG_L, a counter value CNT at the time when it is detected that the voltage VOUT_L is at the L level, and the latch circuit LC_L stores the counter value CNT. On the other hand, in the case where the voltage VOUT_L is at the H level, the voltage detection circuit SC_L does not transmit, to the latch circuit LC_L, a counter value at the time when the voltage VOUT_L is detected. In the case of the voltage VOUT_H being at the "L level/H level", the voltage detection circuit SC_H operates in a similar manner.

Each of the latch circuits LC_L stores the counter value CNT received from the voltage detection circuit SC_L. Each of the latch circuits LC_H stores the counter value CNT received from the voltage detection circuit SC_H.

The logical operation circuit 141 performs a logical operation using values of the latch circuits LC_L and LC_H (counter values CNT) and transmits an operation result to the data register 150.

The counter 142 increments the counter value CNT at fixed time intervals.

<10-2> Operation of Sense Amplifier Module SA

Next, an operation of the sense amplifier module SA within the sense amplifier 140 included in the memory chip 100 according to the present embodiment will be described with reference to FIGS. 51 to 57. Hereinafter, the case in which the number of sensings is divided in such a manner that four sensings are allocated to the operational amplifier OA_L and three sensings are allocated to the operational amplifier OA_H will be described. In this case, the register REG_L includes the same number (four) of latch circuits LC_L to the number of sensings by the operational amplifier OA_L (hereinafter, referred to as "latch circuits LC_L0 to LC_L3"), and the register REG_H includes the same number (three) of latch circuits LC_H to the number of sensings by the operational amplifier OA_H (hereinafter, referred to as "latch circuits LC_H0 to LC_H2").

After the sequencer 180 applies the read voltage Vread to the selected bit line BL, it electrically decouples the sense amplifier 140 and the selected bit line BL from each other. Accordingly, a voltage of the bit line BL attenuates in accordance with the resistance states RS0 to RS7. For example, from the time TsL0 to the time TsL3, the operational amplifier OA_L senses the resistance states RS0 to RS3 using the reference voltage VREF_L. For example, from the time TsH0 to the time TsH2, the operational amplifier OA_H senses the four resistance states RS4 to RS7 using the reference voltage VREF_H.

The reference voltage VREF_L, the times TsL0 to TsL3, the reference voltage VREF_H, and the times TsH0 to TsH2 can be determined in a similar manner to the third embodiment.

Figure 51:
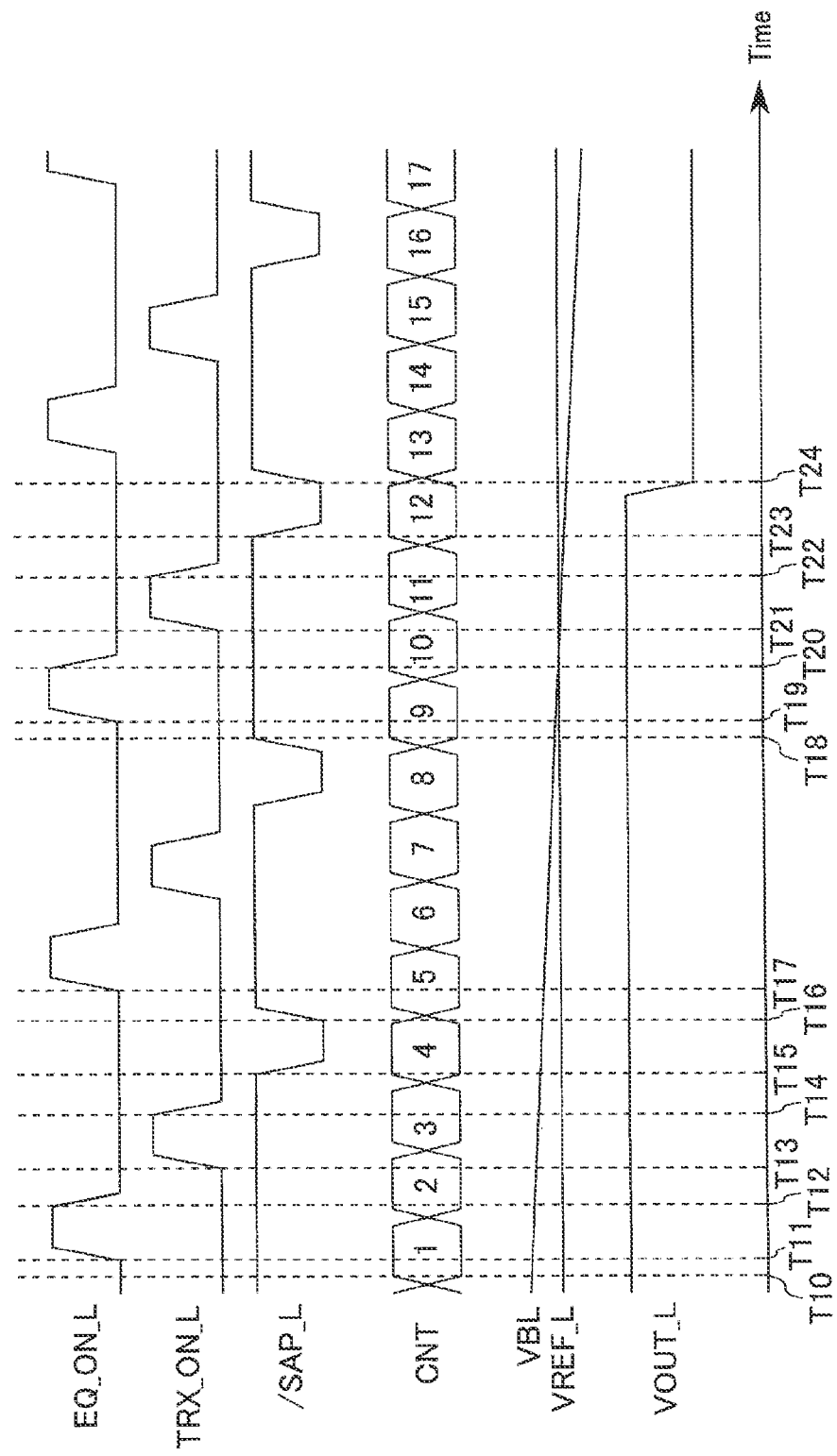
FIG. 51 is a timing chart of various signals during a sense operation of the sense amplifier module included in the memory chip according to the tenth embodiment.
Figure 52:
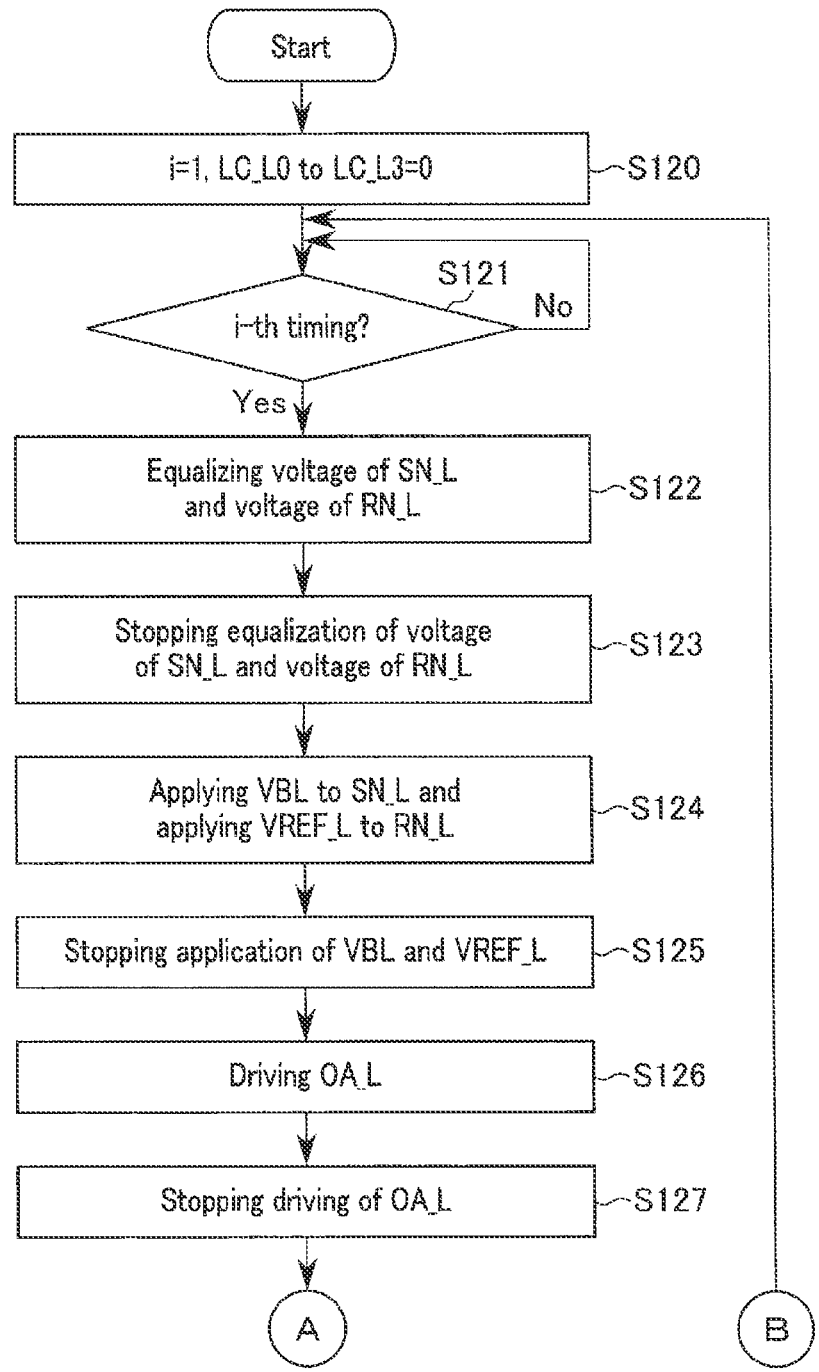
FIG. 52 is a flowchart showing the sense operation of an operational amplifier within the sense amplifier module included in the memory chip according to the tenth embodiment.
Figure 53:
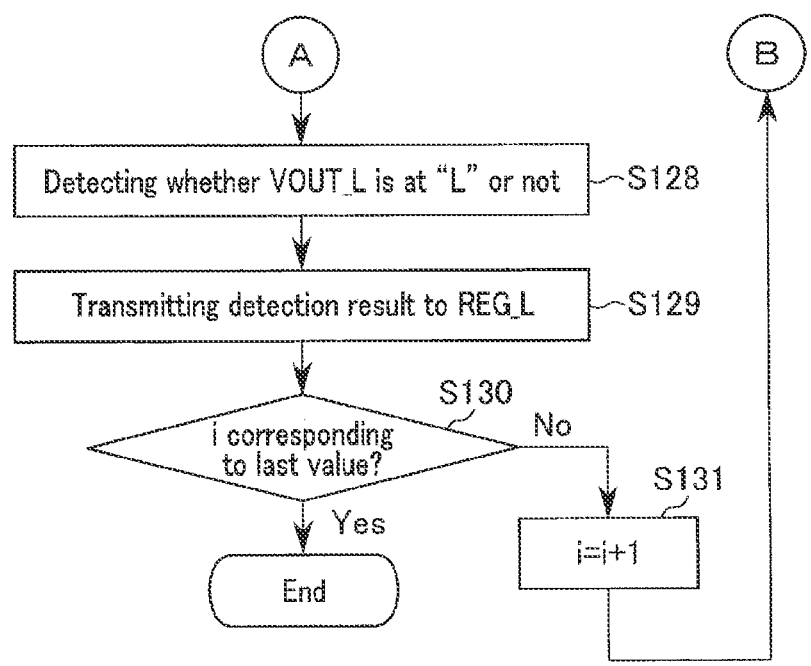
FIG. 53 is a flowchart showing the sense operation of the operational amplifier within the sense amplifier module included in the memory chip according to the tenth embodiment.

First, a sense operation of the operational amplifier OA_L will be described with reference to FIGS. 51 to 53. FIG. 51 is a timing chart of various signals during a sense operation of the operational amplifier OA_L within the sense amplifier module SA included in the memory chip 100 according to present embodiment. FIGS. 52 and 53 are flowcharts each showing an example of the sense operation of the operational amplifier OA_L within the sense amplifier module SA included in the memory chip 100 according to the present embodiment. In FIGS. 52 and 53, the number of sensings by the operational amplifier OA_L is represented by i (where i is a natural number equal to or greater than 1 and equal to or less than 4).

As shown in FIG. 52, after the read voltage Vread is applied to the selected bit line BL, the sequencer 180 sets i=1 and sets 0 as an initial value to the latch circuits LC_L0 to LC_L3 of the register REG_L (step S120). The sequencer 180 then boots up the counter 142, and the counter 142 starts incrementing the counter value CNT at fixed time intervals.

Next, the sequencer 180 determines whether or not a current time corresponds to the i-th sense timing of the operational amplifier OA_L (whether or not the counter value CNT is equal to a counter value (CntLi) at the time when the sequencer 180 raises the voltage EQ_ON_L, which is supplied to the equalizer EQ_H, from the L level to the H level) (step S121). In the case where the counter value CNT is not equal to the counter value CntLi (No in step S121), the sequencer 180 performs step S121 mentioned in the above.

On the other hand, in the case where the counter value CNT is equal to the counter value CntLi (Yes in step S121), the sequencer 180 sequentially performs raising and dropping of the voltage EQ_ON_L, raising and dropping of the voltage TRX_ON_L, and dropping and raising of the voltage /SAP_L.

As shown in FIG. 51, at time T10, when the first sense timing (counter value CNT=1) of the operational amplifier OA_L comes, the sequencer 180 raises the voltage EQ_ON_L from the L level to the H level at the time T11. This causes the equalizer EQ_L to equalize a voltage of the node SN_L and a voltage of the node RN_L (step S122 in FIG. 52).

At time T12, the sequencer 180 drops the voltage EQ_ON_L from the H level to the L level. This causes the equalizer EQ_L to stop equalizing a voltage of the node SN_L and a voltage of the node RN_L (step S123 in FIG. 52).

At the time T13, the sequencer 180 raises the voltage TRX_ON_L from the L level to the H level. In this manner, the voltage VBL is applied to the node SN_L, whereas the reference voltage VREF_L is applied to the node RN_L (step S124 in FIG. 52).

At the time T14, the sequencer 180 drops the voltage TRX_ON_L from the H level to the L level. In this manner, application of the voltage VBL and the reference voltage VREF_L to the operational amplifier OA_L is stopped (step S125 in FIG. 52).

At the time T15, the sequencer 180 drops the voltage /SAP_L from the H level to the L level. In this manner, the operational amplifier OA_L is driven (step S126 in FIG. 52).

More specifically, during a period from the time T15 to the time T16, since a voltage of the node SN_L is higher than a voltage of the node RN_L, the operational amplifier OA_L outputs a voltage at the H level as the voltage VOUT.

At the time T16, the sequencer 180 raises the voltage /SAP_L from the L level to the H level. In this manner, the operational amplifier OA_L stops being driven (step S127 in FIG. 52).

An operation of the sense amplifier module SA after the time T17 is the same as the operation during the period from the time T11 to the time T16.

At the time T18, when the third sense timing (counter value CNT=9) of the operational amplifier OA_L comes, the sequencer 180 raises the voltage EQ_ON_L from the L level to the H level at the time T19. This causes the equalizer EQ_L to equalize a voltage of the node SN_L and a voltage of the node RN_L (step S122 in FIG. 52).

At the time T20, the sequencer 180 drops the voltage EQ_ON_L from the H level to the L level. This causes the equalizer EQ to stop equalizing a voltage of the node SN_L and a voltage of the node RN_L (step S123 in FIG. 52).

At the time T21, the sequencer 180 raises the voltage TRX_ON_L from the L level to the H level. In this manner, the voltage VBL is applied to the node SN_L, whereas the reference voltage VREF_L is applied to the node RN_L (step S124 in FIG. 52). During a period from the time T21 to the time T22, the voltage VBL becomes lower than the reference voltage VREF_L.

At the time T22, the sequencer 180 drops the voltage TRX_ON_L from the H level to the L level. In this manner, application of the voltage VBL and the reference voltage VREF_L to the operational amplifier OA_L is stopped (step S125 in FIG. 52).

At time T23, the sequencer 180 drops the voltage /SAP_L from the H level to the L level. In this manner, the operational amplifier OA_L is driven (step S126 in FIG. 52).

More specifically, during a period from the time T23 to time T24, a voltage of the node SN_L is lower than a voltage of the node RN_L, and the operational amplifier OA_L outputs a voltage at the L level as the voltage VOUT_L.

At the time T24, the sequencer 180 raises the voltage /SAP_L from the L level to the H level. In this manner, the operational amplifier OA_L stops being driven (step S127 in FIG. 52).

As shown in FIG. 53, after the operational amplifier OA_L is driven, the voltage detection circuit SC_L detects whether or not the voltage VOUT_L supplied from the operational amplifier OA_L is at the L level (step S128). Subsequently, the voltage detection circuit SC_L transmits a detection result to the latch circuit LC_L (i−1) of the register REG_L (step S129).

More specifically, in the case where the voltage VOUT_L is at the H level, the voltage detection circuit SC_L does not transmit the counter value CNT to the latch circuit LC_L (i−1). For example, in the first sensing by the operational amplifier OA_L, from the time T15 to the time T16, the voltage detection circuit SC_L detects that the voltage VOUT_L is at the H level. Thus, the voltage detection circuit SC_L does not transmit the counter value CNT (CNT=4) at this time to the latch circuit LC_L0. On the other hand, in the case where the voltage VOUT_L is at the L level, the voltage detection circuit SC_L transmits the counter value CNT to the latch circuit LC_L(i−1), and the latch circuit LC_L(i−1) stores the counter value CNT. For example, in the third sensing by the operational amplifier OA_L, from the time T23 to the time T24, the voltage detection circuit SC_L detects that the voltage VOUT_L is at the L level. Therefore, the voltage detection circuit SC_L transmits the counter value CNT (CNT=12) at this time to the latch circuit LC_L2. The latch circuit LC_L2 stores the counter value CNT.

Subsequently, the sequencer 180 determines whether or not i is the last value (i=4) (step S130). In the case where i is the last value (Yes in step S130), the operational amplifier OA_L terminates the sense operation. On the other hand, in the case where i is not the last value (No in step S130), the sequencer 180 increments i to set i=i+1 (step S131), and performs step S121 mentioned in the above.

Figure 55:
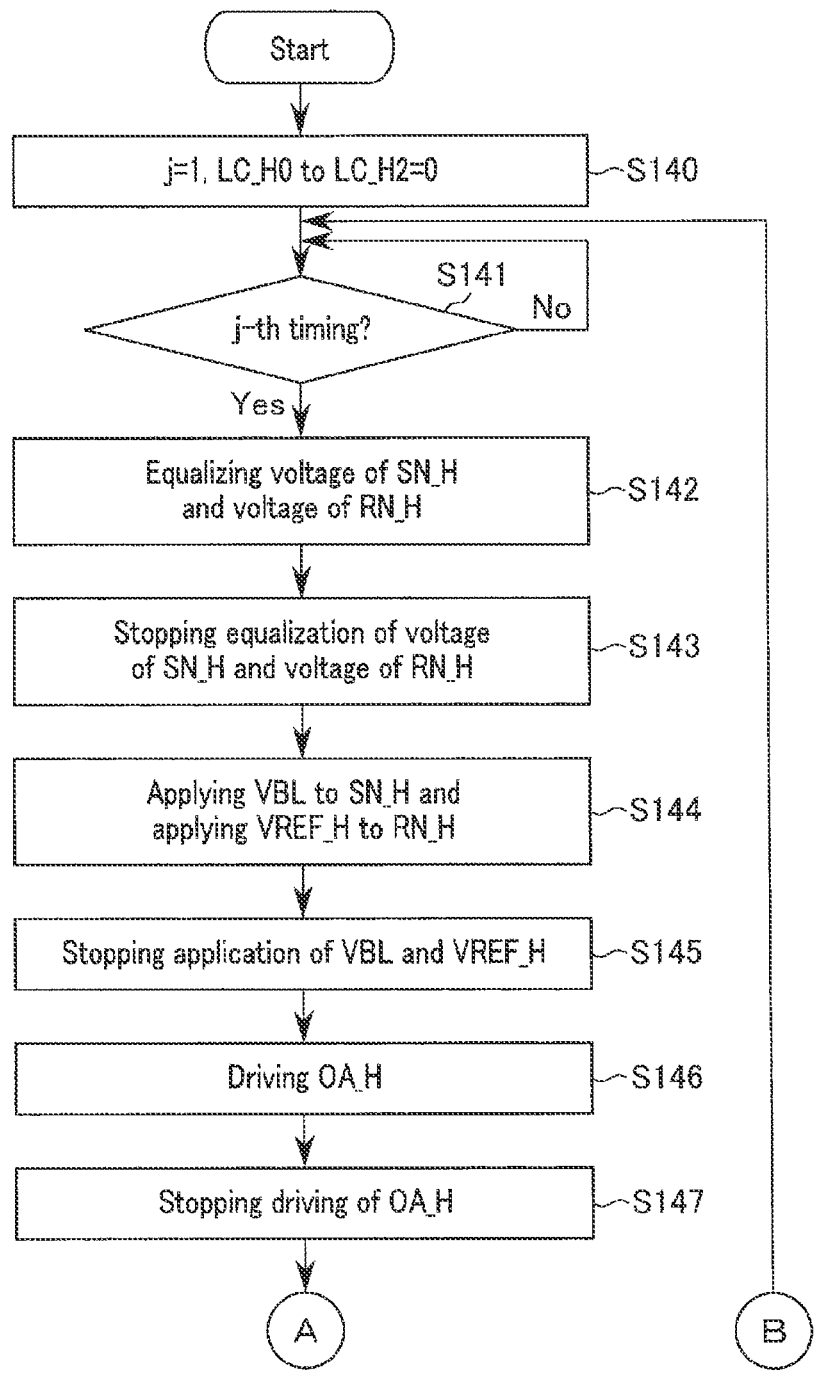
FIG. 55 is a flowchart showing the sense operation of the operational amplifier within the sense amplifier module included in the memory chip according to the tenth embodiment.

Next, a sense operation of the operational amplifier OA_H will be described with reference to FIGS. 54 to 56. FIG. 54 is a timing chart of various signals during a sense operation of the operational amplifier OA_H within the sense amplifier module SA included in the memory chip 100 according to the present embodiment. FIGS. 55 and 56 are flowcharts each showing an example of the sense operation of the operational amplifier OA_H within the sense amplifier module SA included in the memory chip 100 according to the present embodiment. In FIGS. 55 and 56, the number of sensings by the operational amplifier OA_H is represented by j (where j is a natural number equal to or greater than 1 and equal to or less than 3).

As shown in FIG. 55, after the read voltage Vread is applied to the selected bit line BL, the sequencer 180 sets j=1, and sets 0 as an initial value to the latch circuits LC_H0 to LC_H2 of the register REG_H (step S140). The sequencer 180 then boots up the counter 142, and the counter 142 starts incrementing the counter value CNT at fixed time intervals.

Next, the sequencer 180 determines whether or not a current time corresponds to the j-th sense timing of the operational amplifier OA_H (whether or not the counter value CNT is equal to a counter value (CntHj) at the time when the sequencer 180 raises the voltage EQ_ON_H, which is supplied to the equalizer EQ_H, from the L level to the H level) (step S141). In the case where the counter value CNT is not equal to the counter value CntHj (No in step S141), the sequencer 180 performs step S141 mentioned in the above.

On the other hand, in the case where the counter value CNT is equal to the counter value CntHj (Yes in step S141), the sequencer 180 sequentially performs raising and dropping of the voltage EQ_ON_H, raising and dropping of the voltage TRX_ON_H, and dropping and raising of the voltage /SAP_H.

As shown in FIG. 54, at time T30, when the first sense timing (counter value CNT=2) of the operational amplifier OA_H comes, the sequencer 180 raises the voltage EQ_ON_H from the L level to the H level at the time T31. This causes the equalizer EQ_H to equalize a voltage of the node SN_H and a voltage of the node RN_H (step S142 in FIG. 55).

At time T32, the sequencer 180 drops the voltage EQ_ON_H from the H level to the L level. This causes the equalizer EQ_H to stop equalizing a voltage of the node SN_H and a voltage of the node RN_H (step S143 in FIG. 55).

At time T33, the sequencer 180 raises the voltage TRX_ON_H from the L level to the H level. In this manner, the voltage VBL is applied to the node SN_H, and the reference voltage VREF_H is applied to the node RN_H (step S144 in FIG. 55). During a period from the time T33 to time T34, the voltage VBL becomes lower than the reference voltage VREF_H.

At the time T34, the sequencer 180 drops the voltage TRX_ON_H from the H level to the L level. In this manner, application of the voltage VBL and the reference voltage VREF_H to the operational amplifier OA_H is stopped (step S145 in FIG. 55).

At time T35, the sequencer 180 drops the voltage /SAP_H from the H level to the L level. In this manner, the operational amplifier OA_H is driven (step S146 in FIG. 55).

More specifically, during a period from the time T35 to time T36, a voltage of the node SN_H is lower than a voltage of the node RN_H, and the operational amplifier OA_H outputs a voltage at the L level as the voltage VOUT_H.

At the time T36, the sequencer 180 raises the voltage /SAP_H from the L level to the H level. In this manner, the operational amplifier OA_H stops being driven (step S147 in FIG. 55).

As shown in FIG. 56, after the operational amplifier OA_H is driven, the voltage detection circuit SC_H detects whether or not the voltage VOUT_H supplied from the operational amplifier OA_H is at the L level (step S148). Subsequently, the voltage detection circuit SC_H transmits a detection result to the latch circuit LC_H(j−1) of the register REG_H (step S149). Details of steps S148 and S149 are the same as steps S128 and S129 of the operational amplifier OA_L mentioned in the above. For example, in the first sensing by the operational amplifier OA_H, during a period from the time T35 to the time T36, the voltage detection circuit SC_H detects that the voltage VOUT_H is at the L level. Thus, the voltage detection circuit SC_H transmits the counter value CNT (CNT=5) at this time to the latch circuit LC_H0. The latch circuit LC_H0 stores the counter value CNT.

Next, the sequencer 180 determines whether or not j is the last value (j=3) (step S150). In the case where j is the last value (Yes in step S150), the operational amplifier OA_H terminates the sense operation. On the other hand, in the case where j is not the last value (No in step S150), the sequencer 180 increments j to set j=j+1 (step S151), and performs step S141 mentioned in the above.

Subsequently, a computation operation of the logical operation circuit 141 will be described with reference to FIG. 57. FIG. 57 is a flowchart showing an example of a computation operation of the logical operation circuit 141 within the sense amplifier module SA included in the memory chip 100 according to the present embodiment.

As shown in FIG. 57, the sequencer 180 determines whether or not sensing by the operational amplifiers OA_L and OA_H has been completed (step S160). In the case where sensing by the operational amplifiers OA_L and OA_H has been completed (Yes in step S160), the sequencer 180 determines whether or not a value of the latch circuit LC_L3 (the fourth sense result of the operational amplifier OA_L) is other than 0 (step S161). In the case where the value of the latch circuit LC_L3 is other than 0 (Yes in step S161), the logical operation circuit 141 performs a logical operation using values of the latch circuits LC_L0 to LC_L3 (step S162), and outputs operation result (step S164).

More specifically, in the case where a value of the latch circuit LC_L0 (the first sense result of the operational amplifier OA_L) is other than 0, a value of the latch circuit LC_L1 (the second sense result of the operational amplifier OA_L) is other than 0, a value of the latch circuit LC_L2 (the third sense result of the operational amplifier OA_L) is other than 0, and a value of the latch circuit LC_L3 (the fourth sense result of the operational amplifier OA_L) is other than 0, the logical operation circuit 141 transmits the value "000" indicative of the resistance state RS0 to the data register 150.

In the case where a value of the latch circuit LC_L0 is 0, a value of the latch circuit LC_L1 is other than 0, a value of the latch circuit LC_L2 is other than 0, and a value of the latch circuit LC_L3 is other than 0, the logical operation circuit 141 transmits the value "001" indicative of the resistance state RS1 to the data register 150.

In the case where a value of the latch circuit LC_L0 is 0, a value of the latch circuit LC_L1 is 0, a value of the latch circuit LC_L2 is other than 0, and a value of the latch circuit LC_L3 is other than 0, the logical operation circuit 141 transmits the value "010" indicative of the resistance state RS2 to the data register 150.

In the case where a value of the latch circuit LC_L0 is 0, a value of the latch circuit LC_L1 is 0, a value of the latch circuit LC_L2 is 0, and a value of the latch circuit LC_L3 is other than 0, the logical operation circuit 141 transmits the value "011" indicative of the resistance state RS3 to the data register 150.

On the other hand, in the case where a value of the latch circuit LC_L3 is 0 (No in step S161), the logical operation circuit 141 performs a logical operation using values of the latch circuits LC_H0 to LC_H2 (step S163), and outputs operation result (step S164).

More specifically, in the case where a value of the latch circuit LC_H0 (the first sense result of the operational amplifier OA_H) is other than 0, a value of the latch circuit LC_H1 (the second sense result of the operational amplifier OA_H) is other than 0, and a value of the latch circuit LC_H2 (the third sense result of the operational amplifier OA_H) is other than 0, the logical operation circuit 141 transmits the value "100" indicative of the resistance state RS4 to the data register 150.

In the case where a value of the latch circuit LC_H0 is 0, a value of the latch circuit LC_H1 is other than 0, and a value of the latch circuit LC_H2 is other than 0, the logical operation circuit 141 transmits the value "101" indicative of the resistance state RS5 to the data register 150.

In the case where a value of the latch circuit LC_H0 is 0, a value of the latch circuit LC_H1 is 0, and a value of the latch circuit LC_H2 is other than 0, the logical operation circuit 141 transmits the value "110" indicative of the resistance state RS6 to the data register 150.

In the case where a value of the latch circuit LC_H0 is 0, a value of the latch circuit LC_H1 is 0, and a value of the latch circuit LC_H2 is 0, the logical operation circuit 141 transmits the value "111" indicative of the resistance state RS7 to the data register 150.

On the other hand, in the case where sensing by the operational amplifiers OA_L and OA_H has not been completed (No in step S160), the sequencer 180 performs step S160 mentioned in the above.

<10-3> Effects

The configuration according to the present embodiment is applicable to the third embodiment. As a matter of course, the sense amplifier module SA according to the present embodiment is applicable to the second embodiment. The sense amplifier module SA according to the present embodiment is applicable to the memory chip 100 according to the modification of the first embodiment.

<11> Modifications, Etc.

As described in the above, a memory device according to an embodiment includes: a plurality of memory cells (MC) stacked in a first direction (Z direction) orthogonal to a substrate (20) and each including a memory element (MR) having at least three resistance states (RS) and a selector (SW) coupled in parallel to the memory element; a bit line (BL) electrically coupled to the memory cells and extending in a second direction (X direction) intersecting the first direction; and a sense amplifier (SA) configured to compare a voltage (VBL) of the bit line with a plurality of reference voltages (VREF) and sense data stored in the memory cells.

The embodiments are not limited to the above-described embodiments, and various modifications can be made.

The number of operational amplifiers OA, the number of voltage detection circuits SC, and the number of latch circuits LC (registers REG) included in the sense amplifier module SA are respectively not limited to one, two, five, and seven.

The sense amplifier module SA is not limited to the configuration described in the above. The operational amplifier OA, the switches SWtr0 and SWtr1, the equalizer EQ, and the flip-flop circuit F/F included in the sense amplifier module SA are not limited to the configurations described in the above.

Furthermore, the order of the steps in the above-described flowchart may be altered in any manner possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
   a plurality of memory cells stacked in a first direction orthogonal to a substrate and each including a memory element having at least three resistance states and a selector coupled in parallel to the memory element;
   a bit line electrically coupled to the memory cells and extending in a second direction intersecting the first direction; and
   a sense amplifier configured to compare a voltage of the bit line with a plurality of reference voltages and sense data stored in the memory cells,
   wherein:
   the sense amplifier includes:
      a first sense circuit configured to sense the voltage of the bit line a plurality of times in a read operation; and
      a second sense circuit different from the first sense circuit and configured to sense the voltage of the bit line a plurality of times,
   the plurality of reference voltages include a first reference voltage and a second reference voltage different from the first reference voltage,
   the first sense circuit senses the voltage of the bit line based on the first reference voltage at a first sense timing, and
   the second sense circuit senses the voltage of the bit line based on the second reference voltage at a second sense timing.

2. The device according to claim 1, wherein:
   the sense amplifier further includes:
      a first detection circuit coupled to the first sense circuit;
      a second detection circuit different from the first detection circuit and coupled to the second sense circuit;
      a first register coupled to the first detection circuit;
      a second register different from the first register and coupled to the second detection circuit; and
      an operation circuit coupled to the first register and the second register,
   the first detection circuit transmits a sense result of the first sense circuit to the first register, the second detection circuit transmits a sense result of the second sense circuit to the second register, and the operation circuit performs a logical operation using a value of the first register in a case where the first register includes an L level, and performs a logical operation using a value of the second register in a case where the first register does not include an L level.

3. The device according to claim 1, wherein:
the sense amplifier further includes:
   a first detection circuit coupled to the first sense circuit;
   a second detection circuit different from the first detection circuit and coupled to the second sense circuit ;
   a first register coupled to the first detection circuit;
   a second register different from the first register and coupled to the second detection circuit ;
   an operation circuit coupled to the first register and the second register; and
   a counter coupled to the first detection circuit and the second detection circuit, the first detection circuit transmits a first counter value of the counter to the first register in a case where a sense result of the first sense circuit is at an L level, the second detection circuit transmits a second counter value of the counter to the second register in a case where a sense result of the second sense circuit is at an L level, and the operation circuit performs a logical operation using a value of the first register in a case where the first register includes the first counter value, and performs a logical operation using a value of the second register in a case where the first register does not include the first counter value.

4. The device according to claim 1, wherein:
the first sense circuit is coupled to a first node and a second node different from the first node, the first sense circuit outputs a first output voltage as a sense result of the first sense circuit based on the voltage of the bit line applied to the first node and the first reference voltage applied to the second node, the second sense circuit is coupled to a third node and a fourth node different from the third node, and the second sense circuit outputs a second output voltage as a sense result of the second sense circuit based on the voltage of the bit line applied to the third node and the second reference voltage applied to the fourth node.

5. The device according to claim 4, wherein:
the sense amplifier further includes:
   a first switch coupled to the first node;
   a second switch different from the first switch and coupled to the second node ;
   a third switch coupled to the third node; and
   a fourth switch different from the third switch and coupled to the fourth node , the first sense circuit outputs the first output voltage based on the voltage of the bit line applied to the first node through the first switch and the first reference voltage applied to the second node through the second switch, and the second sense circuit outputs the second output voltage based on the voltage of the bit line applied to the third node through the third switch and the second reference voltage applied to the fourth node through the fourth switch.

6. The device according to claim 1, wherein:
the first sense circuit is coupled to a first node and a second node different from the first node, the first sense circuit outputs a first output voltage as a sense result of the first sense circuit based on a first voltage based on the voltage of the bit line applied to the first node and a second voltage based on the first reference voltage applied to the second node, the second sense circuit is coupled to a third node and a fourth node different from the third node, and the second sense circuit outputs a second output voltage as a sense result of the second sense circuit based on a third voltage based on the voltage of the bit line applied to the third node and a fourth voltage based on the second reference voltage applied to the fourth node.

7. The device according to claim 6, wherein:
the sense amplifier further includes:
   a first switch coupled to the first node;
   a second switch different from the first switch and coupled to the second node;
   a third switch coupled to the third node; and
   a fourth switch different from the third switch and coupled to the fourth node , the first sense circuit outputs the first output voltage based on the first voltage applied to the first node through the first switch and the second voltage applied to the second node through the second switch, and the second sense circuit outputs the second output voltage based on the third voltage applied to the third node through the third switch and the fourth voltage applied to the fourth node through the fourth switch.

8. A memory device comprising:
a plurality of memory cells stacked in a first direction orthogonal to a substrate and each including a memory element having at least three resistance states and a selector coupled in parallel to the memory element;

a bit line electrically coupled to the memory cells and extending in a second direction intersecting the first direction; and a sense amplifier configured to compare a voltage of the bit line with a plurality of reference voltages and sense data stored in the memory cells, wherein:
the sense amplifier includes:
   n sense circuits configured to sense the voltage of the bit line in a read operation (where n is an integer equal to or greater than 2);
   n detection circuits;
   n latch circuits; and
   an operation circuit coupled to the n latch circuits, a number of the reference voltages is n, the n reference voltages are respectively applied to the n sense circuits, the n sense circuits respectively obtain sensed voltages by sensing the voltage of the bit line based on the n reference voltages in a sense timing, the n detection circuits are respectively coupled to the n sense circuits and are respectively coupled to the n latch circuits, the n detection circuits respectively transmit sense results of the n sense circuits to the n latch circuits, and the operation circuit performs a logical operation using the sense results.

9. The device according to claim 8, wherein:
the sense results are each at an L level in a case where the sensed voltages of the bit line are respectively lower than the n reference voltages, and the sense results are each at an H level in a case where the sensed voltages of the bit line are respectively equal to or greater than the n reference voltages.

10. A memory device comprising:

a plurality of memory cells stacked in a first direction orthogonal to a substrate and each including a memory element having at least three resistance states and a selector coupled in parallel to the memory element;

a bit line electrically coupled to the memory cells and extending in a second direction intersecting the first direction; and a sense amplifier configured to compare a voltage of the bit line with a plurality of reference voltages and sense data stored in the memory cells, wherein:

the sense amplifier includes n sense circuits configured to sense the voltage of the bit line a plurality of times in a read operation (where n is an integer equal to or greater than 2), a number of the reference voltages is n, the n reference voltages are respectively applied to the n sense circuits, p sense circuits of the n sense circuits (where p is an integer equal to or greater than 2 and equal to or less than n) respectively obtain sensed voltages by sensing the voltage of the bit line based on p reference voltages of the n reference voltages in a first sense timing, and as a result of sensing by the p sense circuits at the first sense timing, in a case where the voltage of the bit line is equal to or greater than a maximum reference voltage of the p reference voltages, q sense circuits of the n sense circuits (where q is an integer equal to or greater than 1 and equal to or less than (n−1)) respectively obtain sensed voltages by sensing the voltage of the bit line based on the q reference voltages of the n reference voltages at a second sense timing different from the first sense timing.

11. The device according to claim 10, wherein:

the sense amplifier further includes:
n detection circuits;
n latch circuits; and
an operation circuit coupled to the n latch circuits, the n detection circuits are respectively coupled to the n sense circuits and are respectively coupled to the n latch circuits, the n detection circuits respectively transmit sense results of the n sense circuits to the n latch circuits, and the operation circuit is configured to:
perform a logical operation using sense results of the p sense circuits at the first sense timing in a case where at least one of the sense results of the p sense circuits at the first sense timing is at an L level; and
perform a logical operation using sense results of the q sense circuits at the second sense timing in a case where none of the sense results of the p sense circuits at the first sense timing is at an L level.

12. A memory device comprising:

a plurality of memory cells stacked in a first direction orthogonal to a substrate and each including a memory element having at least three resistance states and a selector coupled in parallel to the memory element;

a bit line electrically coupled to the memory cells and extending in a second direction intersecting the first direction; and a sense amplifier configured to compare a voltage of the bit line with a reference voltage and sense data stored in the memory cells, wherein:

the sense amplifier includes a sense circuit configured to sense the voltage of the bit line a plurality of times in a read operation, the sense circuit senses the voltage of the bit line based on the reference voltage at a first sense timing, and as a result of sensing at the first sense timing, in a case where the voltage of the bit line is equal to or greater than the reference voltage, the sense circuit senses the voltage of the bit line based on the reference voltage at a second sense timing different from the first sense timing.

13. The device according to claim 12, wherein:

the sense amplifier further includes:
a detection circuit coupled to the sense circuit;
a latch circuit coupled to the detection circuit; and
an operation circuit coupled to the latch circuit, the detection circuit transmits a sense result of the sense circuit to the latch circuit, and the operation circuit performs a logical operation using the sense result in a case where the sense result is at an L level.

14. The device according to claim 12, wherein:

the sense circuit is coupled to a first node and a second node different from the first node, and the sense circuit outputs an output voltage as a sense result of the sense circuit based on the voltage of the bit line applied to the first node and the reference voltage applied to the second node.

15. The device according to claim 14, wherein:

the sense amplifier further includes:
a first switch coupled to the first node; and
a second switch different from the first switch and coupled to the second node, and the sense circuit outputs the output voltage based on the voltage of the bit line applied to the first node through the first switch and the reference voltage applied to the second node through the second switch.

16. The device according to claim 12, wherein:

the sense circuit is coupled to a first node and a second node different from the first node, and the sense circuit outputs an output voltage as a sense result of the sense circuit based on a first voltage based on the voltage of the bit line applied to the first node and a second voltage based on the reference voltage applied to the second node.

17. The device according to claim 16, wherein:

the sense amplifier further includes a first switch coupled to the first node and a second switch different from the first switch and coupled to the second node, and the sense circuit outputs the output voltage based on the first voltage applied to the first node through the first switch and the second voltage applied to the second node through the second switch.

* * * * *